(12) United States Patent
Akiyama et al.

(10) Patent No.: US 11,855,618 B2
(45) Date of Patent: Dec. 26, 2023

(54) GATE DRIVE DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Hironori Akiyama, Nisshin (JP); Akimasa Niwa, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 0 days.

(21) Appl. No.: 17/953,456

(22) Filed: Sep. 27, 2022

(65) Prior Publication Data
US 2023/0114152 A1   Apr. 13, 2023

(30) Foreign Application Priority Data
Oct. 12, 2021   (JP) .................. 2021-167458

(51) Int. Cl.
*H03K 17/00* (2006.01)
*H03K 17/687* (2006.01)
(Continued)

(52) U.S. Cl.
CPC ..... *H03K 17/687* (2013.01); *H03K 17/04206* (2013.01); *H03K 17/063* (2013.01);
(Continued)

(58) Field of Classification Search
CPC .... H03K 17/687; H03K 17/063; H03K 17/16; H03K 17/284; H03K 17/04206; H03K 17/08104; H03K 17/08122
See application file for complete search history.

(56) References Cited

U.S. PATENT DOCUMENTS

| 11,595,035 B1 * | 2/2023 | Li ............................ H03K 5/24 |
| 2007/0187217 A1 | 8/2007 | Tai |

(Continued)

FOREIGN PATENT DOCUMENTS

| JP | 2018-153007 A | 9/2018 |
| JP | 2020-113867 A | 7/2020 |

*Primary Examiner* — Tuan T Lam
(74) *Attorney, Agent, or Firm* — POSZ LAW GROUP, PLC

(57) ABSTRACT

A gate drive device drives a gate of a semiconductor switching element and controls a transient voltage corresponding to a voltage of a main terminal of the semiconductor switching element to a target value of the transient voltage at a time of switching the semiconductor switching element. The gate drive device includes a calculation circuit, a drive circuit, a detection circuit, and a learning circuit. The calculation circuit executes a predetermined calculation mode to calculate an operation amount for operating gate drive speed of the semiconductor switching element. The drive circuit drives the gate of the semiconductor switching element according to the operation amount. The detection circuit detects the transient voltage. The learning circuit executes learning processing to change the predetermined calculation mode based on the operation amount calculated by the calculation circuit and the transient voltage detected by the detection circuit.

18 Claims, 29 Drawing Sheets

(51) Int. Cl.
    *H03K 17/284*      (2006.01)
    *H03K 17/94*       (2006.01)
    *H03K 17/06*       (2006.01)
    *H03K 17/16*       (2006.01)
    *H03K 17/0812*     (2006.01)
    *H03K 17/042*      (2006.01)
    *H03K 17/081*      (2006.01)

(52) U.S. Cl.
    CPC . *H03K 17/08104* (2013.01); *H03K 17/08122* (2013.01); *H03K 17/16* (2013.01); *H03K 17/284* (2013.01); *H03K 17/94* (2013.01)

(56) References Cited

U.S. PATENT DOCUMENTS

| | | |
|---|---|---|
| 2019/0089346 A1 | 3/2019 | Kawai |
| 2020/0021282 A1 | 1/2020 | Yamamoto et al. |
| 2021/0036697 A1 | 2/2021 | Yamamoto et al. |
| 2021/0258004 A1 | 8/2021 | Akiyama et al. |
| 2022/0393675 A1* | 12/2022 | Li .................. H03K 17/042 |
| 2022/0407511 A1 | 12/2022 | Akiyama et al. |
| 2022/0416782 A1* | 12/2022 | Akiyama ............ H02M 1/0054 |
| 2023/0021657 A1* | 1/2023 | Akiyama ............ H03K 17/28 |
| 2023/0088339 A1* | 3/2023 | Li .................. H03K 17/04206 |
| 2023/0208280 A1* | 6/2023 | Groiss ............... H05B 45/50 |
| | | 361/101 |

* cited by examiner

FIG. 8

| dV/dt[kV/μs] | 1 | 2 | 3 | 4 | 5 | 6 | 7 | 8 | 9 | 10 | ... |
|---|---|---|---|---|---|---|---|---|---|---|---|
| Ig[A] | 0.05 | 0.06 | 0.07 | 0.09 | 0.12 | 0.15 | 0.20 | 0.25 | 0.30 | 0.38 | |

FIG. 9

| dV/dt[kV/μs] | 1 | 2 | 3 | 4 | 5 | 6 | 7 | 8 | 9 | 10 | ... |
|---|---|---|---|---|---|---|---|---|---|---|---|
| Ig[A] | 0.05 | 0.06 | 0.07 | 0.09 | 0.12 | 0.15 | 0.20→0.15 | 0.25 | 0.30 | 0.38 | |

FIG. 11

| dV/dt[kV/μs] | 1 | 2 | 3 | 4 | 5 | 6 | 7 | 8 | 9 | 10 | ... |
|---|---|---|---|---|---|---|---|---|---|---|---|
| Ig[A] | 0.05 | 0.06 | 0.07 | 0.09 | 0.12→0.07 | 0.15→0.10 | 0.20→0.15 | 0.25→0.20 | 0.30→0.25 | 0.38 | |

FIG. 12

| dV/dt[kV/μs] | 1 | 2 | 3 | 4 | 5 | 6 | 7 | 8 | 9 | 10 | ... |
|---|---|---|---|---|---|---|---|---|---|---|---|
| Ig[A] | 0.05 | 0.06 | 0.07 | 0.09 | 0.12→011 | 0.15→0.13 | 0.20→0.15 | 0.25→0.23 | 0.30→0.29 | 0.38 | |

FIG. 15

| Ig[A] DATA | dV/dt[kV/μs] | | | | | | |
|---|---|---|---|---|---|---|---|
| Tj[°C] | | 1 | 2 | 3 | 4 | 5 | 6 | ... |
| | −50 | 0.05 | 0.06 | 0.07 | 0.08 | 0.09 | 0.10 |
| | ±0 | 0.06 | 0.07 | 0.08 | 0.09 | 0.10 | 0.11 |
| | 50 | 0.07 | 0.08 | 0.09 | 0.10 | 0.11 | 0.12 |
| | 100 | 0.08 | 0.09 | 0.10 | 0.11 | 0.12 | 0.13 |
| | 150 | 0.09 | 0.10 | 0.11 | 0.12 | 0.13 | 0.14 |

FIG. 22

| Vsrg[V] | 310 | 320 | 330 | 340 | 350 | 360 | 370 | 380 | 390 | 400 |
|---|---|---|---|---|---|---|---|---|---|---|
| Ig[A] | 0.05 | 0.06 | 0.07 | 0.09 | 0.12 | 0.15 | 0.20 | 0.25 | 0.30 | 0.38 |

| Vsrg[V] | 310 | 320 | 330 | 340 | 350 | 360 | 370 | 380 | 390 | 400 |
|---|---|---|---|---|---|---|---|---|---|---|
| Ig[A] | 0.05 | 0.06 | 0.07 | 0.09 | 0.12 | 0.15 | 0.20→0.15 | 0.25 | 0.30 | 0.38 |

| Ig[A] DATA | ΔVds[V] DATA | | | | | | |
|---|---|---|---|---|---|---|---|
| | | 10 | 20 | 30 | 40 | 50 | 60 |
| Id[A] | 10 | 0.05 | 0.06 | 0.07 | 0.08 | 0.09 | 0.10 |
| | 20 | 0.06 | 0.07 | 0.08 | 0.09 | 0.10 | 0.11 |
| | 30 | 0.07 | 0.08 | 0.09 | 0.10 | 0.11 | 0.12 |
| | 40 | 0.08 | 0.09 | 0.10 | 0.11 | 0.12 | 0.13 |

GATE DRIVE DEVICE

CROSS REFERENCE TO RELATED APPLICATION

This application is based on Japanese Patent Application No. 2021-167458 filed on Oct. 12, 2021, the disclosure of which is incorporated herein by reference.

TECHNICAL FIELD

The present disclosure relates to a gate drive device.

BACKGROUND

In a gate drive device for driving a gate of a semiconductor switching element, for the purpose of loss reduction, noise reduction, element fault prevention, and the like, transient voltage corresponding to the voltage of a main terminal of the semiconductor switching element at the time of switching when the semiconductor switching element is switched is controlled to a desired target value. The transient voltage includes a change rate, that is, dV/dt of the voltage of the main terminal at the time of switching, and the peak value of the voltage of the main terminal at the time of switching, that is, surge voltage.

SUMMARY

The present disclosure describes a gate drive device for driving a gate of a semiconductor switching element, and further describes the gate drive device including a calculation circuit, a drive circuit, a detection circuit and a learning circuit.

BRIEF DESCRIPTION OF DRAWINGS

Objects, features and advantages of the present disclosure will become more apparent from the following detailed description made with reference to the accompanying drawings. In the drawings:

FIG. 8 is a diagram illustrating an example of map data according to the second embodiment;

FIG. 9 is a diagram illustrating an example of updated map data generated by an updating process according to the second embodiment;

FIG. 11 is a diagram illustrating an example of updated map data generated by an updating process of a first modification of the second embodiment;

FIG. 12 is a diagram illustrating an example of updated map data generated by an updating process of a second modification of the second embodiment;

FIG. 15 is a diagram illustrating an example of map data according to the third embodiment;

FIG. 22 is a diagram illustrating an example of map data according to the fifth embodiment;

FIG. 23 is a diagram illustrating an example of updated map data generated by an updating process according to the fifth embodiment;

FIG. 27 is a diagram illustrating an example of map data according to the sixth embodiment;

DETAILED DESCRIPTION

Figure 1:
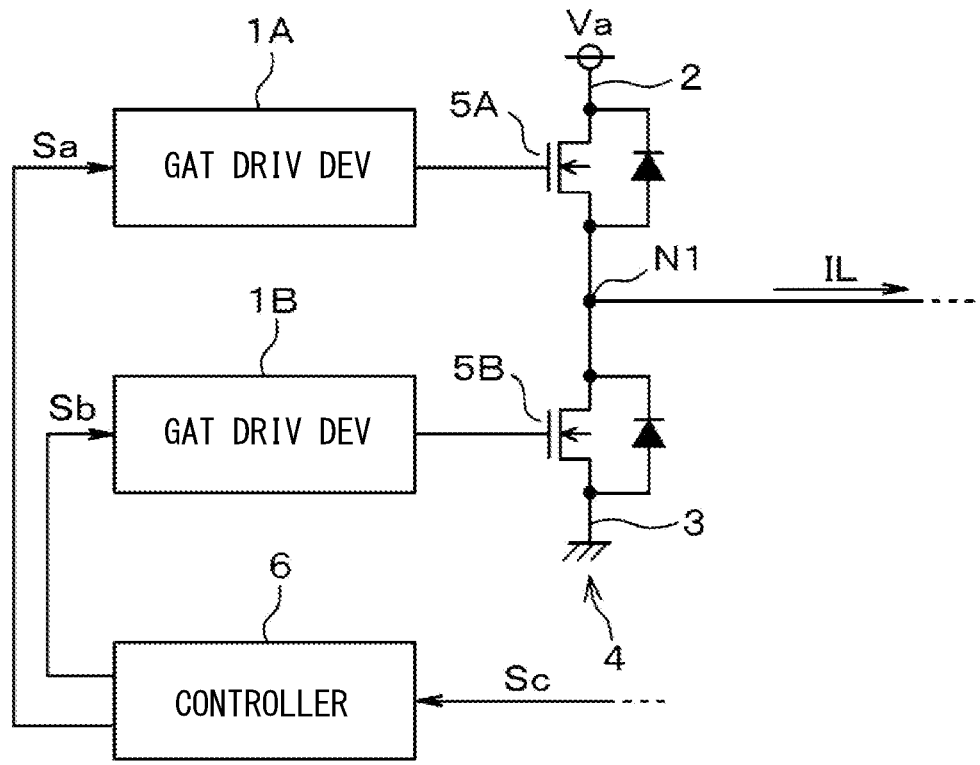
FIG. 1 is a diagram schematically illustrating an outline configuration of a gate drive device and a half bridge circuit according to a first embodiment.

A gate drive device may detect dV/dt as a change rate of drain voltage of a semiconductor switching element as an MOSFET, repeating adjustment of the gate waveform so that the detection value does not exceed a target value, and finishing the adjustment at the stage that the gate waveform at which the detection value does not exceed the target value is generated.

In the gate drive device, a circuit may be operated to learn an optimum gate waveform profile, and it is difficult to obtain the optimum waveform in a period of try and error in such a learning process. Therefore, the gate drive device as described above can be applied to, for example, only an adjusting process or the like before shipment of a product. In the gate drive device, a gate signal which is optimum is generated after completion of learning. Consequently, when a change occurs in various characteristics after learning, a deviation accompanying the change cannot be corrected.

In such a related art, although individual variation can be cancelled, the adjustment cannot be performed during actual operation. Consequently, dV/dt becomes a value which is gradually deviated from a target value due to fluctuations with age of the characteristics of a drive circuit, a semiconductor switching element, and the like. That is, in the related art, dV/dt as transient voltage at the time of switching of the semiconductor switching element cannot be controlled to a target value with high precision.

According to an aspect of the present disclosure, a gate drive device drives a gate of a semiconductor switching element, and controls a transient voltage at a time of switching the semiconductor element to a target value. The transient voltage corresponds to a voltage of a main terminal of the semiconductor switching element. The gate drive device includes a calculation circuit, a drive circuit, a detection circuit and a learning circuit.

The calculation circuit calculates an operation amount for operating gate drive speed of the semiconductor switching element by a predetermined calculation mode based on the target value of the transient voltage. The drive circuit drives the gate of the semiconductor switching element based on the operation amount calculated by the calculation circuit. The detection circuit detects the transient voltage. The learning circuit executes learning processing to change the calculation mode based on the operation amount calculated by the calculation circuit and the detection value of the transient voltage detected by the detection circuit.

In the configuration, by executing the learning processing, the calculation mode used at the time of calculating the operation amount by the calculation circuit is optimized so as to be according to the transient voltage which is actually generated in the semiconductor switching element as a drive target of the gate drive device. In such a manner, by the above-described configuration, the calculation mode is optimized according to variation of individual products. Consequently, even in the case where there is individual variation, the gate drive speed can be controlled to desired speed and, moreover, the transient voltage can be controlled to a desired target value.

Hereinafter, several embodiments will be described with reference to the drawings. In the embodiments, the same reference numeral is designated to the substantially same configuration, and repetitive description will be omitted.

First Embodiment

Hereinafter, a first embodiment will be described with reference to FIGS. 1 to 5.

(Schematic Configuration of Gate Drive Device)

As illustrated in FIG. 1, a gate drive device (GAT DRIV DEV) 1A of the embodiment drives a semiconductor switching element 5A constructing an upper arm of a half-bridge circuit 4 connected between a pair of DC power wires 2 and 3. A gate drive device 1B of the embodiment drives a semiconductor switching element 5B constructing a lower arm of the half-bridge circuit 4. In this case, the gate drive devices 1A and 1B have a similar configuration, and the semiconductor switching elements 5A and 5B have a similar configuration. Consequently, in the specification, in the case where it is unnecessary to discriminate the gate drive devices 1A and 1B from each other and to discriminate the semiconductor switching elements 5A and 5B from each other, they will be generally called by omitting the alphabets at the end.

The half-bridge circuit 4 is included in an inverter for driving a not-illustrated motor. To the half-bridge circuit 4, for example, a source voltage Va is supplied from a not-illustrated DC power source such as a battery via the DC power wires 2 and 3. In this case, for example, a gate drive device 1 is assumed for an in-vehicle use that it is mounted in a vehicle such as a car. The source voltage Va applied to a semiconductor switching element 5 is relatively high voltage such as several-hundred volts.

The semiconductor switching element 5 is a power element and, in this case, has a configuration including an N-channel-type MOSFET and a freewheeling diode whose source side is connected as an anode between the drain and the source of the MOSFET, that is, connected to the MOSFET in an inverse parallel manner. In this case, the freewheeling diode is provided as an element different from the MOSFET. Alternatively, a body diode of the MOSFET may be used as a freewheeling diode.

The drain of the semiconductor switching element 5A is connected to the DC power wire 2 on the high potential side. The source of the semiconductor switching element 5A is connected to the drain of the semiconductor switching element 5B. The source of the semiconductor switching element 5B is connected to the DC power wire 3 on the low potential side. A node N1 as an interconnection node of the semiconductor switching elements 5A and 5B is connected to the above-described not-illustrated motor. With the configuration, a load current IL as output current of the half-bridge circuit 4 is supplied to the motor. A controller 6 has a configuration including, for example, a microcomputer and controls driving of the motor by controlling the operation of the half-bridge circuit 4 as a component of the inverter.

To the controller 6, a detection signal Sc expressing a detection value of the load current IL output from a not-illustrated current detection unit is given. The controller 6 generates and outputs an instruction signal Sa instructing the operation of the gate drive device 1A and an instruction signal Sb instructing the operation of the gate drive device 1B so that the load current IL matches a desired target current on the basis of the detection signal Sc. On the basis of the instruction signal Sa given from the controller 6, the gate drive device 1A performs PWM control on the driving of the semiconductor switching element 5A. PWM stands for Pulse Width Modulation. On the basis of the instruction signal Sb given from the controller 6, the gate drive device 1B performs PWM control on the driving of the semiconductor switching element 5B.

In this case, the semiconductor switching elements 5A and 5B are turned on/off in a complementary manner. Therefore, in the period in which the semiconductor switching element 5A is on, the semiconductor switching element 5B is off. In the period in which the semiconductor switching element 5B is on, the semiconductor switching element 5A is off. In the configuration, in a period in which the load current IL flows from the node N1 to the motor, the semiconductor switching element 5A is driven so as to pass the current in the forward direction from the drain to the source, and the semiconductor switching element 5B is driven so as to pass the current in the inverse direction from the source to the drain.

In the configuration, in a period in which the load current IL flows from the motor to the node N1, the semiconductor switching element 5B is driven so as to pass the current in the forward direction from the drain to the source, and the semiconductor switching element 5A is driven so as to pass the current in the inverse direction from the source to the drain.

In the configuration, a drain-source voltage Vds in the semiconductor switching element 5 is a voltage at the main terminal of the semiconductor switching element 5 and corresponds to an element voltage. In the configuration, a drain current Id is a current flowing between the main terminals of the semiconductor switching element 5 and corresponds to an element current. In the specification, the drain current Id and the drain-source voltage Vds will be also simply called the current Id and the voltage Vds, respectively.

Figure 2:
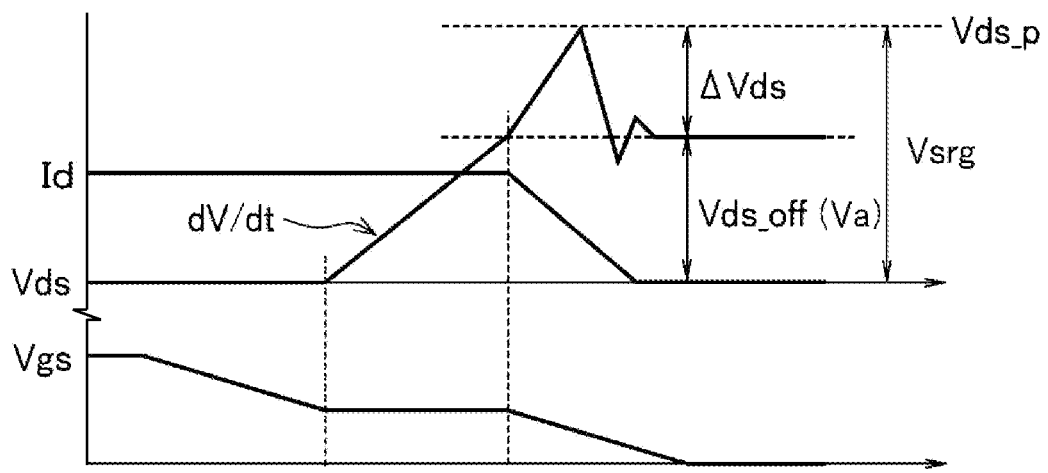
FIG. 2 is a diagram schematically illustrating waveforms of parts at the time of turn-off of a semiconductor switching element according to the first embodiment.

The waveforms of parts at the time of switching when the semiconductor switching element 5 is switched, concretely, when the semiconductor switching element 5 is turned off are as illustrated in FIG. 2. Although FIG. 2 illustrates the waveforms of the parts corresponding to the semiconductor switching element 5B, the semiconductor switching element 5A has similar waveforms. An off voltage Vds_off when the semiconductor switching element 5B is off is almost equal to the source voltage Va.

A peak value Vds_p of the voltage Vds at the time of turn-off corresponds to a peak value of the voltage at the main terminal at the time of switching of the semiconductor switching element 5. The peak value Vds_p is obtained by adding a voltage ΔVds to the off voltage Vds_off and is equal to a surge voltage which is superimposed on the semiconductor switching element 5B. Consequently, in the following description, the peak value Vds_p will be also called a surge voltage Vsrg. In this case, the slope of fluctuation of the voltage Vds at the time of turn-off, that is, slew rate corresponds to the change rate of the voltage at the main terminal at the time of switching of the semiconductor switching element 5. In the specification, the slope of fluctuation of the voltage Vds will be also called change rate dV/dt.

Each of the surge voltage Vsrg and the change rate dV/dt corresponds to transient voltage corresponding to the voltage at the main terminal of the semiconductor switching element 5 at the time of switching when the semiconductor switching element 5 is switched. The gate drive device 1 of the embodiment has various functions which will be described later, so that the transient voltage can be controlled to a desired target value. The transient voltage as a control target of the gate drive device 1 of the embodiment has the change rate dV/dt.

(Main Functions of Gate Drive Device)

Figure 3:
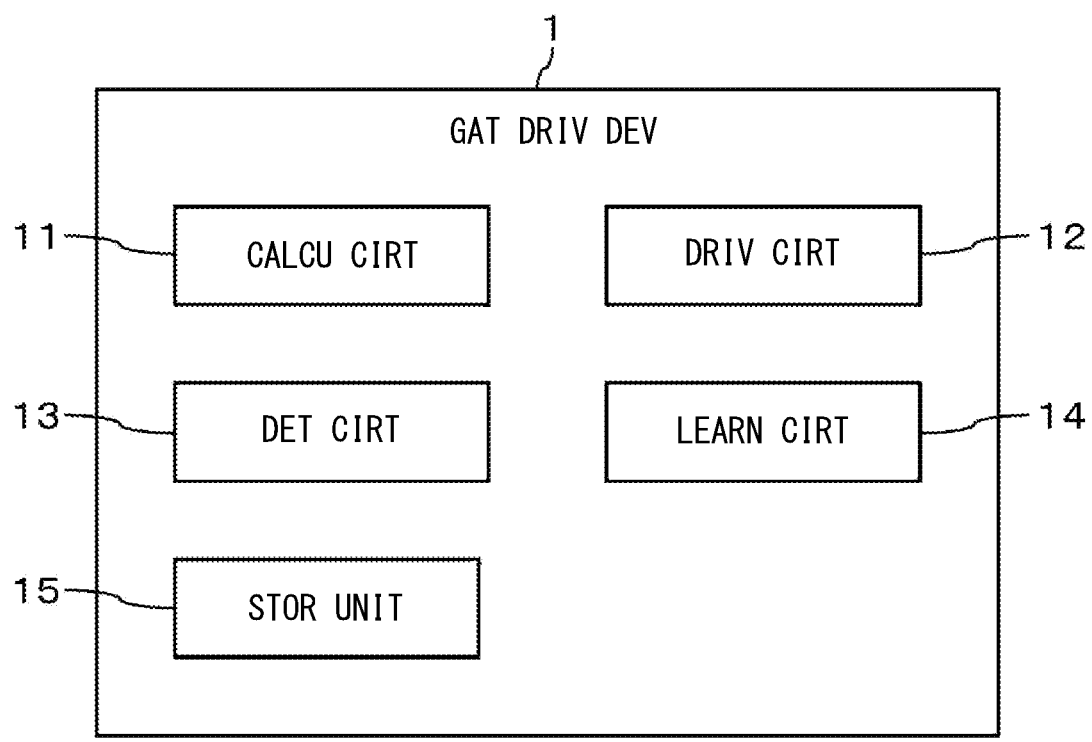
FIG. 3 is a diagram schematically illustrating main functions of the gate drive device according to the first embodiment.

Subsequently, main functions of the gate drive device 1 will be described with reference to FIG. 3. In FIG. 3 and the like, the main functions of the gate drive device 1 are expressed in the forms of function blocks. Concrete realizing methods of the functions will be described later. In the following description, in the two semiconductor switching elements 5, a target to be driven by the own device will be called the semiconductor switching element 5 of the own arm, and a target to be driven by another gate drive device 1 different from the own device will be called the semiconductor switching element 5 of the opposed arm. In the case of simply calling the semiconductor switching element 5, it refers to the semiconductor switching element 5 of the own arm.

A calculation circuit (CALCU CIRT) 11 calculates an operation amount for operating the gate drive speed of the semiconductor switching element 5 by a predetermined calculation method using a target value of the change rate dV/dt. As an operation amount, gate current, gate voltage, gate resistance, and the like of the semiconductor switching element 5 can be mentioned. A drive circuit (DRIV CIRT) 12 drives the gate of the semiconductor switching element 5 on the basis of the operation amount calculated by the calculation circuit 11. A detection circuit (DET CIRT) 13 detects the change rate dV/dt of the semiconductor switching element 5 of the own arm. A learning circuit (LEARN CIRT) 14 executes a learning process capable of changing the calculation method on the basis of the operation amount calculated by the calculation circuit 11 and the detection value of the change rate dV/dt detected by the detection circuit 13. The calculation method may also be referred to as a calculation mode. The learning process may also be referred to as learning processing.

In this case, the calculation circuit 11 preliminarily obtains the target value of the change rate dV/dt and relational information expressing the relation between the operation amount and the change rate dV/dt, and calculates the operation amount on the basis of the target value of the change rate dV/dt and the relational information obtained. Concretely, the calculation circuit 11 preliminarily obtains a model parameter as the relational information and calculates the operation amount by a model formula using the target value of the change rate dV/dt and the model parameter. As the above-described learning process, the learning circuit 14 calculates a learning value as a value corresponding to the model parameter on the basis of the operation amount calculated by the calculation circuit 11 and the detection value of the change rate dV/dt detected by the detection circuit 13, and updates the model parameter on the basis of the calculated learning value, thereby changing the calculation method of the operation amount.

In this case, the drive circuit 12 has a configuration of driving the gate of the semiconductor switching element 5 with the constant current. Consequently, the calculation circuit 11 calculates a gate current Ig of the semiconductor switching element 5 as an operation amount. When the model parameter is set as K, the target value of the change rate dV/dt is set as dV/dt*, and the gate current as the operation amount is set as Ig, the calculation circuit 11 calculates the gate current Ig using the following formula (1) as the model formula.

$$Ig = K \cdot dV/dt \tag{1}$$

When the learning value is set as Ka, the gate current calculated by the calculation circuit 11 is set as Iga, and the detection value of the change rate dV/dt detected by the detection circuit 13 is set as dV/dt as it is, the learning circuit 14 calculates the learning value Ka using the following formula (2) as an inverse model formula.

$$Ka = Ig_a \div dV/dt \qquad (2)$$

A storing unit 15 can store the model parameter K updated by the learning circuit 14. The learning circuit 14 stores the updated model parameter K into the storing unit 15 before the power shutdown of the gate drive device 1. At the time of start of the operation of the next time executed after the power shutdown of the gate drive device 1, the calculation circuit 11 calculates the operation amount by using the model parameter K stored in the storing unit 15. In this case, at the time of executing the learning process, the learning circuit 14 changes the calculating method on the basis of the operation amount of this time as present operation amount calculated by the calculation circuit 11 and the detection value of the change rate dV/dt of this time detected by the detection circuit 13 and, in addition, the operation amount in the past as past operation amount calculated by the calculation circuit 11 and the detection value of the change rate dV/dt in the past detected by the detection circuit 13.

(Concrete Configuration of Gate Drive Device)

Figure 4:
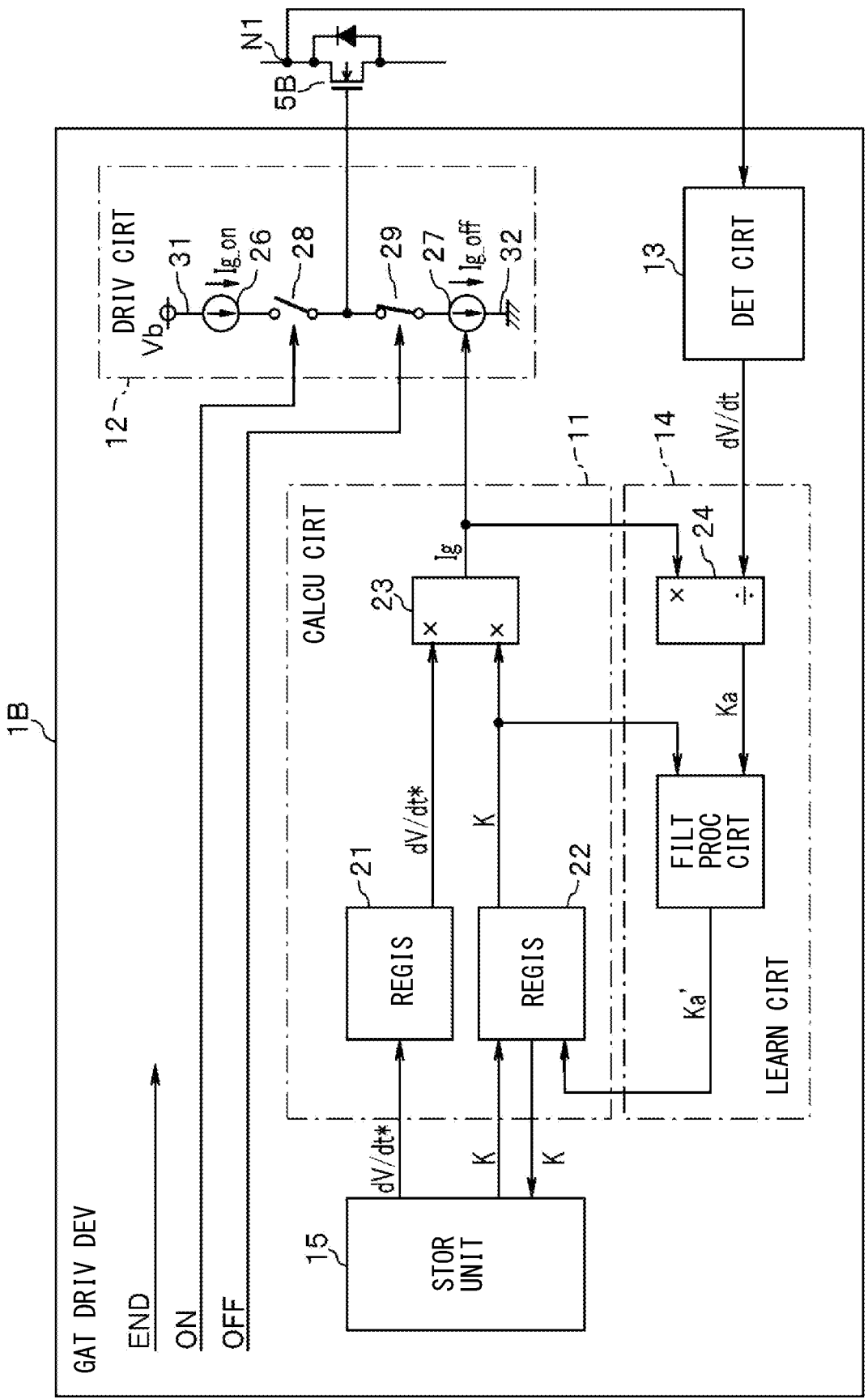
FIG. 4 is a diagram illustrating an example of a concrete configuration of the gate drive device according to the first embodiment.

As a concrete configuration of the gate drive device 1 having the functions as described above, for example, a configuration example as illustrated in FIG. 4 can be employed. Although a concrete configuration of the gate drive device 1 is illustrated using the gate drive circuit 1B as an example in FIG. 4, a similar configuration can be employed also for the gate drive device 1A. The gate drive device 1B illustrated in FIG. 4 has the calculation circuit 11, the drive circuit 12, the detection circuit 13, the learning circuit 14, the storing unit (STOR UNIT) 15, and the like.

The storing unit 15 is, for example, a nonvolatile memory in which the target value dV/dt* of the change rate dV/dt, the value of the model parameter K, and the like are stored in advance. In a system in which power is always supplied to the gate drive device 1, a volatile memory can be used as the storing unit 15. In the specification, the target value dV/dt* of the change rate dV/dt will also called a target change rate dV/dt*, and the value of the model parameter K will be also called a K value.

The target change rate dV/dt* is transmitted as an instruction from a high-order control device and can be consequently obtained in advance. The K value can be obtained in advance by performing, for example, various simulations. When reading of the target change rate dV/dt* is requested from the calculation circuit 11, the storing unit 15 outputs a signal expressing the target change rate dV/dt*. When reading of the model parameter K is requested from the calculation circuit 11, the storing unit 15 outputs a signal expressing the model parameter K. In FIG. 4 and the like, for the signals, the same reference numerals as values expressed by the signals are illustrated.

To the detection circuit 13, the voltage at the node N1, that is, the drain voltage of the semiconductor switching element 5B is supplied. The detection circuit 13 is configured as a circuit receiving the drain voltage, that is, the voltage Vds of the semiconductor switching element 5B in the case of using the potential of the source of the semiconductor switching element 5B as a reference and monitoring the waveform of the voltage Vds. By monitoring the waveform of the voltage Vds, the detection circuit 13 detects the change rate dV/dt of the voltage Vds. The detection circuit 13 outputs a signal expressing the detection value of the change rate dV/dt.

At the operation start time, the calculation circuit 11 requests reading of the target change rate dV/dt* and the model parameter K to the storing unit 15. By the operation, the signal dV/dt* and the signal K output from the storing unit 15 are supplied to the calculation circuit 11. The calculation circuit 11 has a register (REGIS) 21 storing the target change rate dV/dt* expressed by the signal dV/dt* and a register 22 and a computation circuit 23 storing a K value expressed by the signal K. The calculation circuit 11 stores the target change rate dV/dt* and the model parameter K read from the storing unit 15 into the registers 21 and 22.

The computation circuit 23 reads the target change rate dV/dt* stored in the register 21 and the K value stored in the register 22 and multiplies them. A value obtained as a computation result by the computation circuit 23 corresponds to the above-described gate current Ig. The computation circuit 23 outputs a signal expressing the gate current Ig. In this case, the K value stored in the register 22 is updated by the operation of the learning circuit 14 which will be described later. The register 22 outputs a signal expressing the stored K value to the storing unit 15 before power shutdown of the gate drive device 1B. In such a manner, the K value stored in the storing unit 15 is updated by being overwritten by the K value stored in the register 22.

To the learning circuit 14, the signal dV/dt output from the detection circuit 13 and the signal Ig output from the calculation circuit 11 are input. The learning circuit 14 has a computation circuit 24 and a filtering process circuit 25. The computation circuit 24 divides the value of the gate current Ig expressed by the signal Ig by the detection value of the change rate dV/dt expressed by the signal dV/dt. The value obtained as a result of such computation of the computation circuit 24 corresponds to the learning value Ka described above. The computation circuit 24 outputs a signal expressing the learning value Ka.

The filtering process circuit 25 is configured as, for example, a digital filter. The filtering process circuit 25 performs a filtering process using the learning value Ka expressed by the signal Ka output from the computation circuit 24 and the K value read from the register 22 as follows. The filtering process circuit 25 obtains a learning value Ka' as a value obtained by smoothing the learning value Ka by exponential moving average of smoothing coefficient α on the basis of the following formula (3). The smoothing coefficient α is a value larger than 0 and smaller than 1, that is, a value satisfying "0<α<1".

$$Ka' = Ka \times \alpha + K \times (1-\alpha) \qquad (3)$$

The filtering process circuit 25 outputs a signal expressing the learning value Ka' to the register 22 in the calculation circuit 11. By the operation, the K value stored in the register 22 is updated by being overwritten by the learning value Ka'. The filtering process by the filtering process circuit 25 may be a low-pass filter or a band-pass filter other than the exponential moving average, and may be simple moving average of holding values of last ten times and using an average value of the values, another FIR filter, or an IIR filter.

The drive circuit 12 has a configuration of driving the gate of the semiconductor switching element 5 with constant current. Specifically, the drive circuit 12 has current sources 26 and 27 and switches 28 and 29. An upstream-side terminal of the current source 26 is connected to a power wire 31 to which the source voltage Vb is supplied, and a downstream-side terminal of the current source 26 is connected to the gate of the semiconductor switching element 5B via the switch 28. The source voltage Vb is a voltage using, as a reference, the potential of a power wire 32 connected to the source of the semiconductor switching element 5B and is a voltage sufficiently higher than the gate threshold voltage of the semiconductor switching element 5B.

The current source 26 is a constant-current circuit generating, at the time of turn-on, a constant current to be supplied to the gate of the semiconductor switching element 5B, that is, a gate current Ig_on for turning on the gate of the semiconductor switching element 5B. As the configuration on the turn-on side in the drive circuit 12, in place of the current source 26, a resistor having a constant resistance value may be provided. That is, the drive circuit 12 does not have to have the configuration of constant-current driving on the turn-on side. The switch 28 has, for example, a configuration including a semiconductor switching element such as a P-channel-type MOS transistor, and opens/closes between the current source 26 and the gate of the semiconductor switching element 5B.

The downstream-side terminal of the current source 27 is connected to the power wire 32, and the upstream-side terminal of the current source 27 is connected to the gate of the semiconductor switching element 5B via the switch 29. The current source 27 is a constant-current circuit generating a constant current for withdrawing from the gate of the semiconductor switching element 5B at the time of turn-off, that is, a gate current Ig_off for turning off the gate of the semiconductor switching element 5B. In this case, the current source 27 has a configuration capable of changing its current value on the basis of the signal Ig output from the calculation circuit 11. The switch 29 has a configuration including a semiconductor switching element such as, for example, an N-channel-type MOS transistor and opens/closes between the gate of the semiconductor switching element 5B and the current source 27.

To the drive circuit 12, a turn-on instruction ON, a turn-off instruction OFF, and a switching end instruction END are given. In this case, the turn-on instruction ON and the turn-off instruction OFF are generated on the basis of an instruction signal Sb by a not-illustrated logic circuit, and the switching end instruction END is given from the controller 6 on the outside. The turn-on instruction ON and the turn-off instruction OFF can be combined as one signal. In this case, for example, it can be arranged so that when one signal is at the high level, the turn-on instruction is expressed, and when the signal is at the low level, the turn-off instruction is expressed. The switching end instruction END can be also generated on the inside of the gate drive device 1B.

The operation of the drive circuit 12 is controlled by those instructions. Specifically, in the period that the switching end instruction END is not given, the drive circuit 12 performs switching operation so as to on/off the switches 28 and 29 in a complementary manner on the basis of the turn-on instruction ON and the turn-off instruction OFF. In this case, a period that both the switches 28 and 29 are off, so-called dead time is provided.

When the turn-on instruction ON is given, the drive circuit 12 turns on the switch 28. By the operation, the gate current Ig_on is supplied to the gate of the semiconductor switching element 5B, and the semiconductor switching element 5B is turned on. When the turn-off instruction OFF is given, the drive circuit 12 turns on the switch 29. Consequently, the gate current Ig_off is withdrawn from the gate of the semiconductor switching element 5B, and the semiconductor switching element 5B is turned off. When the switching end instruction END is given, the drive circuit 12 finishes the switching operation.

(Flow of Operations by Gate Drive Device)

Figure 5:
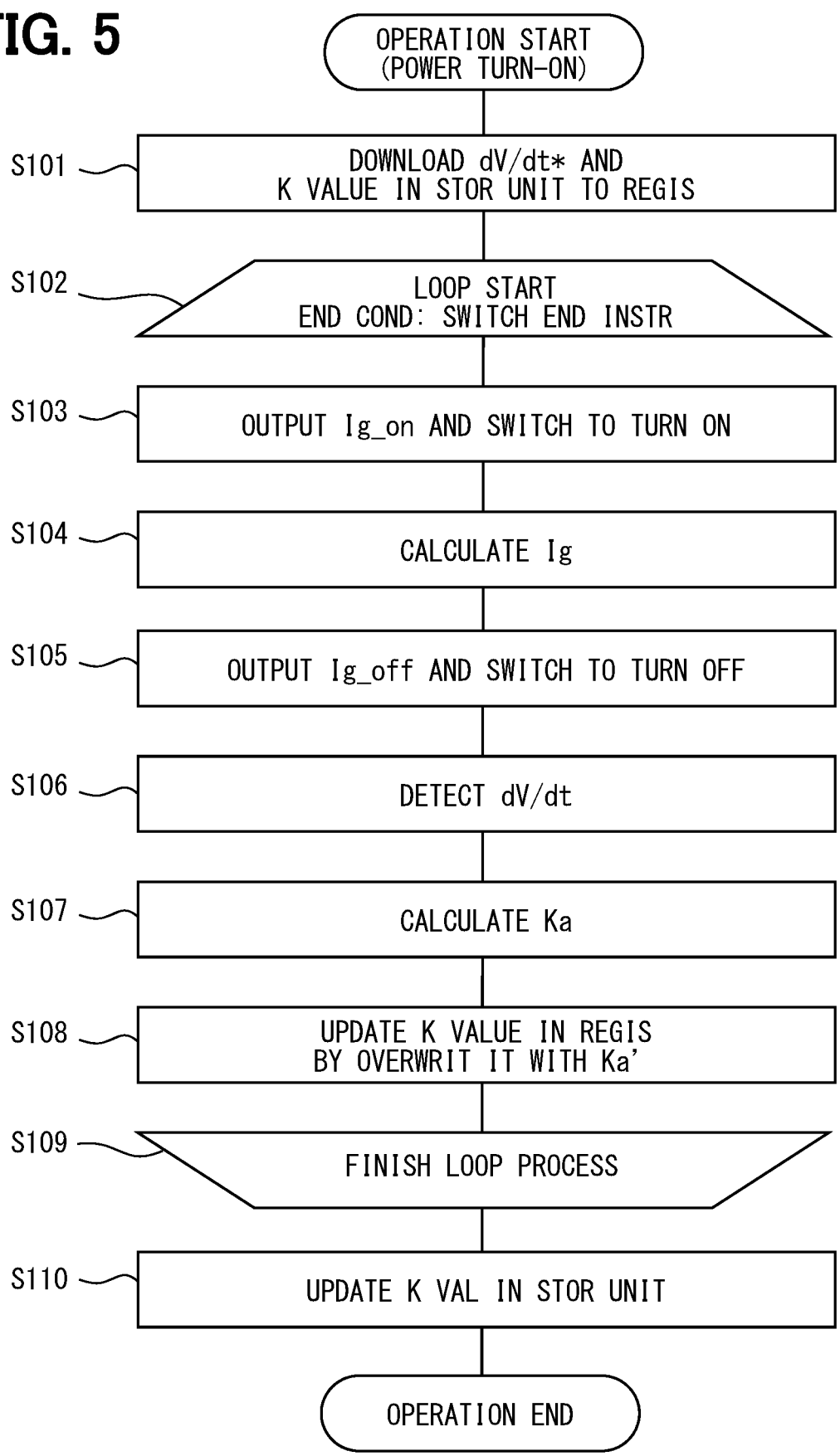
FIG. 5 is a diagram schematically illustrating the flow of operations by the gate drive device according to the first embodiment.

Subsequently, the flow of operations by the gate drive device 1 with the above configuration will be described with reference to FIG. 5. In the gate drive device 1, during a period since the power source is turned on until the power source is interrupted, processes as illustrated in FIG. 5 are executed. In S101 executed first after the operation start, the target change rate dV/dt* and the K value are read from the storing unit 15 and stored in the registers 21 and 22 in the calculation circuit 11. That is, in S101, the target change rate dV/dt* and the K value stored in the storing unit 15 are downloaded in the registers 21 and 22 in the calculation circuit 11.

After execution of S101, a loop start process in S102 is executed. The loop start process in S102 is a process of repeatedly executing the processes from S103 to S108 until the switching end instruction END is given, that is, on condition that the switching end instruction END is given as a loop ending process in S109. In S103, when the turn-on instruction ON is given, the drive circuit 12 outputs the gate current Ig_on, and the semiconductor switching element 5 is switched to turn on. The current value of the gate current Ig_on at this time is a preliminarily determined current value.

In S104, the computation circuit 23 of the calculation circuit 11 calculates the gate current Ig on the basis of the model formula (1) as the above-described model formula. S104 can be executed prior to S103. That is, the execution order of S103 and S104 can be changed. In S105, when the turn-off instruction OFF is given, the drive circuit 12 outputs the gate current Ig_off, thereby switching the semiconductor switching element 5 to turn off. The current value of the gate current Ig_off at this time is a value corresponding to the value of the gate current Ig calculated in S104. In S106, the detection circuit 13 detects the change rate dV/dt of the voltage Vds generated when the detection circuit 13 turns off.

In S107, the computation circuit 24 of the learning circuit 14 calculates the learning value Ka on the basis of formula (2) as the above-described inverse model formula. In S108, the K value stored in the register 22 is updated by being overwritten with the learning value Ka' obtained by smoothing the learning value Ka which is derived by the filtering process of the filtering process circuit 25 of the learning circuit 14. S107 and S108 correspond to the learning process executed by the learning circuit 14. In the gate drive device 1, until the switching end instruction END is given, the processes in S102 to S109 as described above are repeatedly executed.

The loop process of S102 to S109 is repeatedly executed each time the semiconductor switching element 5 is switched. When the switching end instruction END is given, the loop process of S102 to S109 is finished, and the program advances to S110. In S110, the K value stored in the storing unit 15 is updated by being overwritten with the K value stored in the register 22 of the calculation circuit 11. After execution of S110, the operation is finished.

In the gate drive device 1 of the embodiment described above, by execution of the learning process by the learning circuit 14, the calculation method used for calculating the gate current Ig as an operation amount for operating the gate drive speed at the time of turn-off of the semiconductor switching element 5 by the calculation circuit 11 is optimized so as to be according to the change rate dV/dt at the time of turn-off, which actually occurs in the semiconductor switching element 5 as a drive target of the gate drive device 1.

As described above, according to the embodiment, the calculation method is optimized according to variation among individual products. Consequently, even there is individual variation in the gate drive device 1 and the semiconductor switching element 5, the gate drive speed of the semiconductor switching element 5 can be controlled to desired speed and, moreover, the change rate dV/dt at the time of turn-off can be controlled to a desired target value.

In the gate drive device 1, the learning process by the learning circuit 14 can be performed while making the gate drive device 1 actually operate, that is, during actual operation. As described above, according to the embodiment, execution of the learning process, that is, execution of optimization of the calculation method is possible also during actual operation. Consequently, even in the case where property fluctuation with age occurs, the case where load fluctuation of temperature, the source voltage Va, or the like occurs, and the like, the change rate dV/dt can be controlled to a desired target value. Therefore, according to the embodiment, an excellent effect can be obtained such that the change rate dV/dt at the time of switching of the semiconductor switching element 5, particularly, at the time of turn-off can be controlled to a desired target value with high precision.

As described above, according to the embodiment, the change rate dV/dt at the time of switching of the semiconductor switching element 5 is set as a control object and the change rate dV/dt can be controlled to a desired target value with high precision. Therefore, both reduction in EMI and reduction of switching loss can be realized. EMI stands for Electromagnetic Interference.

In this case, the calculation circuit 11 calculates the gate current Ig by a model formula using the model parameter K like the above-described formula (1). In this case, the learning circuit 14 calculates the learning value Ka corresponding to the model parameter K by an inverse model formula like the above-described formula (2), and the model parameter K is updated on the basis of the calculated learning value Ka, thereby changing the calculation method of the gate current Ig. In such a manner, optimization of the calculation method of the gate current Ig can be realized without requiring complicated process in the calculation circuit 11 and the learning circuit 14, so that the calculation circuit 11 and the learning circuit 14 can have a relatively simple configuration.

The gate drive device 1 has the storing unit 15 capable of storing the model part updated by the learning circuit 14. The learning circuit 14 stores the model parameter K updated before power shutdown of the gate drive device 1 into the storing unit 15. The calculation circuit 11 calculates the gate current Ig by using the model parameter K stored in the storing unit 15 at the time of start of the operation of the next time executed after the power shutdown of the gate drive device 1. In such a manner, in the operation of the second and subsequent times, the gate current Ig is calculated by using the model parameter K learned in the operation of last time since the start time point of the operation. Therefore, the change rate dV/dt can be controlled to a target value with high precision stably immediately after the operation start.

At the time of executing the learning process, the learning circuit 14 changes the calculation method on the basis of the gate current Ig of this time calculated by the calculation circuit 11 and the detection value of the change rate dV/dt of this time as a present detection value detected by the detection circuit 13 and, in addition, the gate current Ig in the past calculated by the calculation circuit 11 and the detection value of the change rate dV/dt in the past as a past detection value detected by the detection circuit 13. Concretely, at the time of executing the learning process, the learning circuit 14 updates the model parameter K on the basis of the learning value Ka' obtained by smoothing the learning value Ka which is derived by performing the filtering process using the learning value Ka of this time output from the computation circuit 24 and the K value read from the register 22 of the calculation circuit 11, that is, the learning value Ka in the past. In such a manner, even in the case where erroneous learning that the learning value Ka becomes an erroneous value due to the influence of noise, temporal abnormality, or the like occurs, a situation such that the change rate dV/dt becomes a value deviated from the target value due to the influence can be suppressed.

(Modification Regarding Updating of K Value)

In the embodiment, the learning circuit 14 writes and stores the updated model parameter K, that is, updates the K value stored in the storing unit 15 before power shutdown of the gate drive device 1. This can be modified as follows.

The learning circuit 14 may store the updated model parameter K into the storing unit 15 after executing the learning process the specified number of times which is one or larger. Concretely, the learning circuit 14 may execute S110 each time S107 and S108 are executed the specified number of times. That is, the processes illustrated in FIG. 5 can be changed so that S110 is executed during the loop process.

In the case where the difference between the value of the model parameter K which is before power shutdown of the gate drive device 1 or after the learning process is executed the specified number of times which is one or larger and updated by the learning circuit 14 and the value of the model parameter K at the time of start of operation exceeds the preset allowable value, the learning circuit 14 may store the updated model parameter K into the storing unit 15. In such a manner, while suppressing the number of times of writing to the storing unit 15, the stability of the control on the change rate dV/dt immediate after start of the operation of the second and subsequent times can be maintained excellently.

Further, the learning circuit 14 may not store the updated model parameter K into the storing unit 15, that is, may not update the K value stored in the storing unit 15. In such a manner, although the stability of the control on the change rate dV/dt immediately after start of the operation of the second and subsequent times decreases, the number of times of writing to the storing unit 15 can be suppressed to be lower. Consequently, it is suitable in the case where there is restriction on the number of times of writing to the storing unit 15. In such a case, the gate drive device 1 does not have to have the storing unit 15, and it is sufficient to use a preliminarily fixed value as the initial value of the K value.

Second Embodiment

Hereinafter, a second embodiment will be described with reference to FIGS. 6 to 12.

(Main Functions of Gate Drive Device)

Figure 6:
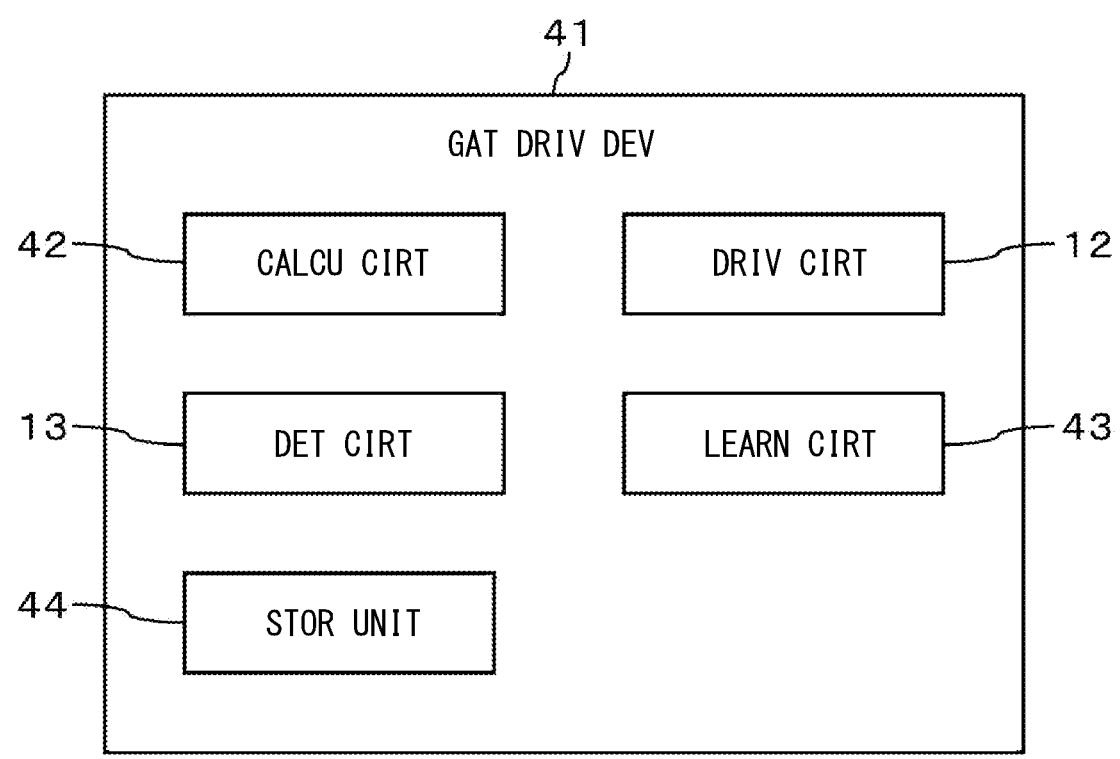
FIG. 6 is a diagram schematically illustrating main functions of a gate drive device according to a second embodiment.

Main functions of a gate drive device 41 of the embodiment will be described with reference to FIG. 6. As illustrated in FIG. 6, the gate drive device 41 of the second embodiment is different from the gate drive device 1 of the first embodiment with respect to the point that a calculation circuit 42 is provided in place of the calculation circuit 11, the point that a learning circuit 43 is provided in place of the learning circuit 14, the point that a storing unit 44 is provided in place of the storing unit 15, and the like.

The calculation circuit 42 obtains map data as relational information in advance and calculates the gate current Ig as an operation amount by a target value of the change rate dV/dt and the map data. In this case, the map data is a one-dimensional map expressing the relation between the gate current Ig as an operation amount and the change rate dV/dt as transient voltage and is, concretely, for example, data as illustrated in FIG. 8. In map data illustrated in FIG. 8, the unit of the change rate dV/dt is [kV/μs], and the unit of the gate current Ig is [A]. In the following description, unless otherwise specified, the units of the change rate dV/dt and the gate current Ig are similar to those indicated in FIG. 8, and only values will be described by omitting the units.

As the learning process, the learning circuit 43 changes the calculation method of the operation amount by updating the map data on the basis of the operation amount calculated by the calculation circuit 42 and the detection value of the change rate dV/dt detected by the detection circuit 13. The storing unit 44 can store the map data updated by the learning circuit 43. In the case where the difference between the value of the map data which is before power shutdown of the gate drive device 41 and updated by the learning circuit 43 and the value of the map data at the time of start of the operation exceeds a preset allowable value, the learning circuit 43 stores the updated map data into the storing unit 44.

The value of the map data MAP is the value of the gate current Ig as the operation amount or the value of the change rate dV/dt as the transient voltage, and such determination can be made for each of all of values of the gate current Ig or the values of the change rate dV/dt in the map data MAP. At the time of start of the operation of the next time executed after power shutdown of the gate drive device 1, the calculation circuit 42 calculates the operation amount by using the map data stored in the storing unit 44.

(Concrete Configuration of Gate Drive Device)

Figure 7:
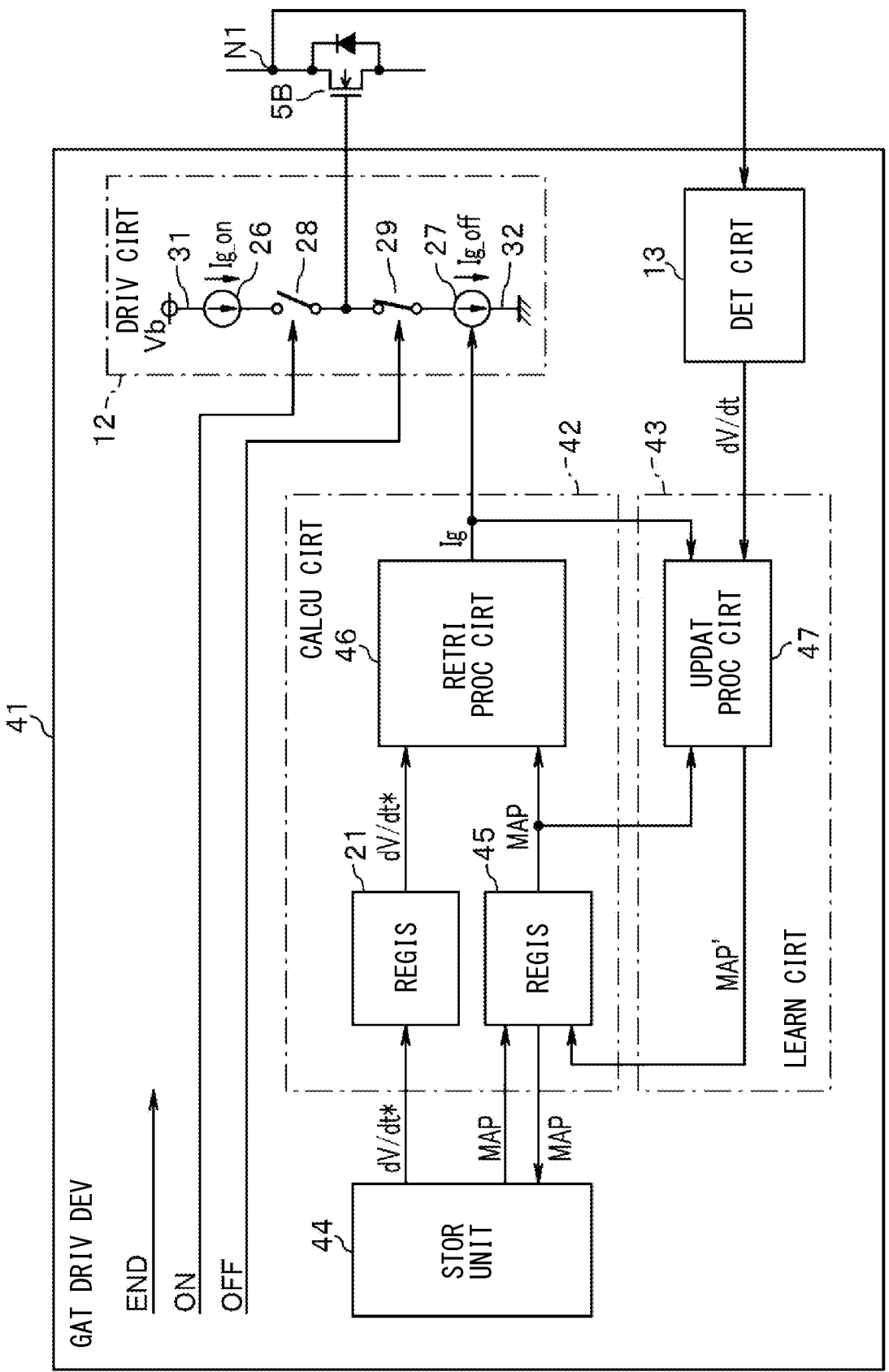
FIG. 7 is a diagram illustrating an example of a concrete configuration of the gate drive device according to the second embodiment.

As a concrete configuration of the gate drive device 41 having the functions as described above, for example, a configuration example as illustrated in FIG. 7 can be employed. The gate drive device 41 illustrated in FIG. 7 is different from the gate drive device 1 illustrated in FIG. 4 with respect to the point that the calculation circuit 42 is provided in place of the calculation circuit 11, the point that the learning circuit 43 is provided in place of the learning circuit 14, the point that the storing unit 44 is provided in place of the storing unit 15, and the like.

The storing unit 44 is different from the storing unit 15 with respect to the point that the map data MAP as the above-described one-dimensional map is stored in advance in place of the value of the model parameter K. The map data MAP can be obtained in advance by, for example, making various simulations. When reading of the map data MAP from the calculation circuit 42 is requested, the storing unit 44 outputs a signal expressing the map data MAP.

The calculation circuit 42 is different from the calculation circuit 11 with respect to the point that a register 45 storing the map data MAP is provided in place of the register 22, the point that a retrieving process circuit (RETRI PROC CIRT) 46 is provided in place of the computation circuit 23, and the like. At the time of start of operation, the calculation circuit 42 requests reading of the target change rate dV/dt* and the map data MAP to the storing unit 44. By the operation, the signal dV/dt* and the signal MAP output from the storing unit 44 are input to the calculation circuit 42. The calculation circuit 42 stores the target change rate dV/dt* and the map data MAP read from the storing unit 44 into the registers 21 and 45.

The retrieving process circuit 46 reads the target change rate dV/dt* stored in the register 21 and the map data MAP stored in the register 45. The retrieving process circuit 46 executes a retrieving process of retrieving the gate current Ig on the map data MAP corresponding to the value of the target change rate dV/dt* read from the register 21 and outputting a signal Ig expressing the value of the retrieved gate current Ig. For example, when the value of the target change rate dV/dt* read from the register 21 is "6", the retrieving process circuit 46 retrieves the gate current Ig=0.15 on the map data MAP corresponding to the change rate dV/dt=6 and outputs a signal Ig expressing "0.15" as the value of the retrieved gate current Ig.

In this case, the map data MAP stored in the register 45 is updated by the operation of the learning circuit 43 which will be described later. In the case where the difference between the value of the map data which is before power shutdown of the gate drive device 41 and updated by the learning circuit 43 and the value of the map data at the time of start of the operation exceeds a preset allowable value, the register 45 outputs the signal expressing the stored map data MAP to the storing unit 44. By the operation, the map data MAP stored in the storing unit 44 is updated by being overwritten with the map data MAP stored in the register 45.

The learning circuit 43 is different from the learning circuit 14 with respect to the point that an updating process circuit (UPDAT PROC CIRT) 47 is provided in place of the computation circuit 24 and the filtering process circuit 25, and the like. To the learning circuit 43, the signal dV/dt output from the detection circuit 13 and the signal MAP and the signal Ig output from the calculation circuit 42 are input. The updating process circuit 47 executes an updating process of retrieving the gate current Ig on the map data MAP corresponding to the detection value of the change rate dV/dt detected by the detection circuit 13, generating updated map data MAP' obtained by changing the value of the retrieved gate current Ig on the map data MAP to the value of the gate current Ig calculated by the calculation circuit 42, and outputting a signal expressing the updated map data MAP'.

For example, in the case where the detection value of the change rate dV/dt detected by the detection circuit 13 is "7" and the value of the gate current Ig calculated by the calculation circuit 42 is "0.15", the updating process circuit 47 retrieves the gate current Ig=0.20 on the map data MAP corresponding to the change rate dV/dt=7. The updating process circuit 47 generates the updated data MAP' obtained by changing the value of the retrieved gate current Ig corresponding to the change rate dV/dt=7 on the map data MAP to "0.15" as the value of the gate current Ig calculated by the calculation circuit 42.

The updated map data MAP' is concretely, for example, data as illustrated in FIG. 9. As illustrated in FIG. 9, in the updated map data MAP', the value of the gate current Ig corresponding to the change rate dV/dt=7 is changed from "0.20" to "0.15". The updating process circuit 47 outputs a signal expressing the updated map data MAP' generated by such an updating process to the register 45 of the calculation circuit 42. The map data MAP stored in the register 45 is updated by being overwritten with the updated map data MAP'.

(Flow of Operations by Gate Drive Device)

Figure 10:
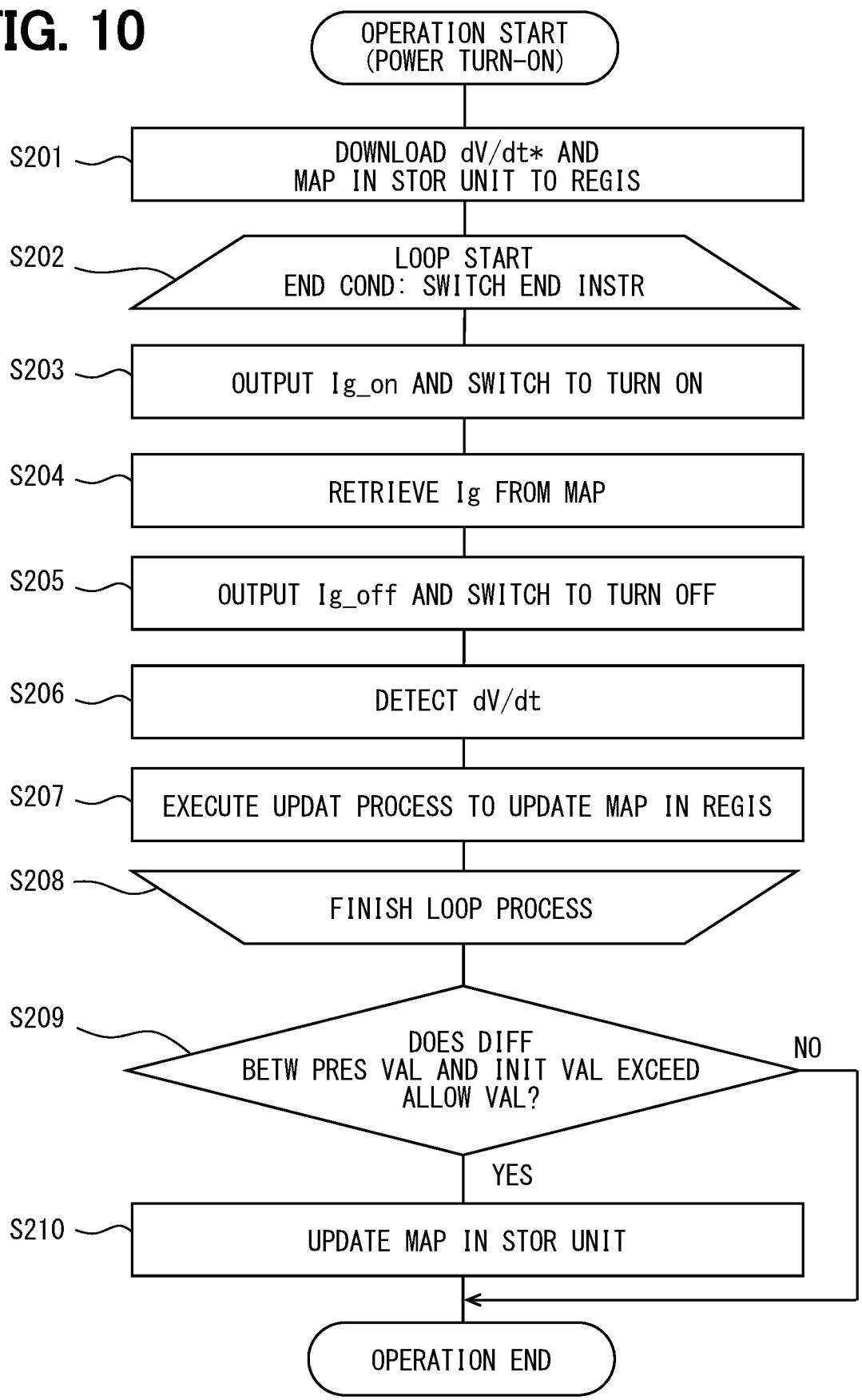
FIG. 10 is a diagram schematically illustrating the flow of operations by the gate drive device according to the second embodiment.

Subsequently, the flow of operations by the gate drive device 41 having the above-described configuration will be described with reference to FIG. 10. In the gate drive device 41, processes as written in FIG. 10 are executed during a period since power is turned on until the power is shutdown. In S201 executed first after the operation start, the target change rate dV/dt* and the map data MAP are read from the storing unit 44 and stored into the registers 21 and 45 in the calculation circuit 42. That is, in S201, the target change rate dV/dt* and the map data MAP stored in the storing unit 44 are downloaded to the registers 21 and 45 in the calculation circuit 42.

After execution of S201, a loop start process in S202 is executed. The loop start process in S202 is a process of repeatedly executing the processes from S203 to S207 until the switching end instruction END is given as a loop ending process in S208, that is, on an ending condition that the switching end instruction END is given. In S203, when the turn-on instruction ON is given, the drive circuit 12 outputs the gate current Ig_on by which the semiconductor switching element 5 is switched to turn on. The current value of the gate current Ig_on at this time is a preliminarily determined current value.

In S204, the retrieving process circuit 46 of the calculation circuit 42 executes the above-described retrieving process. Specifically, in S204, the calculation circuit 42 retrieves the gate current Ig from the map data MAP stored in the register 45 by using the target change rate dV/dt* stored in the register 21. S204 can be executed before S203. That is, the execution order of S203 and S204 can be changed.

In S205, when the turn-off instruction OFF is given, the drive circuit 12 outputs the gate current Ig_off by which the semiconductor switching element 5 is switched to turn off. The current value of the gate current Ig_off at this time is a value corresponding to the value of the gate current Ig retrieved in S204. In S206, the detection circuit 13 detects the change rate dV/dt of the voltage Vds generated at the time of turn-off.

In S207, the updating process circuit 47 of the learning circuit 43 executes the above-described updating process, thereby updating the map data MAP stored in the register 45 of the calculation circuit 42 so as to be overwritten with the update map data MAP'. S207 corresponds to the learning process executed by the learning circuit 43. In the gate drive device 41, until the switching end instruction END is given, the processes in S202 to S208 as described above are repeatedly executed.

The loop process of S202 to S208 is repeatedly executed each time the semiconductor switching element 5 is switched. When the switching end instruction END is given, the loop process of S202 to S208 is finished, and the program advances to S209. In S209, whether or not the difference between the present value as the value of the map data MAP stored in the register 45 and the value of the map data MAP stored in the storing unit 44, that is, the initial value as the value of the map data MAP at the time of start of operation exceeds a preset allowable value is determined. In this case, the value of the map data MAP is the value of the gate current Ig as the operation amount, and such determination is performed for each of the values of all of the gate currents Ig in the map data MAP.

In the case where the difference between the present value and the initial value is equal to or less than the allowable value, "NO" is determined in S209, and the operation is finished without executing S210. On the other hand, in the case where the difference between the present value and the initial value exceeds the allowable value, "YES" is determined in S209, and the program advances to S210.

In S210, the map data MAP stored in the storing unit 44 is updated by being overwritten with the map data MAP stored in the register 45 of the calculation circuit 42. After the execution of S210, the operation is finished.

Also by the gate drive device 41 of the embodiment described above, an effect similar to that of the first embodiment, specifically, an excellent effect that the change rate dV/dt at the time of switching of the semiconductor switching element 5, particularly, at the time of turn-off can be controlled to a desired target value with high precision is obtained. In this case, the calculation circuit 42 calculates the value of the gate current Ig by the map data MAP as a one-dimensional map expressing the relation between the gate current Ig and the change rate dV/dt.

In this case, the learning circuit 43 changes the calculation method of the gate current Ig by updating the map data MAP on the basis of the value of the gate current Ig calculated by the calculation circuit 42 and the detection value of the change rate dV/dt detected by the detection circuit 13. By such an operation, a computation error of the gate current Ig by the calculation circuit 42 is reduced, so that the change rate dV/dt can be controlled to a target value with higher precision.

The gate drive device 41 has the storing unit 44 capable of storing the map data MAP updated by the learning circuit 43. In the case where the difference between the value of the map data MAP which is before power shutdown of the gate drive device 41 and updated by the learning circuit 43 and the value of the map data MAP at the time of start of operation exceeds the preset allowable value, the learning circuit 43 stores the updated map data MAP into the storing unit 44. At the time of start of the operation of the next time executed after power shutdown of the gate drive device 41, the calculation circuit 42 calculates the gate current Ig by using the map data MAP stored in the storing unit 44. In such a manner, while suppressing the number of times of writing to the storing unit 44, in the operation of the second and subsequent times, the gate current Ig is calculated by using the map data MAP learned in the operation of last time since the start time point of the operation. Therefore, the change rate dV/dt can be controlled to a target value with high precision stably immediately after the operation start.

(Modification Regarding Update of Map Data)

In the embodiment, in the case where the difference between the value of the map data MAP which is before power shutdown of the gate drive device 41 and updated by the learning circuit 43 and the value of the map data MAP at the time of start of operation exceeds the preset allowable value, the learning circuit 43 writes and stores the updated map data MAP into the storing unit 44, that is, updates the map data MAP stored in the storing unit 44. This can be modified as follows.

Specifically, in the case where the difference between the value of the map data MAP which is after the learning process is executed by the specified number of times which is one or larger and updated by the learning circuit 43 and the value of the map data MAP at the time of start of operation exceeds the preset allowable value, the learning circuit 43 may store the updated map data MAP into the storing unit 44. Concretely, the learning circuit 43 may execute S209 and S210 each time S207 is executed the specified number of times. That is, the processes illustrated in FIG. 10 can be changed so that S209 and S210 are executed during the loop process.

The learning circuit 3 may store the updated map data MAP into the storing unit 44 before power shutdown of the gate drive device 41 or after executing the learning process the specified number of times which is one or larger. Concretely, the learning circuit 43 may execute S210 without executing S209 after the loop process is finished. That is, the processes illustrated in FIG. 10 can be changed so as to omit S209. In such a manner, in the operations of the second and subsequent times, the gate current Ig is calculated by certainly using the map data MAP learned in the operation of last time since the start time point of the operation, so that the change rate dV/dt can be controlled to a target value with high precision and stably immediately after the operation start.

Further, the learning circuit 43 does not have to store the updated map data MAP into the storing unit 44, that is, does not have to update the map data MAP stored in the storing unit 44. In this way, although the stability of control of the change rate dV/dt immediately after start of the operation of the second and subsequent times decreases, the number of times of writing to the storing unit 44 can be suppressed, so that it is suitable in the case where the number of times of writing to the storing unit 44 is restricted. In such a case, the gate drive device (gate drive circuit) 41 does not have to have the storing unit 44, and it is sufficient to use, as the map data MAP, a value which is preliminarily fixed as an initial value.

(Modification Regarding Learning Process)

At the time of executing the learning process, the learning circuit 43 can change the calculation method on the basis of the gate current Ig of this time calculated by the calculation circuit 42 and the detection value of the change rate dV/dt of this time detected by the detection circuit 13 and, in addition, the gate current Ig in the past calculated by the calculation circuit 42 and the detection value of the change rate dV/dt in the past detected by the detection circuit 13. Concretely, at the time of executing the learning process, the learning circuit 43 can update map data by updated map data obtained by smoothing the updated map data MAP' derived by performing the filtering process using the updated map data MAP' of this time output from the updating process circuit 47 and the map data MAP corresponding to the updated map data MAP' in the past stored in the register 45 of the calculation circuit 42.

As the filtering process, for example, the various processes described in the first embodiment can be employed. In such a manner, even in the case where erroneous learning that the value of the updated map data MAP' becomes an erroneous value due to the influence of noise, temporal abnormality, or the like occurs, a situation such that the change rate dV/dt becomes a value deviated from the target value due to the influence can be suppressed.

(Modifications Regarding Updating Process)

The updating process of generating the updated map data MAP' by the updating process circuit 47 of the learning circuit 43, that is, the process of updating the map data can be modified as follows.

(First Modification)

The updating process circuit 47 of the learning circuit 43 is modified to update the map data MAP so that the value of the retrieved gate current Ig on the map data MAP is changed only by the difference between the value of the retrieved gate current Ig on the map data MAP and the value of the gate current Ig calculated by the calculation circuit 42, and the value of the gate current Ig within a predetermined range whose center is the retrieved gate current Ig on the map data MAP is changed only by the above-described difference.

For example, in the case where the detection value of the change rate dV/dt detected by the detection circuit 13 is "7" and the value of the gate current Ig calculated by the calculation circuit 42 is "0.15", when the predetermined range is ±2 [kV/µs], the updated map data MAP' generated by the updating process of the first modification becomes data as illustrated in FIG. 11. As illustrated in FIG. 11, in this case, the value of the gate current Ig corresponding to the change rate dV/dt=7 is changed from "0.20" to "0.15".

In this case, each of data within the range of ±2 of the change rate dV/dt=7, that is, values of the gate current Ig corresponding to the change rate dV/dt=5, the change rate dV/dt=6, the change rate dV/dt=8, and the change rate dV/dt=9 is changed only by "−0.05". "−0.05" is the difference between "0.20" as the value of the retrieved gate current Ig and "0.15" as the value of the gate current Ig calculated by the calculation circuit 42.

Accompanying the change, the value of the gate current Ig corresponding to the change rate dV/dt=5 is changed to "0.07" smaller than "0.09" as the value of the gate current Ig corresponding to the change rate dV/dt=4, and an inversion phenomenon occurs in the values of the gate current Ig corresponding to the change rate dV/dt=4 and the change rate dV/dt=5. Therefore, a predetermined restriction may be made on the value of the gate current Ig after the change so that such an inversion phenomenon does not occur.

According to the updating process of the first modification, not only one value but also its peripheral values are similarly updated by the learning process of once, so that learning of map data, that is, optimization of the calculation method is realized more promptly. Therefore, since a computation error of the gate current Ig by the calculation circuit 42 is reduced by the updating process of the first modification, the change rate dV/dt can be controlled to a target value with higher precision. The predetermined range is not limited to the above-described range but may be, for example, all of the range of the map data MAP.

(Second Modification)

The updating process circuit 47 of the learning circuit 43 can be modified to update the map data MAP by changing the value of the retrieved gate current Ig on the map data MAP only by the difference between the value of the retrieved gate current Ig on the map data MAP and the value of the gate current Ig calculated by the calculation circuit 42 and changing each of the values of the gate current Ig within a predetermined range using the retrieved gate current Ig on the map data MAP as a center only by a value obtained by multiplying the above-described difference with a weight coefficient which attenuates with distance from the center.

For example, in the case where the detection value of the change rate dV/dt detected by the detection circuit 13 is "7" and the value of the gate current Ig calculated by the calculation circuit 42 is "0.15", when the predetermined range is ±2 [kV/µs], the update map data MAP' generated by the updating process of the second modification becomes data as illustrated in FIG. 12. As illustrated in FIG. 12, in this case, the value of the gate current Ig corresponding to the change rate dV/dt=7 is changed from "0.20" to "0.15".

In this case, each of data within the range of ±2 of the change rate dV/dt=7, that is, values of the gate current Ig corresponding to the change rate dV/dt=5, the change rate dV/dt=6, the change rate dV/dt=8, and the change rate dV/dt=9 is changed only by "−0.05×weight coefficient". "−0.05" is the difference between "0.20" as the value of the retrieved gate current Ig and "0.15" as the value of the gate current Ig calculated by the calculation circuit 42. The weight coefficient is "0.5" for the change rate dV/dt=6 and the change rate dV/dt=8, and is "0.25" for the change rate dV/dt=5 and the change rate dV/dt=9.

Concretely, the value of the gate current Ig corresponding to the change rate dV/dt=5 is changed from "0.12" to "0.11", the value of the gate current Ig corresponding to the change rate dV/dt=6 is changed from "0.15" to "0.13", the value of the gate current Ig corresponding to the change rate dV/dt=8 is changed from "0.25" to "0.23", and the value of the gate current Ig corresponding to the change rate dV/dt=9 is changed from "0.30" to "0.29".

By such an updating process of the second modification, not only one value but also values in the periphery of the value are similarly updated by the learning process of once, so that learning of map data, that is, optimization of the calculation method is realized more promptly. Therefore, since a computation error of the gate current Ig by the calculation circuit 42 can be reduced by the updating process of the second modification, the change rate dV/dt can be controlled to a target value with higher precision.

According to the updating process of the second modification, each of the values of the gate current Ig within a predetermined range using the retrieved gate current Ig on the map data MAP as a center is changed only by a value obtained by multiplying the above-described difference with a weight coefficient which attenuates with distance from the center, so that the possibility of occurrence of the inverse phenomenon described in the updating process of the first modification can be suppressed to be low. The predetermined range is not limited to the above-described range but can be, for example, the entire range of the map data MAP.

Third Embodiment

Hereinafter, a third embodiment will be described with reference to FIGS. 13 to 16.

(Main Functions of Gate Drive Device)

Figure 13:
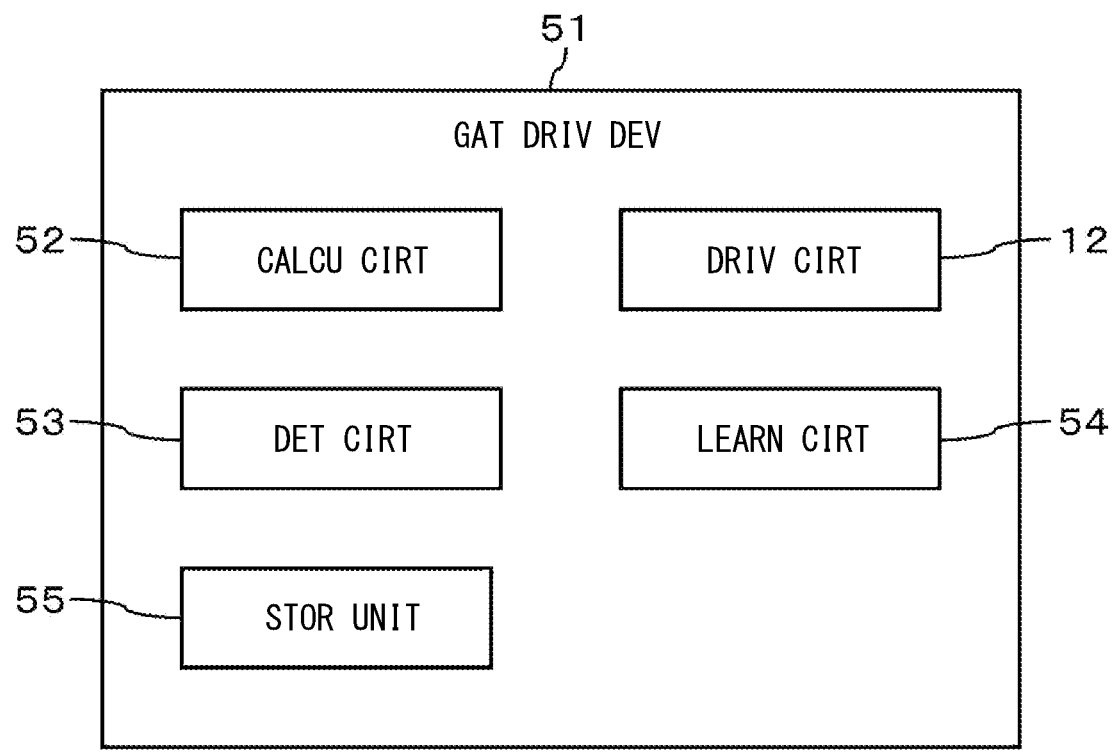
FIG. 13 is a diagram schematically illustrating main functions of a gate drive device according to a third embodiment.

Main functions of a gate drive device 51 of the embodiment will be described with reference to FIG. 13. As illustrated in FIG. 13, the gate drive device 51 of the third embodiment is different from the gate drive device 41 of the second embodiment with respect to the point that a calculation circuit 52 is provided in place of the calculation circuit 42, the point that a detection circuit 53 is provided in place of the detection circuit 13, the point that a learning circuit 54 is provided in place of the learning circuit 43, the point that a storing unit 55 is provided in place of the storing unit 44, and the like.

The detection circuit 53 detects, in addition to the change rate dV/dt, element temperature, that is, temperature Tj of the semiconductor switching element 5. The calculation circuit 52 preliminarily obtains map data as relational information like the calculation circuit 42. In this case, the map data is a multidimensional map holding the gate current Ig as the operation amount by combining the change rate dV/dt as transient voltage and the temperature Tj of the semiconductor switching element 5 and, concretely, for example, data as illustrated in FIG. 15. In the map data illustrated in FIG. 15, the unit of the temperature Tj is in degree Celsius "° C.". In the following description, unless otherwise specified, the unit of the temperature Tj is the unit as illustrated in FIG. 15, and only values will be described by omitting the units.

The calculation circuit 52 calculates the target value of the change rate dV/dt, the detection value of the temperature Tj by the detection circuit 53, and the gate current Ig as an operation amount by map data. The learning circuit 54 can execute a learning process similar to that of the learning circuit 43. The storing unit 55 can store map data updated by the learning circuit 54. The learning circuit 54 stores the updated map data into the storing unit 55 before power shutdown of the gate drive device 51. The calculation circuit 52 calculates an operation amount by using the map data stored in the storing unit 55 at the time of start of operation of next time executed after power shutdown of the gate drive device 51.

(Concrete Configuration of Gate Drive Device)

Figure 14:
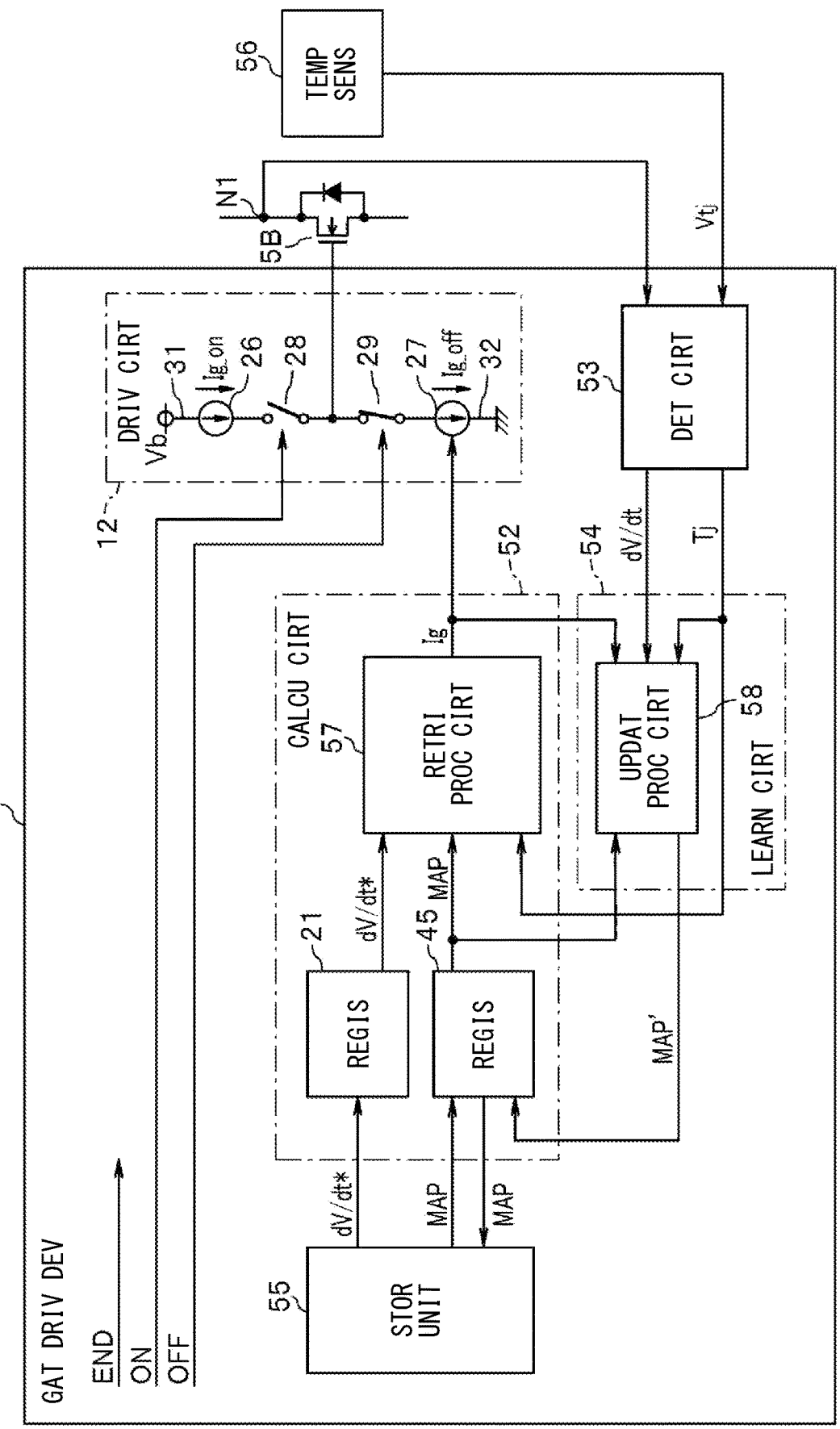
FIG. 14 is a diagram illustrating an example of a concrete configuration of the gate drive device according to the third embodiment.

As a concrete configuration of the gate drive device 51 having the above-described functions, for example, a configuration example as illustrated in FIG. 14 can be employed. The gate drive device 51 illustrated in FIG. 14 is different from the gate drive device 41 of the second embodiment illustrated in FIG. 7 with respect to the point that the calculation circuit 52 is provided in place of the calculation circuit 42, the point that the detection circuit 53 is provided in place of the detection circuit 13, the point that the learning circuit 54 is provided in place of the learning circuit 43, the point that the storing unit 55 is provided in place of the storing unit 44, and the like.

The detection circuit 53 detects the change rate dV/dt like the detection circuit 13 and also detects the temperature Tj as follows. In this case, a temperature sensor (TEMP SENS) 56 is disposed near the semiconductor switching element 5. The temperature sensor 56 outputs, as a voltage signal Vtj, temperature information corresponding to the temperature of the semiconductor switching element 5 detected. To the detection circuit 53, the voltage signal Vtj output from the temperature sensor 56 is input. The detection circuit 53 has a configuration for obtaining the temperature information expressed by the voltage signal Vtj, thereby detecting the temperature Tj of the semiconductor switching element 5. The detection circuit 53 outputs a signal expressing the detection value of the change rate dV/dt and a signal expressing the detection value of the temperature Tj.

The storing unit 55 is different from the storing unit 44 with respect to the point that the map data MAP stored is the above-described two-dimensional map, and the like. The calculation circuit 52 is different from the calculation circuit 42 with respect to the point that a retrieving process circuit 57 is provided in place of the retrieving process circuit 46, and the like. The calculation circuit 52 performs operations almost similar to those of the calculation circuit 42 except for the operation executed by the retrieving process circuit 57. The retrieving process circuit 57 reads the target change rate dV/dt* stored in the register 21 and the map data MAP stored in the register 45. To the retrieving process circuit 57, the signal Tj output from the detection circuit 53 is input.

The retrieving process circuit 57 executes a retrieving process of retrieving the gate current Ig on the map data MAP corresponding to the value of the target change rate dV/dt* read from the register 21 and corresponding to the detection value of the temperature Tj of the semiconductor switching element 5 expressed by the signal Tj, and outputting the signal Ig expressing the value of the gate current Ig retrieved. For example, in the case where the value of the target change rate dV/dt* read from the register 21 is "3" and the detection value of the temperature Tj is "50", the retrieving process circuit 57 retrieves the gate current Ig=0.09 on the map data MAP corresponding to the change rate dV/dt=3 and the temperature Tj=50, and outputs the signal Ig expressing "0.09" as the value of the gate current Ig retrieved.

In this case, the map data MAP stored in the register 45 is updated by the operation of the learning circuit 54 which will be described later. The register 45 outputs the signal expressing the map data MAP stored to the storing unit 55 before power shutdown of the gate drive device 51. By the operation, the map data MAP stored in the storing unit 55 is updated by being overwritten with the map data MAP stored in the register 45.

The learning circuit 54 is different from the learning circuit 43 with respect to the point that an updating process circuit 58 is provided in place of the updating process circuit 47, and the like. To the learning circuit 54, the signal dV/dt and the signal Tj output from the detection circuit 53 and the signal MAP and the signal Ig output from the calculation circuit 52 are input. The updating process circuit 58 executes an updating process of retrieving the gate current Ig on the map data MAP corresponding to the detection value of the change rate dV/dt detected by the detection circuit 53 and corresponding to the detection value of the temperature Tj detected by the detection circuit 53, generating the updated map data MAP' obtained by changing the value of the retrieved gate current Ig on the map data MAP to the value of the gate current Ig calculated by the calculation circuit 52, and outputting a signal expressing the updated map data MAP'.

For example, in the case where detection values of the change rate dV/dt and the temperature Tj detected by the detection circuit 53 are "4" and "50", respectively, and the value of the gate current Ig calculated by the calculation circuit 52 is "0.09", the updating process circuit 58 retrieves the gate current Ig=0.10 on the map data MAP corresponding to the change rate dV/dt=4 and the temperature Tj=50. The updating process circuit 58 generates the updated map data MAP' obtained by changing the value of the gate current Ig corresponding to the change rate dV/dt=4 and the temperature Tj=50 on the map data MAP retrieved to "0.09" as the value of the gate current Ig calculated by the calculation circuit 52. The updating process circuit 58 outputs a signal expressing the updated map data MAP' generated by such an updating process to the register 45 of the calculation circuit 52. By the operation, the map data MAP stored in the register 45 is updated by being overwritten with the updated map data MAP'.

(Flow of Operations by Gate Drive Device)

Figure 16:
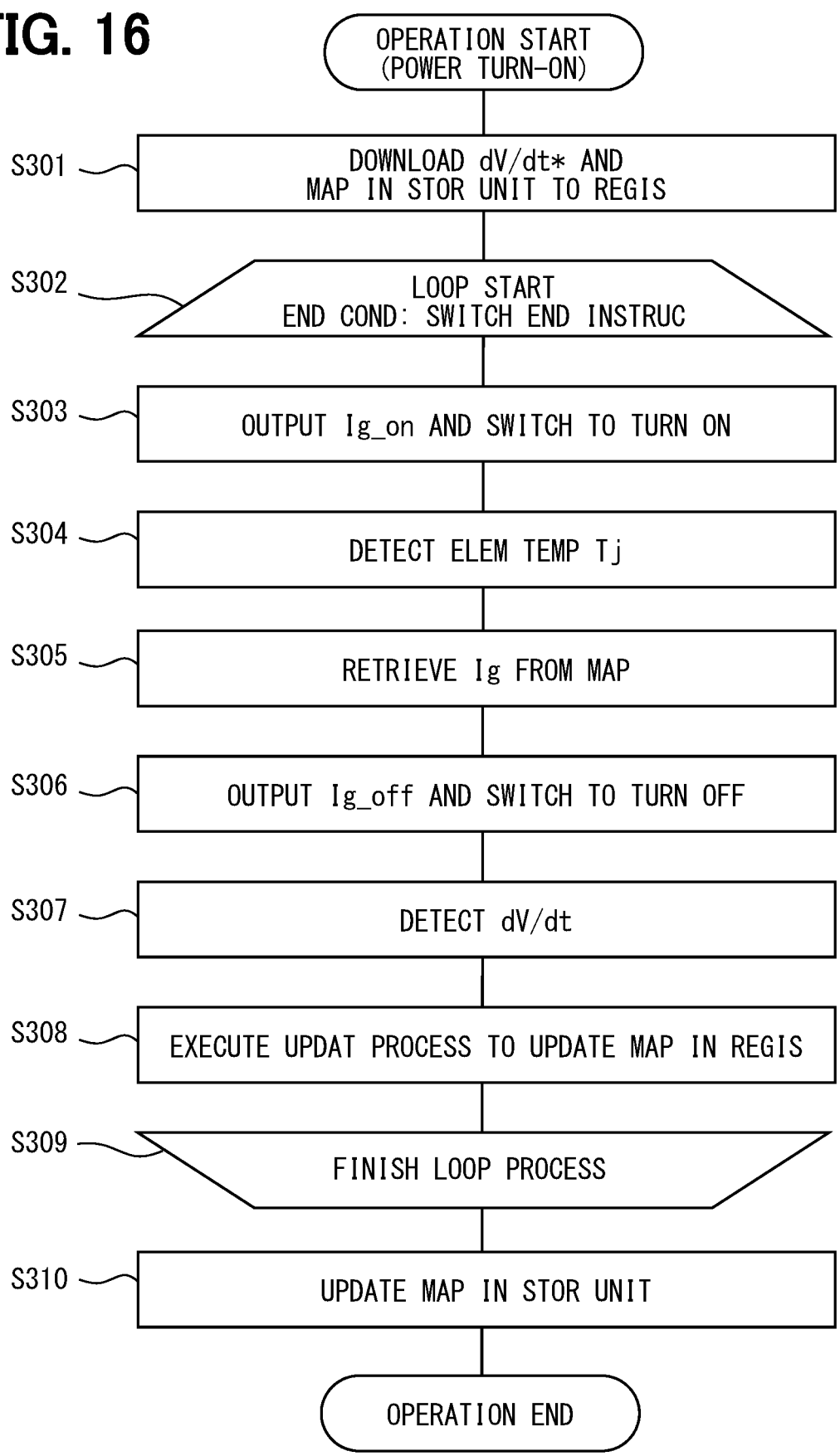
FIG. 16 is a diagram schematically illustrating the flow of operations by the gate drive device according to the third embodiment.

Subsequently, the flow of operations by the gate drive device 51 with the above-described configuration will be described with reference to FIG. 16. In the gate drive device 51, during a period since the power is turned on until the power is turned off, processes as illustrated in FIG. 16 are executed. In S301 executed first after the operation start, the target change rate dV/dt* and the map data MAP are read from the storing unit 55 and stored in the registers 21 and 45 in the calculation circuit 52. That is, in S301, the target change rate dV/dt* and the map data MAP stored in the storing unit 55 are downloaded in the registers 21 and 45 in the calculation circuit 52.

After execution of S301, a loop start process in S302 is executed. The loop start process in S302 is a process of repeatedly executing the processes from S303 to S308 until the switching end instruction END is given, that is, on condition of ending that the switching end instruction END is given as a loop ending process in S309. In S303, when the turn-on instruction ON is given, the drive circuit 12 outputs the gate current Ig_on, by which the semiconductor switching element 5 is switched to turn on. The current value of the gate current Ig_on at this time is a preliminarily determined current value.

In S304, the detection circuit 53 detects the temperature Tj of the semiconductor switching element 5, that is, the element temperature. In S305, the retrieving process circuit 57 in the calculation circuit 52 executes the above-described retrieving process. Specifically, in S305, the calculation circuit 52 retrieves the gate current Ig by using the target change rate dV/dt* stored in the register 21 from the map data MAP stored in the register 45 and the temperature Tj detected in S304. S304 and S305 can be also executed prior to S303. That is, the execution order of S303 and S304 and S305 can be changed.

In S306, when the turn-off instruction OFF is given, the drive circuit 12 outputs the gate current Ig_off, by which the semiconductor switching element 5 is switched to turn off. The current value of the gate current Ig_off at this time is a value corresponding to the value of the gate current Ig retrieved in S305. In S307, the detection circuit 13 detects the change rate dV/dt of the voltage Vds generated at the time of turn-off. In S307, the detection circuit 53 may detect the temperature Tj in addition to the change rate dV/dt.

In S308, the updating process circuit 58 of the learning circuit 54 executes the above-described updating process, so that the map data MAP stored in the register 45 in the calculation circuit 52 is updated by being overwritten with the update map data MAP'. S308 corresponds to the learning process executed by the learning circuit 54. In the gate drive device 51, until the switching end instruction END is given, the processes in S302 to S309 as described above are repeatedly executed.

The loop process of S302 to S309 is repeatedly executed each time the semiconductor switching element 5 is switched. When the switching end instruction END is given, the loop process of S302 to S309 is finished, and the program advances to S310. In S310, the map data MAP stored in the storing unit 55 is updated by being overwritten with the map data MAP stored in the register 45 in the calculation circuit 52. After execution of S310, the operation is finished.

Also by the gate drive device 51 of the embodiment described above, an effect similar to that of the first embodiment, that is, an excellent effect can be obtained such that the change rate dV/dt at the time of switching of the semiconductor switching element 5, particularly, at the time of turn-off can be controlled to a desired target value with high precision. By the gate drive device 51 of the embodiment, the following effect is also obtained. There is the possibility that the change rate dV/dt at the time of turn-off which actually occurs in the semiconductor switching element 5 as a drive target of the gate drive device 51 changes in dependence upon the temperature Tj of the semiconductor switching element 5 and the like.

In this case, the calculation circuit 52 calculates the value of the gate current Ig by the map data MAP as a two-dimensional map which holds the gate current Ig by combining the change rate dV/dt and the temperature Tj. In this case, the learning circuit 54 changes the calculation method of the gate current Ig by updating the map data MAP on the basis of the value of the gate current Ig calculated by the calculation circuit 52 and the detection values of the change rate dV/dt and the temperature Tj detected by the detection circuit 53. In such a manner, the computation error of the gate current Ig by the calculation circuit 52 due to the temperature Tj of the semiconductor switching element 5 is reduced, so that the change rate dV/dt can be controlled to a target value with higher precision.

The gate drive device 51 has the storing unit 55 capable of storing the map data MAP updated by the learning circuit 54. The learning circuit 54 stores the map data MAP updated before power shutdown of the gate drive device 51 into the storing unit 55. The calculation circuit 52 calculates the gate current Ig by using the map data MAP stored in the storing unit 55 at the time of start of the operation of the next time executed after the power shutdown of the gate drive device 51. In such a manner, in the operation of the second and subsequent times, the gate current Ig is calculated by using the map data MAP learned in the operation of last time since the start time point of the operation. Therefore, the change rate dV/dt can be controlled to a target value with high precision stably immediately after the operation start.

(Modification Regarding Map Data)

There is the possibility that the change rate dV/dt at the time of turn-off which actually occurs in the semiconductor switching element 5 as a drive target of the gate drive device 51 changes in dependence upon not only the temperature Tj of the semiconductor switching element 5 but also the temperature of the gate drive device 51, the source voltage Va as voltage applied across the main terminals, that is, the drain and the source of the semiconductor switching element 5, element current as current flowing between the main terminals, that is, the drain and the source of the semiconductor switching element 5, and the like.

Consequently, the map data MAP may be a multidimensional map holding the gate current Ig as an operation amount by combining the change rate dV/dt as transient voltage and at least one of physical quantities of the temperature Tj of the semiconductor switching element 5, the temperature of the gate drive device 51, the source voltage Va, and the element current. In this case, the detection circuit 53 has to have a configuration of detecting at least one of the physical quantities of the temperature Tj of the semiconductor switching element 5, the temperature of the gate drive device 51, the source voltage Va, and the element current.

In this case, the calculation circuit 52 calculates the gate current Ig by the target value dV/dt* of the change rate dV/dt, the detection value of the physical amount by the detection circuit 53, and the map data MAP. In such a manner, the computation error of the gate current Ig due to the physical quantities such as the temperature Tj of the semiconductor switching element 5, the temperature of the gate drive device 51, the source voltage Va, and the element current, that is, various disturbance factors can be reduced. Therefore, the change rate dV/dt can be controlled to a target value with higher precision.

(Modification Regarding Updating of Map Data)

In the embodiment, the learning circuit 54 writes and stores the updated map data MAP into the storing unit 55, that is, updates the map data MAP stored in the storing unit 55 before power shutdown of the gate drive device 51. This can be modified as follows.

The learning circuit 54 may store the updated map data MAP into the storing unit 55 after executing the learning process the specified number of times which is one or larger. Concretely, the learning circuit 54 may execute S310 each time S308 is executed the specified number of times. That is, the processes in FIG. 16 can be changed so that S310 is executed during the loop process.

In the case where the difference between the value of the map data MAP which is before the power shutdown of the gate drive device (gate drive circuit) 51 or after the learning process is executed the specified number of times which is one or larger and is updated by the learning circuit 54 and the value of the map data MAP at the time of start of the operation exceeds a preset allowable value, the learning circuit 54 may store the updated map data MAP into the storing unit 55. Concretely, the learning circuit 54 may execute a process similar to that of S209 in the process of the second embodiment illustrated in FIG. 10 after the loop process is finished and, after that, execute S310. That is, the processes illustrated in FIG. 16 can be changed so as to add a process similar to S209 between S309 and S310. In such a manner, while suppressing the number of times of writing to the storing unit 55, the stability of the control on the change rate dV/dt immediate after start of the operation of the second and subsequent times can be maintained excellently.

Further, the learning circuit 54 may not store the updated map data MAP into the storing unit 55, that is, may not update the map data MAP stored in the storing unit 55. In such a manner, although the stability of the control on the change rate dV/dt immediately after start of the operation of the second and subsequent times decreases, the number of times of writing to the storing unit 55 can be suppressed to be low. Consequently, it is suitable in the case where there is restriction on the number of times of writing to the storing unit 55. In such a case, the gate drive device 51 does not have to have the storing unit 55, and it is sufficient to use a preliminarily fixed value as the initial value of the map data MAP.

(Modification Regarding Learning Process)

At the time of executing the learning process, the learning circuit 54 can change the calculation method on the basis of the gate current Ig of this time calculated by the calculation circuit 52 and the detection values of the change rate dV/dt and the temperature Tj of this time detected by the detection circuit 53 and, in addition, the gate current Ig in the past calculated by the calculation circuit 52 and the detection values of the change rate dV/dt and the temperature Tj in the past detected by the detection circuit 53. Concretely, at the time of executing the learning process, the learning circuit 54 can update map data by updated map data which is obtained by smoothing the updated map data MAP' derived by performing the filtering process using the map data MAP corresponding to the updated map data MAP' of this time output from the updating process circuit 58 and the updated map data MAP' in the past stored in the register 45 in the calculation circuit 52.

As the filtering process, for example, the various processes described in the first embodiment can be employed. In such a manner, even in the case where erroneous learning that the value of the updated map data MAP' becomes an erroneous value due to the influence of noise, temporary abnormality, or the like occurs, a situation such that the change rate dV/dt becomes a value deviated from the target value due to the influence can be suppressed.

(Modification Regarding Updating Process)

The updating process of generating the updated map data MAP' by the updating process circuit 58 in the learning circuit 54, that is, the process of updating the map data can be modified in a manner similar to the first and second modifications related to the updating process described in the second embodiment.

Fourth Embodiment

Figure 17:
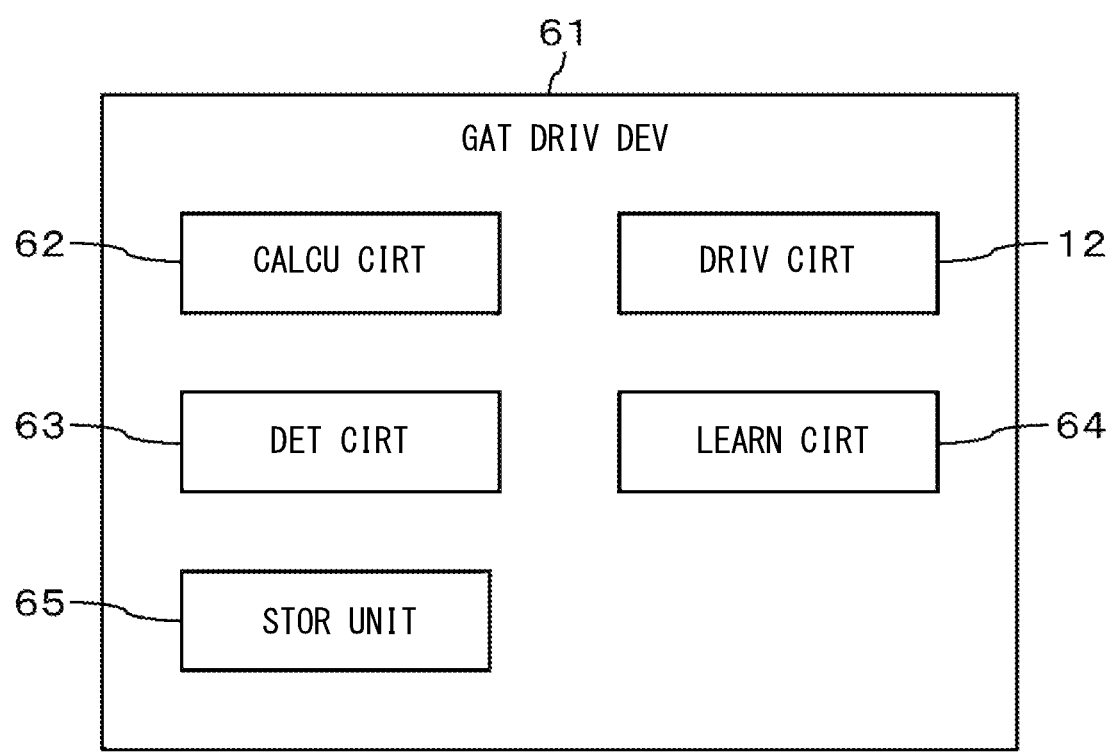
FIG. 17 is a diagram schematically illustrating main functions of a gate drive device according to a fourth embodiment.

Hereinafter, a fourth embodiment will be described with reference to FIGS. 17 to 19.

(Main Functions of Gate Drive Device)

Main functions of a gate drive device 61 of the embodiment will be described with reference to FIG. 17. As illustrated in FIG. 17, the gate drive device 61 of the fourth embodiment is different from the gate drive device 1 of the first embodiment with respect to the point that a calculation circuit 62 is provided in place of the calculation circuit 11, the point that a detection circuit 63 is provided in place of the detection circuit 13, the point that a learning circuit 64 is provided in place of the learning circuit 14, the point that a storing unit 65 is provided in place of the storing unit 15, and the like.

Transient voltage as a control target of the gate drive device 61 of the embodiment is the surge voltage Vsrg of the semiconductor switching element 5 of the own arm. The components of the gate drive device 61 perform operations in a manner almost similar to those of the gate drive device 1 except for the point that the control target is changed from the change rate dV/dt to the surge voltage Vsrg. The detection circuit 63 detects, in addition to the surge voltage Vsrg of the semiconductor switching element 5 of the own arm, the source voltage Va and the current Id. Alternatively, the detection circuit 63 can detect the off voltage Vds_off as a voltage almost equal to the source voltage Va in place of the source voltage Va. In such a case, it is sufficient to replace the source voltage Va in the following description with the off voltage Vds_off.

When the model parameter is set as K, the target value of the surge voltage Vsrg is set as Vsrg*, the source voltage as a voltage applied across the main terminals of the semiconductor switching element 5 is set as Va, and the gate current as an operation amount is set as Ig, the calculation circuit 62 calculates the gate current Ig using the following formula (4) as a model formula.

$$Ig = (Vsrg^* - Va) \div K \quad (4)$$

When the learning value is set as Ka, the gate current calculated by the calculation circuit 62 is set as Iga, and the detection value of the surge voltage Vsrg detected by the detection circuit 63 is set as Vsrg, the learning circuit 64 calculates the learning value Ka using the following formula (5) as an inverse model formula.

$$Ka = (Vsrg - Va) \div Iga \quad (5)$$

(Concrete Configuration of Gate Drive Device)

Figure 18:
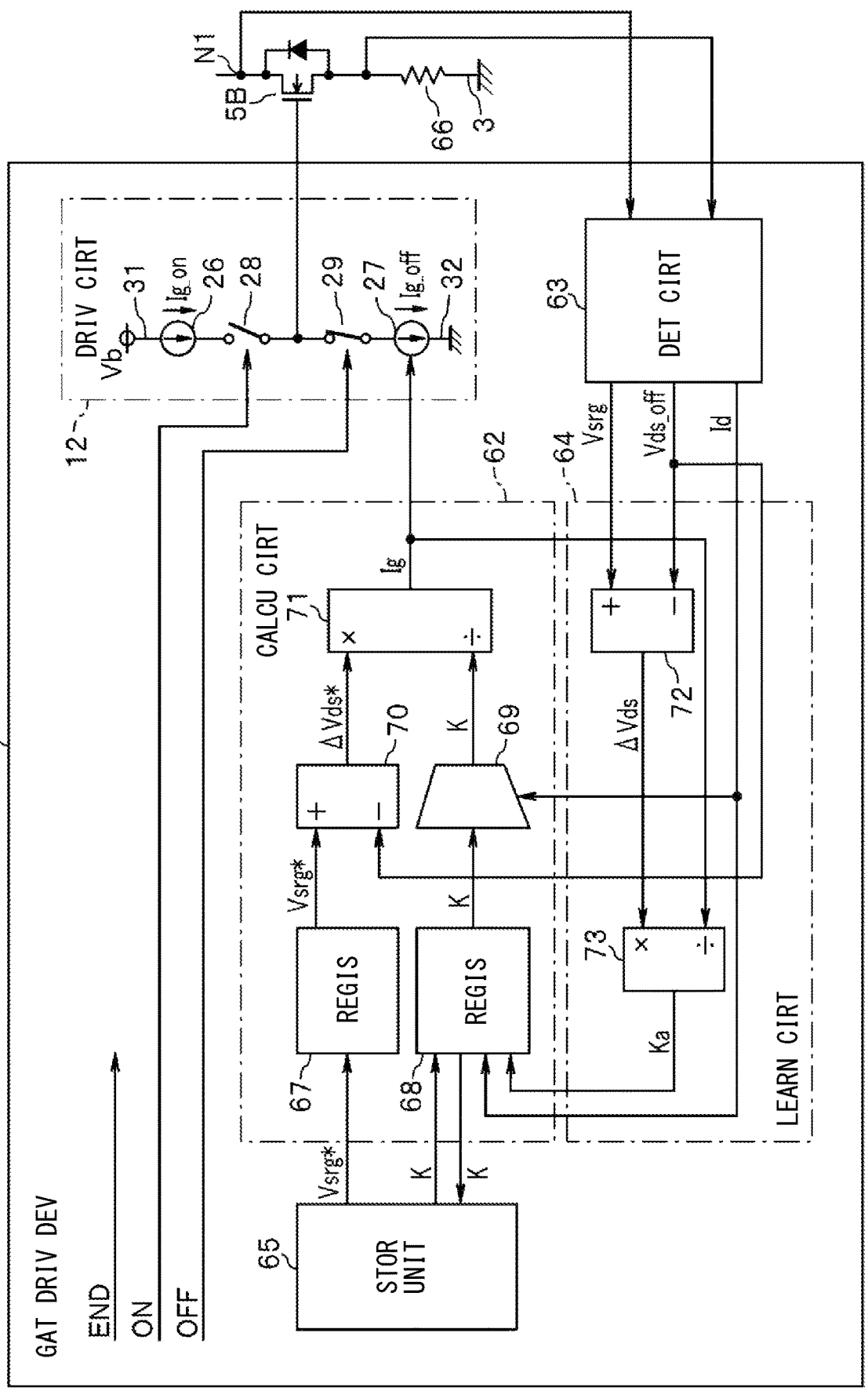
FIG. 18 is a diagram illustrating an example of a concrete configuration of the gate drive device according to the fourth embodiment.
Figure 19:
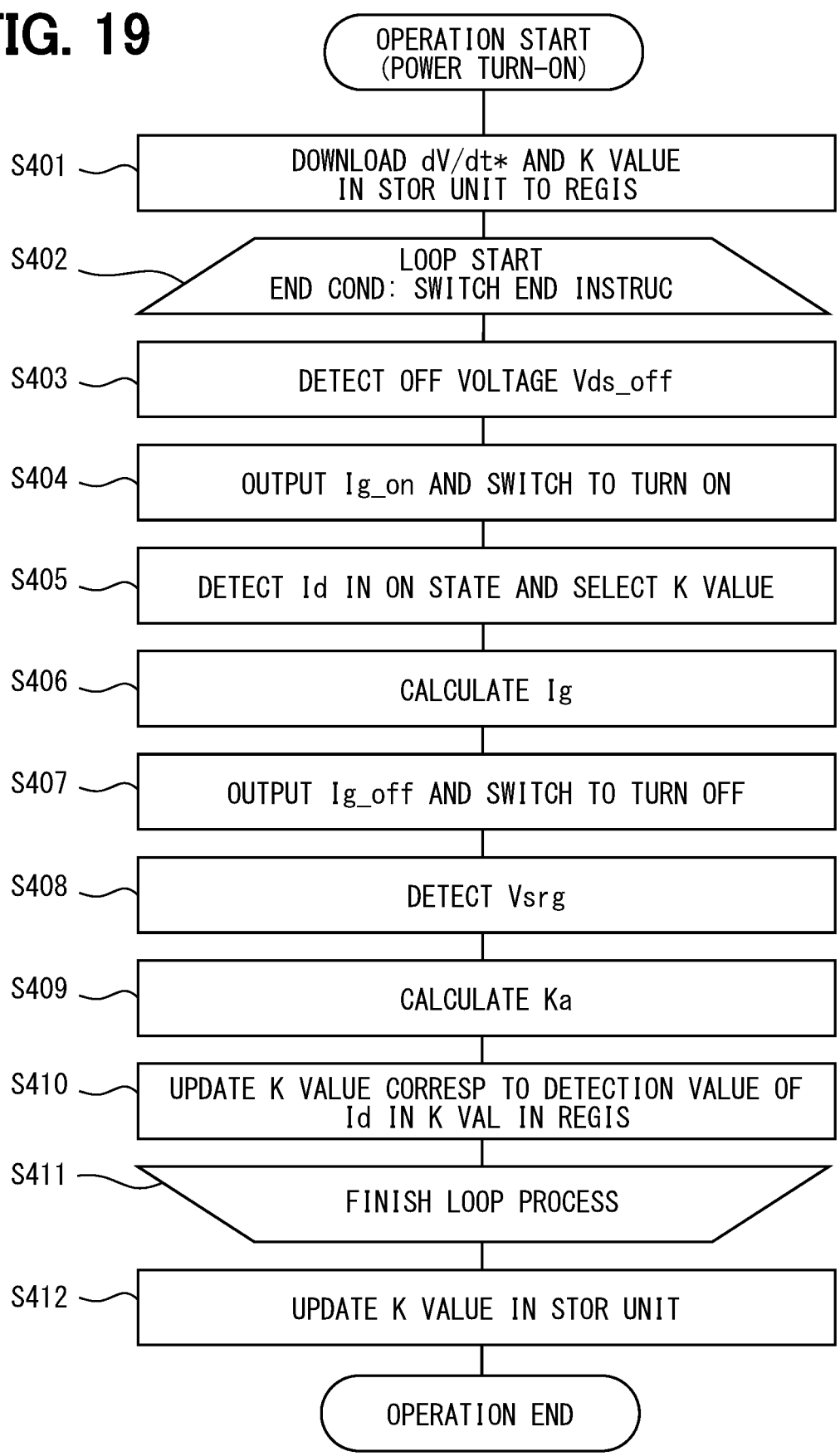
FIG. 19 is a diagram schematically illustrating the flow of operations by the gate drive device according to the fourth embodiment.

As a concrete configuration of the gate drive device 61 having the functions as described above, for example, a configuration example illustrated in FIG. 18 can be employed. The gate drive device 61 illustrated in FIG. 18 is different from the gate drive device 1 illustrated in FIG. 4 with respect to the point that the calculation circuit 62 is provided in place of the calculation circuit 11, the point that the detection circuit 63 is provided in place of the detection circuit 13, the point that the learning circuit 64 is provided in place of the learning circuit 14, the point that the storing unit 65 is provided in place of the storing unit 15, and the like.

In the storing unit 65, the target value Vsrg* of the surge voltage Vsrg, a plurality of K values which are determined for respective currents Id, and the like are stored in advance. In the specification, the target value Vsrg* of the surge voltage Vsrg will be also called the target surge voltage Vsrg*. The target surge voltage Vsrg* is transmitted as an instruction from a high-order control device, so that it can be obtained in advance. For example, it can be obtained in advance by performing various simulations. When reading of the target surge voltage Vsrg* is requested from the calculation circuit 62, the storing unit 65 outputs a signal expressing the target surge voltage Vsrg*. When reading of the K value is requested from the calculation circuit 62, the storing unit 65 outputs a signal expressing the K value for each current Id.

By monitoring the waveforms of the voltage Vds, the detection circuit 63 detects the surge voltage Vsrg and the off voltage Vds_off. As described above, since the off-voltage Vds_off is voltage almost equal to the source voltage Va, the off voltage Vds_off is detected here in place of the source voltage Va. The detection circuit 63 detects the current Id as follows. In this case, a shunt resistor 66 is connected between the source of the semiconductor switching element 5B and the DC power wire 3.

To the detection circuit 63, terminal voltage of the shunt resistor 66, concretely, the voltage of the terminal on the semiconductor switching element 5 side of the shunt resister 66 is input. The detection circuit 63 has a configuration capable of detecting the current Id on the basis of the voltage value of the terminal voltage of the shunt resistor 66. The detection circuit 63 outputs a signal expressing the detection value of the change rate dV/dt, a signal expressing the detection value of the off voltage Vds_off, and a signal expressing the detection value of the current Id.

At the time of operation start, the calculation circuit 62 requests the storing unit 65 to read the target surge voltage Vsrg* and the K value. By the operation, the signal Vsrg* and the signal K output from the storing unit 65 are input to the calculation circuit 62. The calculation circuit 62 has a register 67 storing the target surge voltage Vsrg* expressed by the signal Vsrg*, a register 68 storing the K value for each current Id expressed by the signal K, a selector 69, and computation circuits 70 and 71. The calculation circuit 62 stores the target surge voltage Vsrg* and the K value for each current Id read from the storing unit 65 into the registers 67 and 68.

To the selector 69, the signal Id output from the detection circuit 63 is input. The selector 69 reads a plurality of K values stored in the register 68 and selects a K value corresponding to the detection value of the current Id expressed by the signal Id from the plurality of K values. The selector 69 outputs a signal expressing the K value selected as described above to the computation circuit 71. To the computation circuit 70, the signal Vds_off output from the detection circuit 63 is input. The computation circuit 70 reads the target surge voltage Vsrg* stored in the register 67 and subtracts the detection value of the off voltage Vds_off expressed by the signal Vds_off from the read target surge voltage Vsrg*.

A value obtained as a result of the computation of the computation circuit 70 corresponds to a target value ΔVds* of the above-described voltage ΔVds. In the specification, the target value ΔVds* of the voltage ΔVds will be also called a target voltage ΔVds*. The computation circuit 70 outputs a signal expressing the voltage ΔVds* to the computation circuit 71. The computation circuit 71 divides the value of the target voltage ΔVds* expressed by the signal ΔVds* by the K value expressed by the signal K.

The value obtained as a result of the computation of the computation circuit 71 corresponds to the above-described gate current Ig. The computation circuit 71 outputs a signal expressing the gate current Ig. In this case, the K value stored in the register 68 is updated by the operation of the learning circuit 64 which will be described later. The register 68 outputs the signal expressing the stored K value to the storing unit 65 before power shutdown of the gate drive device 61. By the operation, the K value stored in the storing unit 65 is updated by being overwritten with the K value stored in the register 68.

To the learning circuit 64, the signals Vsrg and Vds_off output from the detection circuit 63 and the signal Ig output from the calculation circuit 62 are input. The learning circuit 64 has computation circuits 72 and 73. The computation circuit 72 subtracts the detection value of the off voltage Vds_off expressed by the signal Vds_off from the detection value of the surge voltage Vsrg expressed by the signal Vsrg.

The value obtained as a result of the computation of the computation circuit 72 corresponds to a detection value of the above-described voltage ΔVds. The computation circuit 72 outputs a signal expressing the detection value of the voltage ΔVds to the computation circuit 73.

The computation circuit 73 divides the detection value of the voltage ΔVds expressed by the signal ΔVds by the value of the gate current Ig expressed by the signal Ig. The value obtained as a result of the computation of the computation circuit 73 corresponds to the above-described learning value Ka. The computation circuit 73 outputs a signal expressing the learning value Ka to the register 68 of the calculation circuit 62. By the operation, the K value corresponding to the detection value of the current Id expressed by the signal Id among the plurality of K values stored in the register 68 is updated by being overwritten with the learning value Ka.

(Flow of Operations by Gate Drive Device)

Subsequently, the flow of operations by the gate drive device 61 having the above-described configuration will be described with reference to FIG. 19. In the gate drive device 61, during a period since the power is turned on until the power is shutdown, processes as illustrated in FIG. 19 are executed. In S401 executed first after the operation start, the target surge voltage Vsrg* and the K value for each current Id are read from the storing unit 65 and stored into the registers 67 and 68 in the calculation circuit 62. That is, in S401, the target surge voltage Vsrg* and the K value of each current Id stored in the storing unit 65 are downloaded in the registers 67 and 68 in the calculation circuit 62.

After execution of S401, a loop start process in S402 is executed. The loop start process in S402 is a process of repeatedly executing the processes from S403 to S410 until the switching end instruction END is given, that is, on ending condition that the switching end instruction END is given as a loop ending process in S411. In S403, the semiconductor switching element 5 is in the off state and, in such a state, the detection circuit 63 detects the off voltage Vds_off.

In S404, when the turn-on instruction ON is given, the drive circuit 12 outputs the gate current Ig_on and by which the semiconductor switching element 5 is switched to turn on. The current value of the gate current Ig_on at this time is a preliminarily determined current value. In S405, the semiconductor switching element 5 is in the on state and, in such a state, the detection circuit 63 detects the current Id. In S405, the selector 69 of the calculation circuit 62 selects the K value corresponding to the detection value of the current Id.

In S406, by executing each of computations by the computation circuits 70 and 71 of the calculation circuit 62, the calculation circuit 62 calculates the gate current Ig on the basis of Formula (4) as the above-described model formula. In S407, when the turn-off instruction OFF is given, the drive circuit 12 outputs the gate current Ig_off and by which the semiconductor switching element 5 is switched to turn off. The current value of the gate current Ig_off at this time is a value corresponding to the value of the gate current Ig calculated in S406.

In S408, the detection circuit 63 detects the surge voltage Vsrg generated at the time of turn-off. In S408, the detection circuit 63 may detect, in addition to the surge voltage Vsrg, the off voltage Vds_off. In S409, by executing each of computations by the computation circuits 72 and 73 of the learning circuit 64, the learning circuit 64 calculates the learning value Ka on the basis of Formula (5) as the above-described inverse model formula. In S410, the K value corresponding to the detection value of the current Id among the plurality of K values stored in the register 68 is updated by being overwritten with the learning value Ka.

S409 and S410 correspond to the learning process executed by the learning circuit 64. Although S410 is executed after execution of S409, in place or in addition, S410 may be executed after execution of S405. However, at the time of execution of the loop process for the first time, S410 cannot be executed after execution of S405.

In the gate drive device 61, until the switching end instruction END is given, the processes in S402 to S411 as described above are repeatedly executed. That is, the loop process of S402 to S411 is repeatedly executed each time the semiconductor switching element 5 is switched. When the switching end instruction END is given, the loop process of S402 to S411 is finished, and the program advances to S412. In S412, the K value stored in the storing unit 65 is updated by being overwritten with the K value stored in the register 68 of the calculation circuit 62. After execution of S412, the operation is finished.

According to the gate drive device 61 of the embodiment described above, by executing the learning process by the learning circuit 64, the calculation method used for calculating the gate current Ig as an operation amount for operating the gate drive speed at the time of turn-off of the semiconductor switching element 5 by the calculation circuit 62 is optimized so as to be according to the surge voltage Vsrg at the time of turn-off, which is actually generated in the semiconductor switching element 5 as a drive target of the gate drive device 61.

As described above, according to the embodiment, the calculation method is optimized according to variation among products. Consequently, even there is individual variation in the gate drive device 1 and the semiconductor switching element 5, the gate drive speed of the semiconductor switching element 5 can be controlled to desired speed and, moreover, the surge voltage Vsrg at the time of turn-off can be controlled to a desired target value.

In the gate drive device 61, the learning process by the learning circuit 64 can be performed while making the gate drive device 61 actually operate, that is, during actual operation. As described above, according to the embodiment, execution of the learning process, that is, execution of optimization of the calculation method is possible also in actual operation. Consequently, in the cases such that property fluctuation with age occurs or load fluctuation of temperature, the source voltage Va, or the like occurs, the surge voltage Vsrg can be controlled to a desired target value. Therefore, according to the embodiment, an excellent effect can be obtained such that the surge voltage Vsrg at the time of switching of the semiconductor switching element 5, particularly, at the time of turn-off can be controlled to a desired target value with high precision.

As described above, according to the embodiment, the surge voltage Vsrg at the time of switching of the semiconductor switching element 5 is set as a control target, and the surge voltage Vsrg can be controlled to a desired target value with high precision. Therefore, both prevention of a failure caused, for example, when the surge voltage Vsrg applied to the main terminal of the semiconductor switching element 5 exceeds element withstand voltage and reduction of switching loss can be realized.

In this case, the calculation circuit 62 calculates the gate current Ig by a model formula using the model parameter K like the above-described Formula (4). In this case, the learning circuit 64 calculates the learning value Ka corresponding to the model parameter K by an inverse model formula like the above-described Formula (5), and the model parameter K is updated on the basis of the calculated learning value Ka, thereby changing the calculation method of the gate current Ig. In such a manner, optimization of the calculation method of the gate current Ig can be realized without requiring complicated process in the calculation circuit 62 and the learning circuit 64, so that the calculation circuit 62 and the learning circuit 64 can have a relatively simple configuration.

The gate drive device 61 has the storing unit 65 capable of storing the model parameter K updated by the learning circuit 64. The learning circuit 64 stores the updated model parameter K into the storing unit 65 before power shutdown of the gate drive device 61. The calculation circuit 62 calculates the gate current Ig by using the model parameter K stored in the storing unit 65 at the time of start of the operation of the next time executed after the power shutdown of the gate drive device 61. In such a manner, in the operation of the second and subsequent times, the gate current Ig is calculated by using the model parameter K learned in the operation of the last time from the start time point of the operation. Therefore, the surge voltage Vsrg can be controlled to a target value with high precision stably immediately after the operation start.

(Modification Regarding Updating of K Value)

In the embodiment, the learning circuit 64 writes and stores the updated model parameter K, that is, updates the K value stored in the storing unit 65 before power shutdown of the gate drive device 61. This can be modified as follows.

The learning circuit 64 may store the updated model parameter K into the storing unit 65 after executing the learning process the specified number of times which is one or larger. Concretely, the learning circuit 64 may execute S412 each time S409 and S410 are executed the specified number of times. That is, the processes in FIG. 19 can be changed so that S412 is executed during the loop process.

The learning circuit 64 may store the updated model parameter K into the storing unit 65 in the case where it is before power shutdown of the gate drive device 61 or after execution of the learning process the specified number of times which is one or larger and the difference between the value of the model parameter K updated by the learning circuit 64 and the value of the model parameter K at the time of operation start exceeds a preset allowable value. In such a manner, while suppressing the number of times of writing to the storing unit 65, the stability of the control on the surge voltage Vsrg immediate after start of the operation of the second and subsequent times can be maintained excellently.

Further, the learning circuit 64 may not store the updated model parameter K into the storing unit 65, that is, may not update the K value stored in the storing unit 65. In such a manner, although the stability of the control on the surge voltage Vsrg immediately after start of the operation of the second and subsequent times decreases, the number of times of writing to the storing unit 65 can be suppressed to be lower. Consequently, it is suitable in the case where there is restriction on the number of times of writing to the storing unit 65. In such a case, the gate drive device 61 does not have to have the storing unit 65, and it is sufficient to use, as the K value, a preliminarily fixed value as the initial value.

(Modification Regarding K Value)

In the embodiment, the characteristic that the surge voltage Vsrg depends on the current Id is considered, and calculation, learning process, and the like of the gate current Ig are executed by using the K value for each current Id. Alternatively, the calculation, learning process, and the like of the gate current Ig can be also executed by using one K value. In such a manner, since the dependence on the current Id of the surge voltage Vsrg is ignored, although the stability of control on the surge voltage Vsrg decreases slightly, reduction of the process load, simplification of the configuration, and the like can be achieved with respect to each of the circuits constructing the gate drive device 61.

(Modification Regarding Learning Process)

At the time of executing the learning process, the learning circuit 64 can change the calculation method on the basis of the gate current Ig of this time calculated by the calculation circuit 62 and the detection value of the surge voltage Vsrg of this time detected by the detection circuit 63 and, in addition, the gate current Ig in the past calculated by the calculation circuit 62 and the detection value of the surge voltage Vsrg in the past detected by the detection circuit 63.

Concretely, at the time of executing the learning process, the learning circuit 64 can update the model parameter K on the basis of the learning value obtained by smoothing the learning value Ka derived by performing the filtering process using the learning value Ka of this time output from the computation circuit 73 and the K value read from the register 68 of the calculation circuit 62, that is, the learning value Ka in the past. As the filtering process, for example, the various processes described in the first embodiment can be employed. In such a manner, even in the case where erroneous learning that the learning value Ka becomes an erroneous value due to the influence of noise, temporal abnormality, or the like occurs, a situation such that the surge voltage Vsrg becomes a value deviated from the target value by the influence can be suppressed.

Fifth Embodiment

Hereinafter, a fifth embodiment will be described with reference to FIGS. 20 to 24.

(Main Functions of Gate Drive Device)

Figure 20:
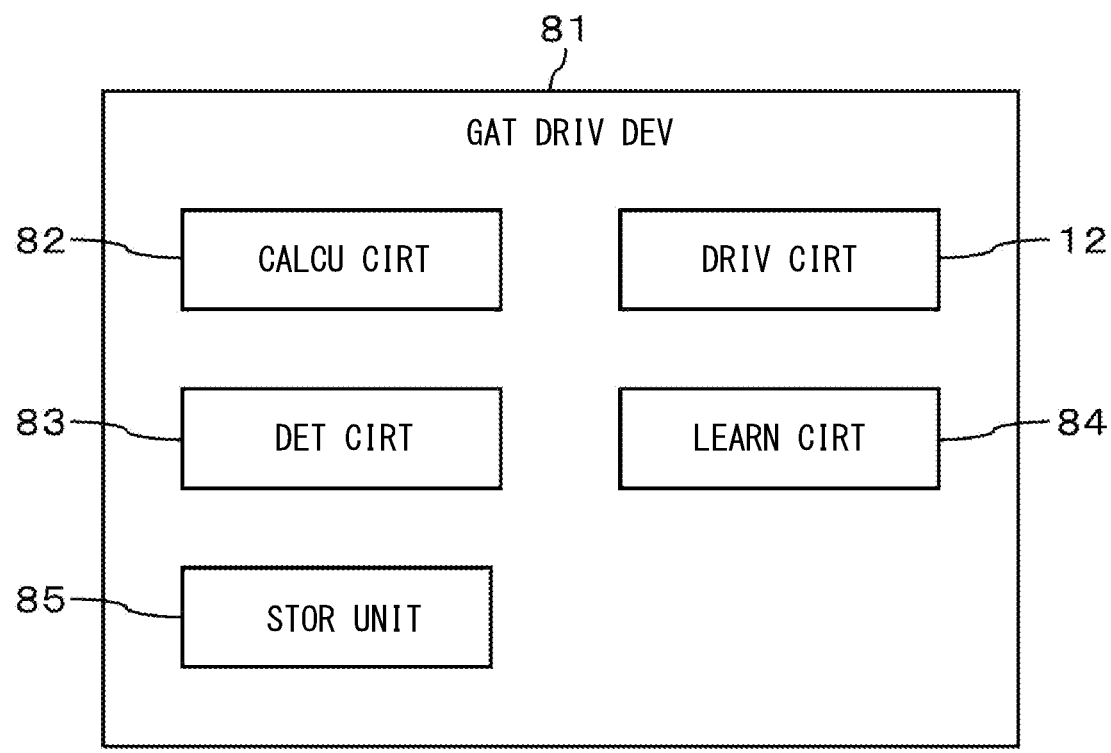
FIG. 20 is a diagram schematically illustrating main functions of a gate drive device according to a fifth embodiment.

Main functions of a gate drive device 81 of the embodiment will be described with reference to FIG. 20. As illustrated in FIG. 20, the gate drive device 81 of the fifth embodiment is different from the gate drive device 61 of the fourth embodiment with respect to the point that a calculation circuit 82 is provided in place of the calculation circuit 62, the point that a detection circuit 83 is provided in place of the detection circuit 63, the point that a learning circuit 84 is provided in place of the learning circuit 64, the point that a storing unit 85 is provided in place of the storing unit 65, and the like.

The calculation circuit 82 preliminarily obtains map data as relational information and calculates the gate current Ig as an operation amount by a target value of the surge voltage Vsrg and the map data. In this case, the map data is a one-dimensional map expressing the relation between the gate current Ig as an operation amount and the surge voltage Vsrg as transient voltage and, concretely, data as illustrated in FIG. 22. In map data illustrated in FIG. 22, the unit of the surge voltage Vsrg is [V]. In the following description, unless otherwise specified, the units of the surge voltage Vsrg is similar to that indicated in FIG. 22, and only values will be described by omitting the units.

The detection circuit 83 detects the surge voltage Vsrg. As the learning process, the learning circuit 84 changes the calculation method of the operation amount by updating the map data on the basis of the operation amount calculated by the calculation circuit 82 and the detection value of the surge voltage Vsrg detected by the detection circuit 83. The storing unit 85 can store the map data updated by the learning circuit 84. The learning circuit 84 stores the updated map data into the storing unit 85 before power shutdown of the gate drive device 81. At the time of start of the operation of the next time executed after the power shutdown of the gate drive device 81, the calculation circuit 82 calculates the operation amount by using the map data stored in the storing unit 85.

(Concrete Configuration of Gate Drive Device)

Figure 21:
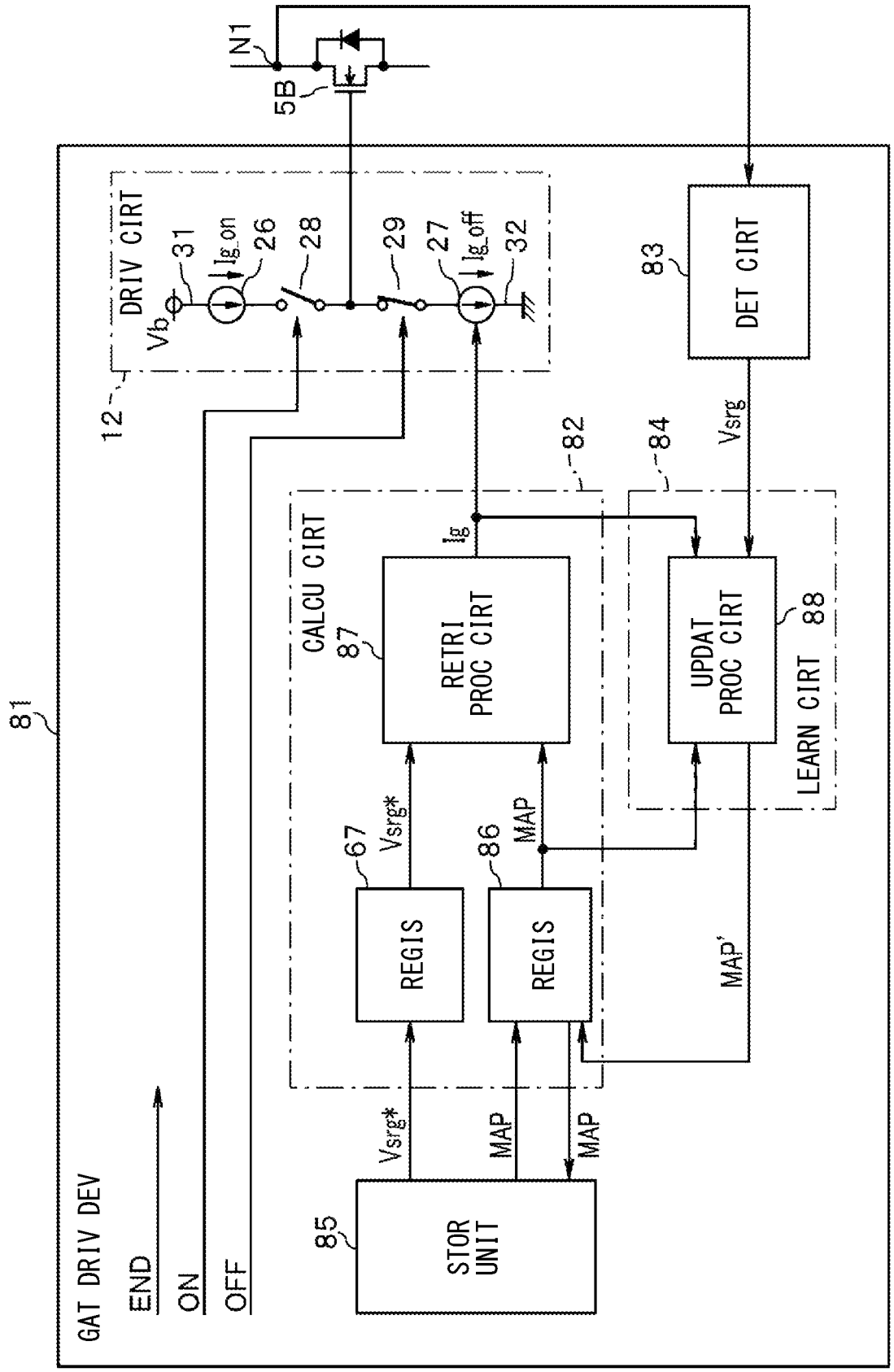
FIG. 21 is a diagram illustrating an example of a concrete configuration of the gate drive device according to the fifth embodiment.

As a concrete configuration of the gate drive device 81 having the functions as described above, for example, a configuration example as illustrated in FIG. 21 can be employed. The gate drive device 81 illustrated in FIG. 21 is different from the gate drive device 61 illustrated in FIG. 18 with respect to the point that the calculation circuit 82 is provided in place of the calculation circuit 62, the point that the detection circuit 83 is provided in place of the detection circuit 63, the point that the learning circuit 84 is provided in place of the learning circuit 64, the point that the storing unit 85 is provided in place of the storing unit 65, and the like.

The storing unit 85 is different from the storing unit 65 with respect to the point that the map data MAP as the above-described one-dimensional map is stored in advance in place of the value of the model parameter K. The map data MAP can be obtained in advance by, for example, making various simulations. When reading of the map data MAP is requested from the calculation circuit 82, the storing unit 85 outputs a signal expressing the map data MAP. The detection circuit 83 detects the surge voltage Vsrg in a manner similar to the detection circuit 63.

The calculation circuit 82 is different from the calculation circuit 62 with respect to the point that a register 86 storing the map data MAP is provided in place of the register 68, the point that a retrieving process circuit (RETRI PROC CIRT) 87 is provided in place of the selector 69 and the computation circuits 70 and 71, and the like. At the time of start of operation, the calculation circuit 82 requests reading of the target surge voltage Vsrg* and the map data MAP to the storing unit 85. In response, the signal Vsrg* and the signal MAP output from the storing unit 85 are input to the calculation circuit 82. The calculation circuit 82 stores the target surge voltage Vsrg* and the map data MAP read from the storing unit 85 into the registers 67 and 86.

The retrieving process circuit 87 reads the target surge voltage Vsrg* stored in the register 67 and the map data MAP stored in the register 86. The retrieving process circuit 87 executes a retrieving process of retrieving the gate current Ig on the map data MAP corresponding to the value of the target surge voltage Vsrg* read from the register 67 and outputting a signal Ig expressing the value of the retrieved gate current Ig. For example, when the value of the target surge voltage Vsrg* read from the register 67 is "360", the retrieving process circuit 87 retrieves the gate current Ig=0.15 on the map data MAP corresponding to the surge voltage Vsrg=360 and outputs a signal Ig expressing "0.15" as the value of the retrieved gate current Ig.

In this case, the map data MAP stored in the register 86 is updated by the operation of the learning circuit 84 which will be described later. Before power shutdown of the gate drive device 81, the register 86 outputs the signal expressing the stored map data MAP to the storing unit 85. By the operation, the map data MAP stored in the storing unit 85 is updated by being overwritten with the map data MAP stored in the register 86.

The learning circuit 84 is different from the learning circuit 64 with respect to the point that an updating process circuit (UPDAT PROC CIRT) 88 is provided in place of the computation circuits 72 and 73. To the learning circuit 84, the signal Vsrg output from the detection circuit 83 and the signal MAP and the signal Ig output from the calculation circuit 82 are input. The updating process circuit 88 executes an updating process of retrieving the gate current Ig on the map data MAP corresponding to the detection value of the surge voltage Vsrg detected by the detection circuit 83, generating updated map data MAP' obtained by changing the value of the retrieved gate current Ig on the map data MAP to the value of the gate current Ig calculated by the calculation circuit 82, and outputting a signal expressing the updated map data MAP'.

For example, in the case where the detection value of the surge voltage Vsrg detected by the detection circuit 83 is "370" and the value of the gate current Ig calculated by the calculation circuit 82 is "0.15", the updating process circuit 88 retrieves the gate current Ig=0.20 on the map data MAP corresponding to the surge voltage Vsrg=370. The updating process circuit 88 generates the updated data MAP' in which the value of the gate current Ig corresponding to the surge voltage Vsrg=370 on the retrieved map data MAP is changed to "0.15" as the value of the gate current Ig calculated by the calculation circuit 82.

The updated map data MAP' is concretely, for example, data as illustrated in FIG. 23. As illustrated in FIG. 23, in the updated map data MAP', the value of the gate current Ig corresponding to the surge voltage Vsrg=370 is changed from "0.20" to "0.15". The updating process circuit 88 outputs a signal expressing the updated map data MAP' generated by such an updating process to the register 86 of the calculation circuit 82. By the operation, the map data MAP stored in the register 86 is updated by being overwritten with the updated map data MAP'.

(Flow of Operations by Gate Drive Device)

Figure 24:
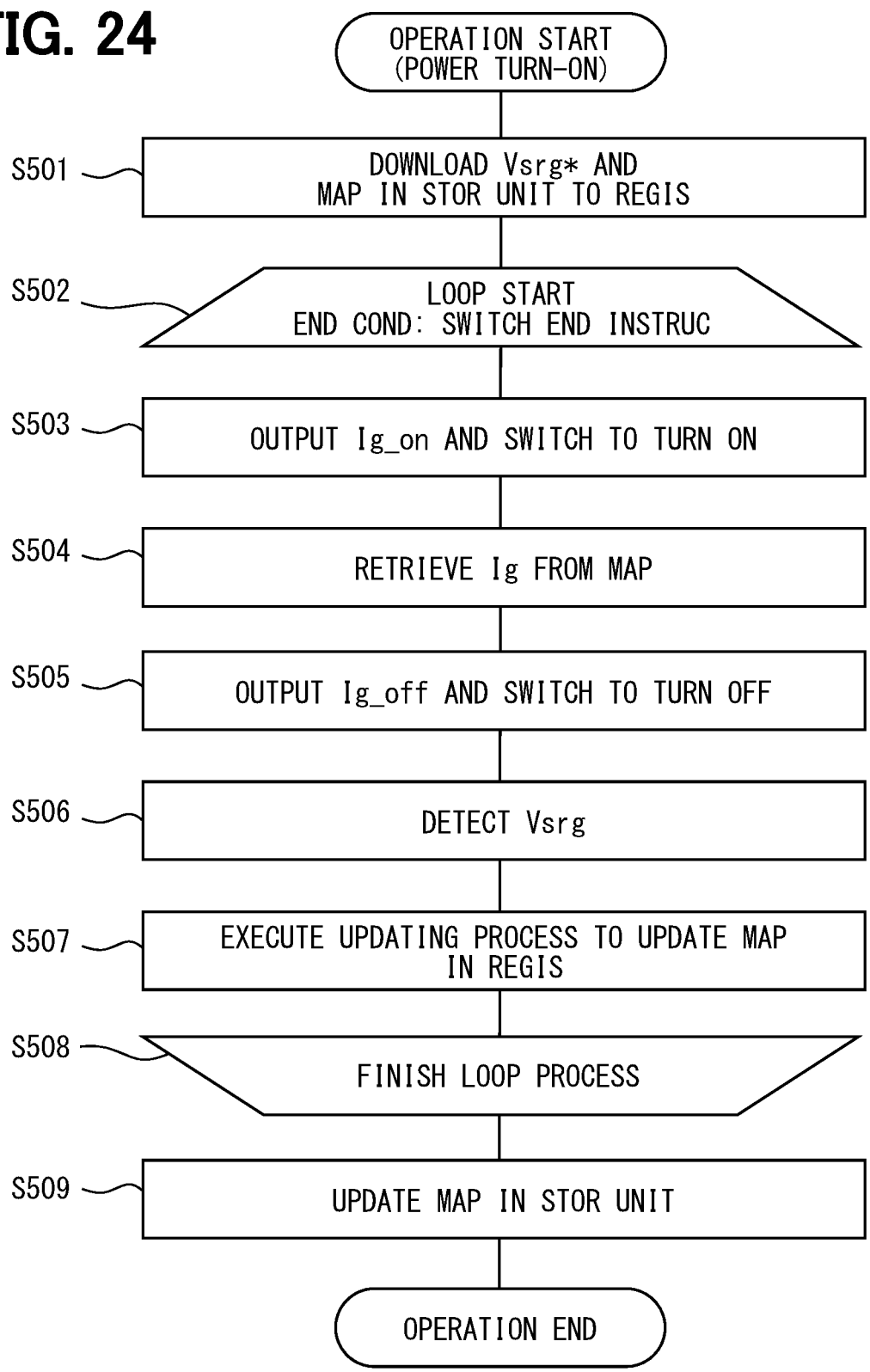
FIG. 24 is a diagram schematically illustrating the flow of operations by the gate drive device according to the fifth embodiment.

Subsequently, the flow of operations by the gate drive device 81 having the above-described configuration will be described with reference to FIG. 24. In the gate drive device 81, processes as illustrated in FIG. 24 are executed during a period since power is turned on until the power is shutdown. In S501 executed first after the operation start, the target surge voltage Vsrg* and the map data MAP are read from the storing unit 85 and stored into the registers 67 and 86 in the calculation circuit 82. Specifically, in S501, the target surge voltage Vsrg* and the map data MAP stored in the storing unit 85 are downloaded to the registers 67 and 86 in the calculation circuit 82.

After execution of S501, a loop start process in S502 is executed. The loop start process in S502 is a process of repeatedly executing the processes from S503 to S507 until the switching end instruction END is given, that is, on an ending condition that the switching end instruction END is given as a loop ending process in S508. In S503, when the turn-on instruction ON is given, the drive circuit 12 outputs the gate current Ig_on by which the semiconductor switching element 5 is switched to turn on. The current value of the gate current Ig_on at this time is a preliminarily determined current value.

In S504, the retrieving process circuit 87 of the calculation circuit 82 executes the above-described retrieving process. Specifically, in S504, the calculation circuit 82 retrieves the gate current Ig from the map data MAP stored in the register 86 by using the target surge voltage Vsrg* stored in the register 67. Alternatively, S504 can be executed before S503. That is, the execution order of S503 and S504 can be changed.

In S505, when the turn-off instruction OFF is given, the drive circuit 12 outputs the gate current Ig_off by which the semiconductor switching element 5 is switched to turn off. The current value of the gate current Ig_off at this time is a value corresponding to the value of the gate current Ig retrieved in S504. In S506, the detection circuit 83 detects the surge voltage Vsrg generated at the time of turn-off.

In S507, the updating process circuit 88 of the learning circuit 84 executes the above-described updating process by which the map data MAP stored in the register 86 of the calculation circuit 82 is updated by being overwritten with the updated map data MAP'. S507 corresponds to the learning process executed by the learning circuit 84. In the gate drive device 81, until the switching end instruction END is given, the processes in S502 to S508 as described above are repeatedly executed.

That is, the loop process of S502 to S508 is repeatedly executed each time the semiconductor switching element 5 is switched. When the switching end instruction END is given, the loop process of S502 to S508 is finished, and the program advances to S509. In S509, the map data MAP stored in storing unit 85 is updated by being overwritten with the map data MAP stored in the register 86 of the calculation circuit 82. After execution of S509, the operation is finished.

Also by the gate drive device 81 of the embodiment described above, an effect similar to that of the fourth embodiment, specifically, an excellent effect that the surge voltage Vsrg at the time of switching of the semiconductor switching element 5, particularly, at the time of turn-off can be controlled to a desired target value with high precision is obtained. In this case, the calculation circuit 82 calculates the value of the gate current Ig by the map data MAP as a one-dimensional map expressing the relation between the gate current Ig and the surge voltage Vsrg.

In this case, the learning circuit 84 changes the calculation method of the gate current Ig by updating the map data MAP on the basis of the value of the gate current Ig calculated by the calculation circuit 82 and the detection value of the surge voltage Vsrg detected by the detection circuit 83. By such an operation, a computation error of the gate current Ig by the calculation circuit 82 is reduced, so that the surge voltage Vsrg can be controlled to a target value with higher precision.

The gate drive device 81 has the storing unit 85 capable of storing the map data MAP updated by the learning circuit 84. The learning circuit 84 stores the updated map data MAP into the storing unit 85 before the power shutdown of the gate drive device 81, and the calculation circuit 82 calculates the gate current Ig by using the map data MAP stored in the storing unit 85 at the time of start of operation of the next time executed after the power shutdown of the gate drive device 81. In such a manner, in the operation of the second and subsequent times, the gate current Ig is calculated by using the map data MAP learned in the operation of last time since the start time point of the operation. Therefore, the surge voltage Vsrg can be controlled to a target value with high precision stably immediately after the operation start.

(Modification Regarding Updating of Map Data)

In the embodiment, the learning circuit 84 writes and stores the updated map data MAP into the storing unit 85, that is, updates the map data MAP stored in the storing unit 85 before power shutdown of the gate drive device 81. This can be modified as follows.

Specifically, after the learning process is executed the specified number of times which is one or larger, the learning circuit 84 may store the updated map data MAP into the storing unit 85. Concretely, the learning circuit 84 may execute S509 each time S507 is executed the specified number of times. That is, the processes illustrated in FIG. 24 can be changed so that S509 is executed during the loop process.

The learning circuit 84 may store the updated map data MAP into the storing unit 85 in the case where it is before power shutdown of the gate drive device 81 or after executing the learning process the specified number of times which is one or larger and the difference between the value of the map data MAP updated by the learning circuit 84 and the value of the map data MAP at the time of start of operation exceeds a preset allowable value. In such a manner, while suppressing the number of times of writing to the storing unit 85, the stability of the control on the surge voltage Vsrg immediately after the start of operation of the second and subsequent times can be maintained excellently.

The value of the map data MAP is the value of the gate current Ig as an operation amount or the value of the surge voltage Vsrg as transient voltage, and whether the above-described difference exceeds the allowable value or not is determined for each of all of values of the gate current Ig in the map data MAP or each of values of the surge voltage Vsrg.

Further, the learning circuit 84 does not have to store the updated map data MAP into the storing unit 85, that is, does not have to update the map data MAP stored in the storing unit 85. In such a manner, although the stability of control of the surge voltage Vsrg immediately after start of the operation of the second and subsequent times decreases, the number of times of writing to the storing unit 85 can be suppressed, so that it is suitable in the case where the number of times of writing to the storing unit 85 is restricted. In such a case, the gate drive device (gate drive circuit) 81 does not have to have the storing unit 85, and it is sufficient to use, as the map data MAP, a value which is fixed in advance as an initial value.

(Modification Regarding Learning Process)

At the time of executing the learning process, the learning circuit 84 can change the calculation method on the basis of the gate current Ig of this time calculated by the calculation circuit 82 and a detection value of the surge voltage Vsrg of this time detected by the detection circuit 83 and, in addition, the gate current Ig in the past calculated by the calculation circuit 82 and a detection value of the surge voltage Vsrg in the past detected by the detection circuit 83. Concretely, at the time of executing the learning process, the learning circuit 84 can update map data by updated map data obtained by smoothing the updated map data MAP' derived by performing the filtering process using the updated map data MAP' of this time output from the updating process circuit 88 and the map data MAP corresponding to the updated map data MAP' in the past stored in the register 86 of the calculation circuit 82.

As the filtering process, for example, the various processes described in the first embodiment can be employed. In such a manner, even in the case where erroneous learning that the value of the updated map data MAP' becomes an erroneous value due to the influence of noise, temporal abnormality, or the like occurs, a situation such that the surge voltage Vsrg becomes a value deviated from the target value due to the influence can be suppressed.

(Modifications Regarding Updating Process)

The updating process of generating the updated map data MAP' by the updating process circuit 88 of the learning circuit 84, that is, the process of updating the map data can be modified in a manner similar to the first and second modifications related to the updating process described in the second embodiment.

Sixth Embodiment

Hereinafter, a sixth embodiment will be described with reference to FIGS. 25 to 28.

(Main Functions of Gate Drive Device)

Figure 25:
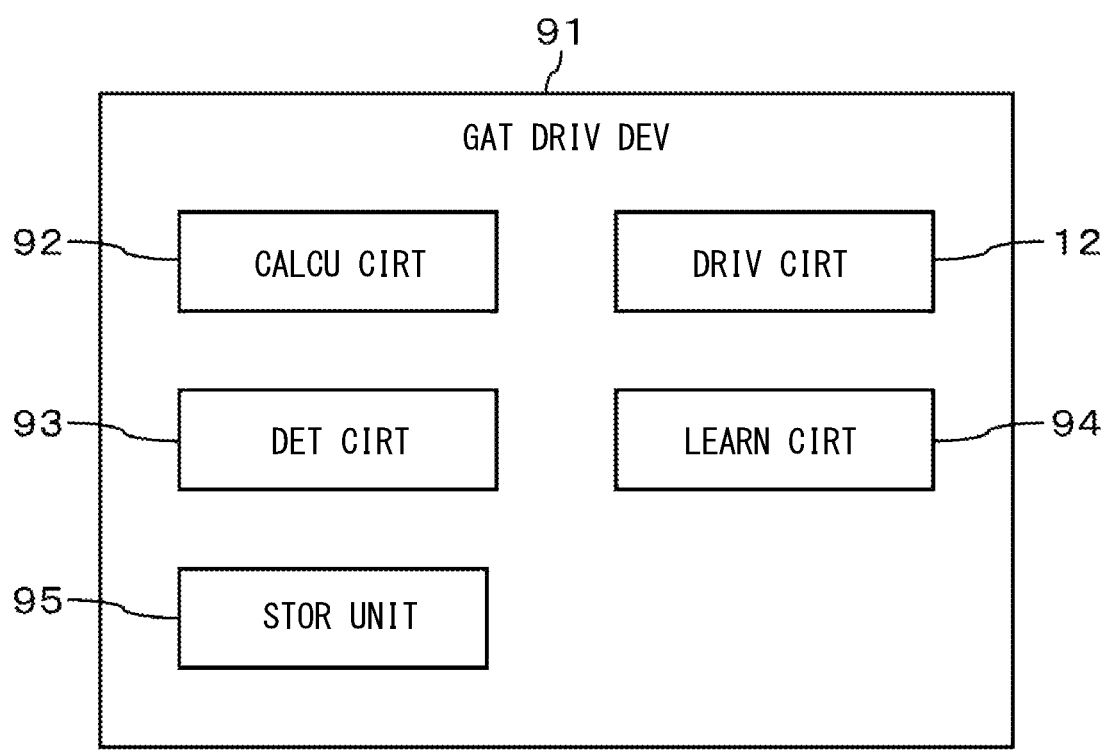
FIG. 25 is a diagram schematically illustrating main functions of a gate drive device according to a sixth embodiment.

Main functions of a gate drive device 91 of the embodiment will be described with reference to FIG. 25. As illustrated in FIG. 25, the gate drive device 91 of the sixth embodiment is different from the gate drive device 81 of the fifth embodiment with respect to the point that a calculation circuit 92 is provided in place of the calculation circuit 82, the point that a detection circuit 93 is provided in place of the detection circuit 83, the point that a learning circuit 94 is provided in place of the learning circuit 84, the point that a storing unit 95 is provided in place of the storing unit 85, and the like.

The detection circuit 93 detects the surge voltage Vsrg and, in addition, the source voltage Va and the current Id. The detection circuit 93 can detect, in place of the source voltage Va, the off voltage Vds_off as a voltage almost equal to the source voltage Va. In this case, it is sufficient to replace the source voltage Va with the off voltage Vds_off in the following description.

The calculation circuit 92 obtains map data as relational information in advance like the calculation circuit 82. In this case, however, the map data is a multidimensional map holding the gate current Ig as an operation amount by combining the voltage ΔVds correlated with the surge voltage Vsrg as transient voltage and the current Id and, concretely, for example, data as illustrated in FIG. 27. In the map data illustrated in FIG. 27, the unit of the voltage ΔVds is "V". In the following description, unless otherwise specified, the unit of the voltage ΔVds is a unit similar to that illustrated in FIG. 27, and only values will be described by omitting the unit.

The calculation circuit 92 calculates the gate current Ig as an operation amount by a target value of the voltage ΔVds corresponding to a target value of the transient voltage, a detection value of the current Id by the detection circuit 83, and the map data. The learning circuit 94 changes, as the learning process, the calculation method of the operation amount by updating the map data on the basis of the operation amount calculated by the calculation circuit 92 and the detection values by the detection circuit 93. The storing unit 95 can store the map data updated by the learning circuit 94. The learning circuit 94 stores the updated map data into the storing unit 95 before power shutdown of the gate drive device 91. At the time of start of the operation of the next time executed after the power shutdown of the gate drive device 91, the calculation circuit 92 calculates the operation amount by using the map data stored in the storing unit 95.

(Concrete Configuration of Gate Drive Device)

Figure 26:
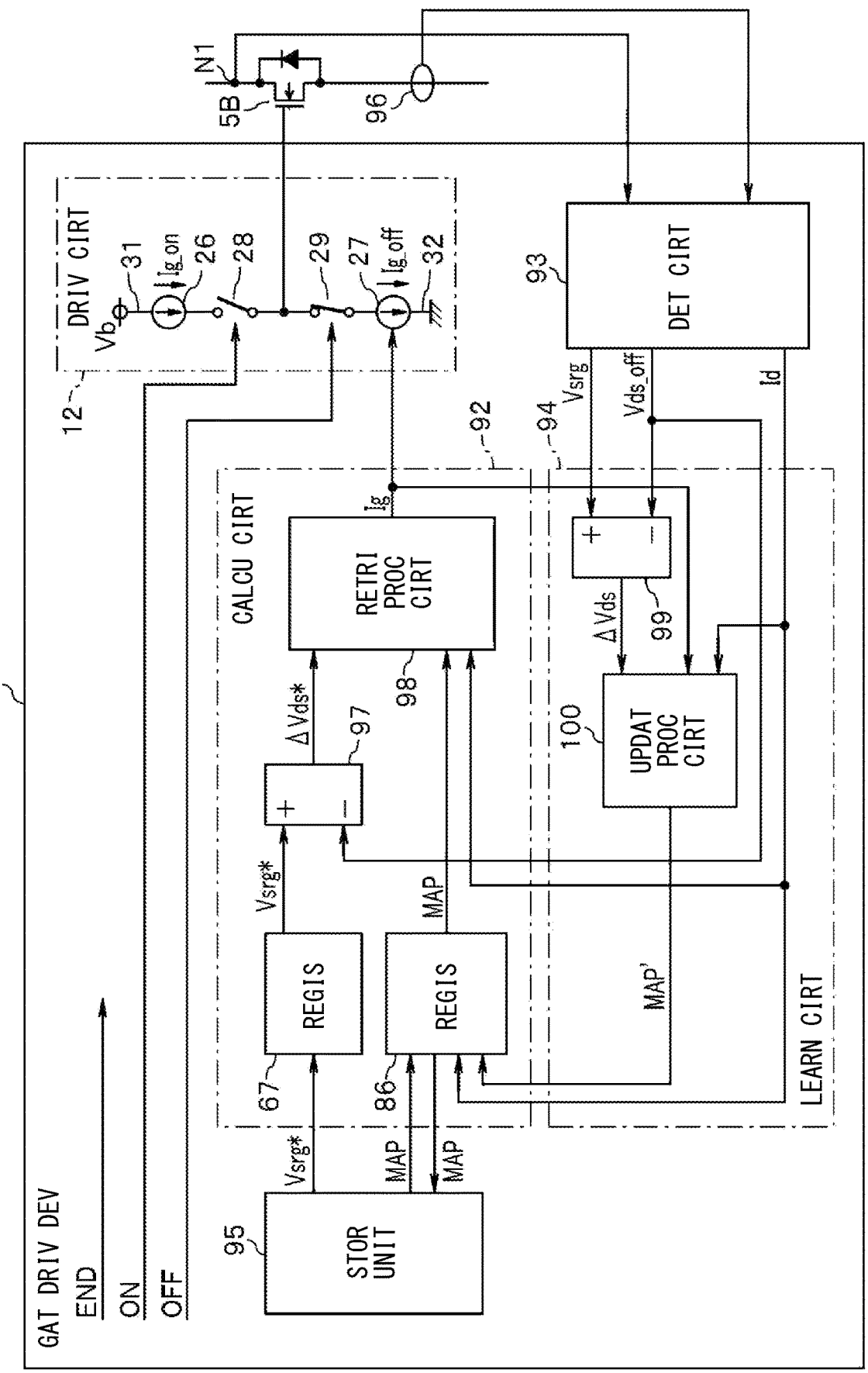
FIG. 26 is a diagram illustrating an example of a concrete configuration of the gate drive device according to the sixth embodiment.

As a concrete configuration of the gate drive device 91 having the functions as described above, for example, a configuration example as illustrated in FIG. 26 can be employed. The gate drive device 91 illustrated in FIG. 26 is different from the gate drive device 81 of the fifth embodiment illustrated in FIG. 21 with respect to the point that the calculation circuit 92 is provided in place of the calculation circuit 82, the point that the detection circuit 93 is provided in place of the detection circuit 53, the point that the learning circuit 94 is provided in place of the learning circuit 84, the point that the storing unit 95 is provided in place of the storing unit 85, and the like.

The detection circuit 93 detects the surge voltage Vsrg and the off voltage Vds_off like the detection circuit 63 illustrated in FIG. 18. The detection circuit 93 detects the current Id on the basis of a current detection signal output from a current sensor 96 provided for a path in which the current Id of the semiconductor switching element 5B flows. The detection circuit 93 outputs a signal expressing a detection value of the surge voltage Vsrg, a signal expressing a detection value of the off voltage Vds_off, and a signal expressing a detection value of the current Id.

The storing unit 95 is different from the storing unit 85 with respect to the point that the stored map data MAP is the above-described two-dimensional map, and the like. The calculation circuit 92 is different from the calculation circuit 82 with respect to the point that a computation circuit 97 is added, the point that a retrieving process circuit 98 is provided in place of the retrieving process circuit 87, and the like. The calculation circuit 92 performs operations almost similar to those of the calculation circuit 82 except for operations executed by the computation circuit 97 and the retrieving process circuit 98.

To the computation circuit 97, a signal Vds_off output from the detection circuit 93 is input. The computation circuit 97 reads the target surge voltage Vsrg* stored in the register 67 and subtracts the detection value of the off voltage Vsd_off expressed by the signal Vds_off from the read target surge voltage Vsrg*. A value obtained as a result of such computation by the computation circuit 97 corresponds to the target value ΔVds* of the above-described voltage ΔVds. The computation circuit 97 outputs a signal expressing the voltage ΔVds*.

The retrieving process circuit 98 reads the map data MAP stored in the register 86. To the retrieving process circuit 98, the signal ΔVds* output from the computation circuit 97 and the signal Id output from the detection circuit 93 are input. The retrieving process circuit 98 performs a retrieving process of retrieving the gate current Ig on the map data MAP corresponding to the value of the target voltage ΔVds* expressed by the signal ΔVds* and corresponding to the detection value of the current Id expressed by the signal Id and outputting the signal Ig expressing the value of the retrieved gate current Ig. For example, when the value of the target voltage ΔVds is "30" and the detection value of the current Id is "20", the retrieving process circuit 98 retrieves the gate current Ig=0.08 on the map data MAP corresponding to the voltage ΔVds=30 and the current Id=20 and outputs a signal Ig expressing "0.08" as the value of the retrieved gate current Ig.

In this case, the map data MAP stored in the register 86 is updated by the operation of the learning circuit 94 which will be described later. Before power shutdown of the gate drive device 91, the register 86 outputs the signal expressing the stored map data MAP to the storing unit 95. By the operation, the map data MAP stored in the storing unit 95 is updated by being overwritten with the map data MAP stored in the register 86.

The learning circuit 94 is different from the learning circuit 84 with respect to the point that a computation circuit 99 is added, the point that an updating process circuit 100 is provided in place of the updating process circuit 88, and the like. To the learning circuit 94, the signal Vsrg, the signal Vds_off, and the signal Id output from the detection circuit 93, and the signal Ig output from the calculation circuit 92 are input. The computation circuit 99 subtracts the detection value of the off voltage Vds_off expressed by the signal Vds_off from the detection value of the surge voltage Vsrg expressed by the signal Vsrg. A value obtained as a result of such computation by the computation circuit 99 corresponds to a detection value of the voltage ΔVds. The computation circuit 99 outputs a signal expressing the detection value of the voltage ΔVds to the updating process circuit 100.

The updating process circuit 100 executes an updating process of retrieving the gate current Ig on the map data MAP corresponding to the detection value of the voltage ΔVds expressed by the signal ΔVds and corresponding to the detection value of the current Id detected by the detection circuit 93, generating updated map data MAP' obtained by changing the value of the retrieved gate current Ig on the map data MAP to the value of the gate current Ig calculated by the calculation circuit 92, and outputting a signal expressing the updated map data MAP'.

For example, in the case where the detection values of the voltage ΔVds and the current Id are "40" and "20", respectively, and the value of the gate current Ig calculated by the calculation circuit 92 is "0.08", the updating process circuit 100 retrieves the gate current Ig=0.09 on the map data MAP corresponding to the voltage ΔVds=40 and the current Id=20. The updating process circuit 100 generates the updated data MAP' in which the value of the retrieved gate current Ig corresponding to the voltage ΔVds=40 and the current Id=20 on the map data MAP is changed to "0.08" as the value of the gate current Ig calculated by the calculation circuit 92. The updating process circuit 100 outputs a signal expressing the updated map data MAP' generated by such an updating process to the register 86 of the calculation circuit 92. By the operation, the map data MAP stored in the register 86 is updated by being overwritten with the updated map data MAP'.

(Flow of Operations by Gate Drive Device)

Figure 28:
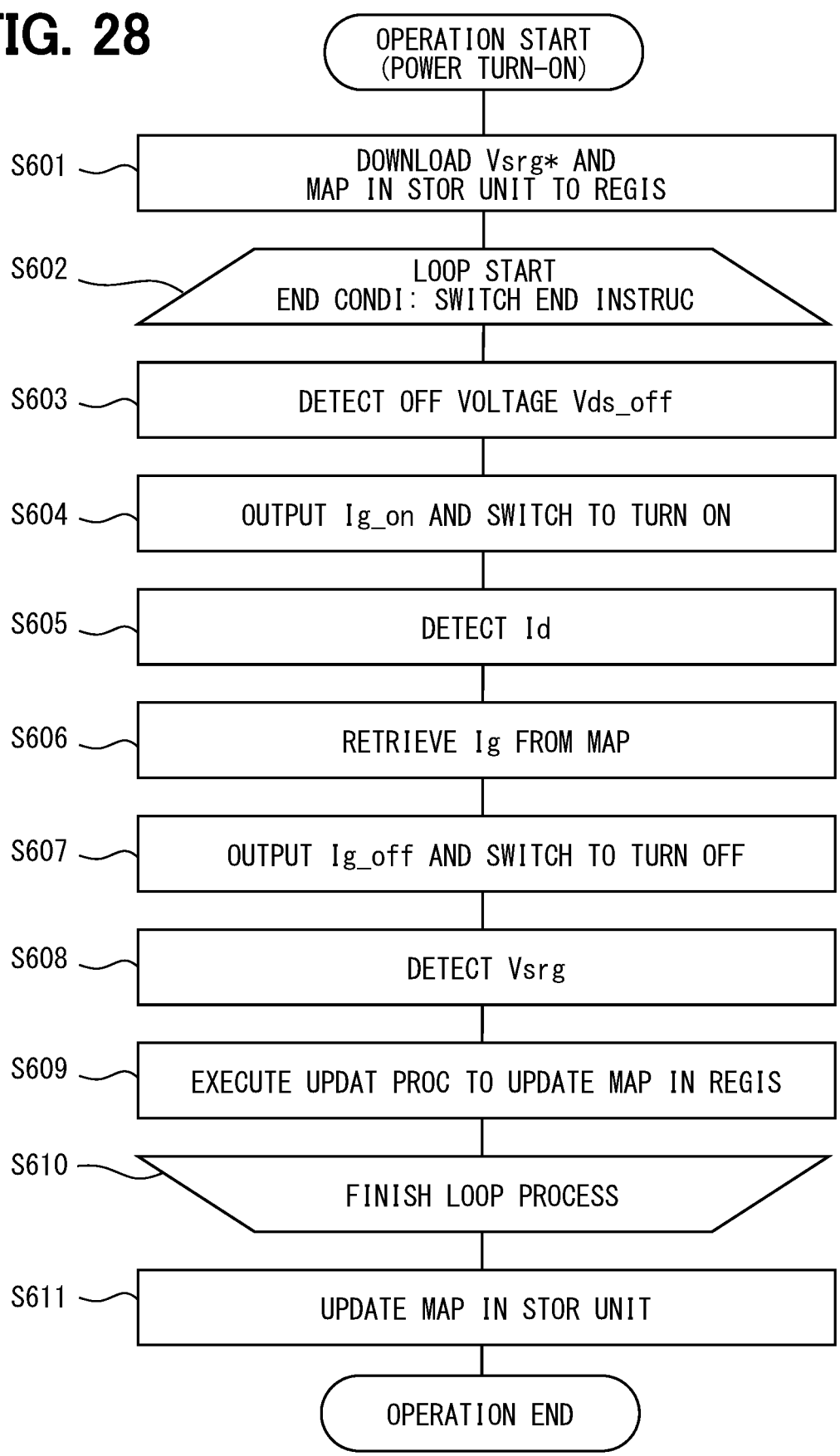
FIG. 28 is a diagram schematically illustrating the flow of operations by the gate drive device according to the sixth embodiment.

Subsequently, the flow of operations by the gate drive device 91 having the above-described configuration will be described with reference to FIG. 28. In the gate drive device 91, processes as illustrated in FIG. 28 are executed during a period since power is turned on until the power is shutdown. In S601 executed first after the operation start, the target surge voltage Vsrg* and the map data MAP are read from the storing unit 95 and stored into the registers 67 and 86 in the calculation circuit 92. Specifically, in S601, the target surge voltage Vsrg* and the map data MAP stored in the storing unit 95 are downloaded to the registers 67 and 86 in the calculation circuit 92.

After execution of S601, a loop start process in S602 is executed. The loop start process in S602 is a process of repeatedly executing the processes from S603 to S609 until the switching end instruction END is given, that is, on ending condition that the switching end instruction END is given as a loop ending process in S610. In S603, the semiconductor switching element 5 is in the off state and, in such a state, the detection circuit 93 detects the off voltage Vds_off.

In S604, when the turn-on instruction ON is given, the drive circuit 12 outputs the gate current Ig_on by which the semiconductor switching element 5 is switched to turn on. The current value of the gate current Ig_on at this time is a preliminarily determined current value. In S605, the semiconductor switching element 5 is in the on state and, in such a state, the detection circuit 93 detects the current Id.

In S606, the retrieving process circuit 98 of the calculation circuit 92 executes the above-described retrieving process. Specifically, in S606, the calculation circuit 92 retrieves the gate current Ig from the map data MAP stored in the register 86 by using the target surge voltage Vsrg* and the detection value of the current Id detected in S605. In S607, when the turn-off instruction OFF is given, the drive circuit 12 outputs the gate current Ig_off by which the semiconductor switching element 5 is switched to turn off. The current value of the gate current Ig_off at this time is a value corresponding to the value of the gate current Ig retrieved in S604.

In S608, the detection circuit 93 detects the surge voltage Vsrg generated at the time of turn-off. In S608, when the computation is executed by the computation circuit 99 of the learning circuit 94, the voltage ΔVds is detected. In S608, the detection circuit 93 may detect, in addition to the surge voltage Vsrg, the off voltage Vds_off.

In S609, the updating process circuit 100 of the learning circuit 94 executes the above-described updating process by which the map data MAP stored in the register 86 of the calculation circuit 92 is updated by being overwritten with the updated map data MAP'. S609 corresponds to the learning process executed by the learning circuit 94. In the gate drive device 91, until the switching end instruction END is given, the processes in S602 to S610 as described above are repeatedly executed.

That is, the loop process of S602 to S610 is repeatedly executed each time the semiconductor switching element 5 is switched. When the switching end instruction END is given, the loop process of S602 to S610 is finished, and the program advances to S611.

In S611, the map data MAP stored in storing unit 95 is updated by being overwritten with the map data MAP stored in the register 86 of the calculation circuit 92. After execution of S611, the operation is finished.

Also by the gate drive device 91 of the embodiment described above, an effect similar to that of the fourth embodiment, specifically, an excellent effect that the surge voltage Vsrg at the time of switching of the semiconductor switching element 5, particularly, at the time of turn-off can be controlled to a desired target value with high precision is obtained. By the gate drive device 91 of the embodiment, the following effect is also obtained. There is the possibility that the surge voltage Vsrg at the time of turn-off which actually occurs in the semiconductor switching element 5 as a drive target of the gate drive device 91 changes in dependence upon the current Id of the semiconductor switching element 5 and the like.

In this case, the calculation circuit 92 calculates the value of the gate current Ig by the map data MAP as a two-dimensional map which holds the gate current Ig by combining the voltage ΔVds correlated with the surge voltage Vsrg and the current Id. In this case, the learning circuit 94 changes the calculation method of the gate current Ig by updating the map data MAP on the basis of the value of the gate current Ig calculated by the calculation circuit 92 and the detection values of the surge voltage Vsrg, the off voltage Vds_off, and the current Id detected by the detection circuit 93. In such a manner, the computation error of the gate current Ig by the calculation circuit 92 due to the dependence of the current Id of the surge voltage Vsrg is reduced, so that the surge voltage Vsrg can be controlled to a target value with higher precision.

The gate drive device 91 has the storing unit 95 capable of storing the map data MAP updated by the learning circuit 94. The learning circuit 94 stores the updated map data MAP into the storing unit 95 before power shutdown of the gate drive device 91. The calculation circuit 92 calculates the gate current Ig by using the map data MAP stored in the storing unit 95 at the time of start of the operation of the next time executed after the power shutdown of the gate drive device 91. In such a manner, in the operation of the second and subsequent times, the gate current Ig is calculated by using the map data MAP learned in the operation of last time from the start time point of the operation. Therefore, the surge voltage Vsrg can be controlled to a target value with high precision stably immediately after the operation start.

(Modification Regarding Map Data)

There is the possibility that the surge voltage Vsrg at the time of turn-off which is actually generated in the semiconductor switching element 5 as a drive target of the gate drive device 91 changes in dependence upon not only the current Id of the semiconductor switching element 5 but also the temperature of the semiconductor switching element 5, the temperature of the gate drive device 51, the source voltage Va, and the like.

Consequently, the map data MAP may be a multidimensional map holding the gate current Ig as an operation amount by combining the surge voltage Vsrg as transient voltage or the voltage ΔVds correlated with the surge voltage Vsrg and at least one of physical quantities of the temperature of the semiconductor switching element 5, the temperature of the gate drive device 91, the source voltage Va, and the current Id. In this case, the detection circuit 93 has to have a configuration of detecting at least one of the physical quantities of the temperature of the semiconductor switching element 5, the temperature of the gate drive device 91, the source voltage Va, and the current Id.

In this case, the calculation circuit 92 calculates the gate current Ig by the target value Vsrg* of the surge voltage Vsrg, the detection value of the physical amount by the detection circuit 93, and the map data MAP. By such an operation, a computation error of the gate current Ig due to the physical quantities such as the temperature of the semiconductor switching element 5, the temperature of the gate drive device 91, the source voltage Va, and the current Id, that is, various disturbance factors is reduced, so that the surge voltage Vsrg can be controlled to a target value with higher precision.

(Modification Regarding Updating of Map Data)

In the embodiment, the learning circuit 94 writes and stores the updated map data MAP into the storing unit 85, that is, updates the map data MAP stored in the storing unit 95 before power shutdown of the gate drive device 91. This can be modified as follows.

Specifically, after the learning process is executed the specified number of times which is one or larger, the learning circuit 94 may store the updated map data MAP into the storing unit 95. Concretely, the learning circuit 94 may execute S611 each time S609 is executed the specified number of times. That is, the processes illustrated in FIG. 28 can be changed so that S611 is executed during the loop process.

The learning circuit 94 may store the updated map data MAP into the storing unit 95 in the case where it is before power shutdown of the gate drive device 91 or after executing the learning process the specified number of times which is one or larger and the difference between the value of the map data MAP updated by the learning circuit 94 and the value of the map data MAP at the time of start of operation exceeds a preset allowable value.

Concretely, the learning circuit 94 may execute, after the loop process is finished, a process similar to S209 in the processes of the second embodiment illustrated in FIG. 10 and, after that, execute S611. That is, the processes illustrated in FIG. 28 can be changed so as to add a process similar to S209 between S610 and S611. In such a manner, while suppressing the number of times of writing to the storing unit 95, the stability of the control on the surge voltage Vsrg immediately after the start of operation of the second and subsequent times can be maintained excellently.

Further, the learning circuit 94 does not have to store the updated map data MAP into the storing unit 95, that is, does not have to update the map data MAP stored in the storing unit 95. In such a manner, although the stability of control of the surge voltage Vsrg immediately after start of the operation of the second and subsequent times decreases, the number of times of writing to the storing unit 95 can be suppressed, so that it is suitable in the case where the number of times of writing to the storing unit 95 is restricted. In such a case, the gate drive circuit 91 does not have to have the storing unit 95, and it is sufficient to use, as the map data MAP, a value which is fixed in advance as an initial value.

(Modification Regarding Learning Process)

At the time of executing the learning process, the learning circuit 94 can change the calculation method on the basis of the gate current Ig of this time calculated by the calculation circuit 92 and detection values of this time detected by the detection circuit 93 and, in addition, the gate current Ig in the past calculated by the calculation circuit 92 and detection values in the past detected by the detection circuit 93. Concretely, at the time of executing the learning process, the learning circuit 94 can update map data by updated map data obtained by smoothing the updated map data MAP' derived by performing the filtering process using the updated map data MAP' of this time output from the updating process circuit 100 and the map data MAP corresponding to the updated map data MAP' in the past stored in the register 86 of the calculation circuit 92.

As the filtering process, for example, the various processes described in the first embodiment can be employed. In such a manner, even in the case where erroneous learning that the value of the updated map data MAP' becomes an erroneous value due to the influence of noise, temporal abnormality, or the like occurs, a situation such that the surge voltage Vsrg becomes a value deviated from the target value due to the influence can be suppressed.

(Modifications Regarding Updating Process)

The updating process of generating the updated map data MAP' by the updating process circuit 100 of the learning circuit 94, that is, the process of updating the map data can be modified in a manner similar to the first and second modifications related to the updating process described in the second embodiment.

Seventh Embodiment

Figure 29:
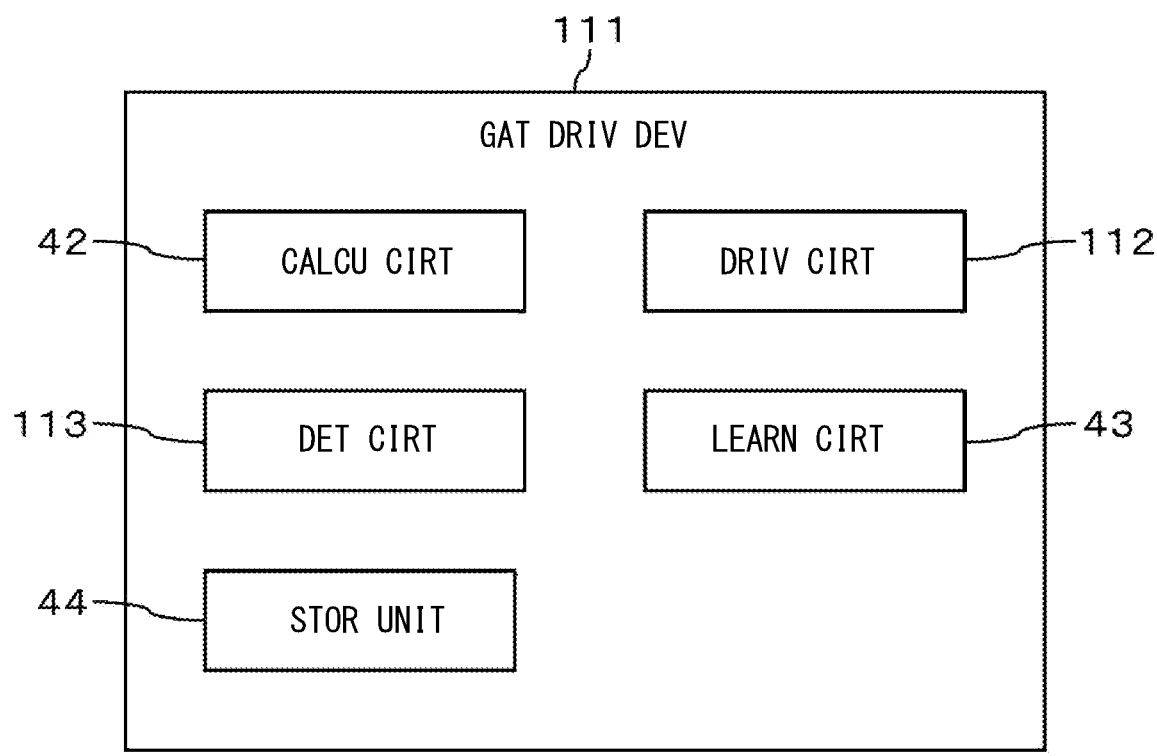
FIG. 29 is a diagram schematically illustrating main functions of a gate drive device according to a seventh embodiment.

Hereinafter, a seventh embodiment will be described with reference to FIGS. 29 to 31.

(Main Functions of Gate Drive Device)

Main functions of a gate drive device 111 of the embodiment will be described with reference to FIG. 29. As illustrated in FIG. 29, the gate drive device 111 of the embodiment is different from the gate drive device 41 of the second embodiment with respect to the point that a drive circuit 112 is provided in place of the drive circuit 12, the point that a detection circuit 113 is provided in place of the detection circuit 53, and the like. The transient voltage as a control target of the gate drive device 111 of the embodiment is the change rate dV/dt of the semiconductor switching element 5 of the opposed arm. Like the drive circuit 12, the drive circuit 112 drives the gate of the semiconductor switching element 5 on the basis of the operation amount calculated by the calculation circuit 11. The detection circuit 113 detects the change rate dV/dt of the semiconductor switching element 5 of the opposed arm.

(Concrete Configuration of Gate Drive Device)

Figure 30:
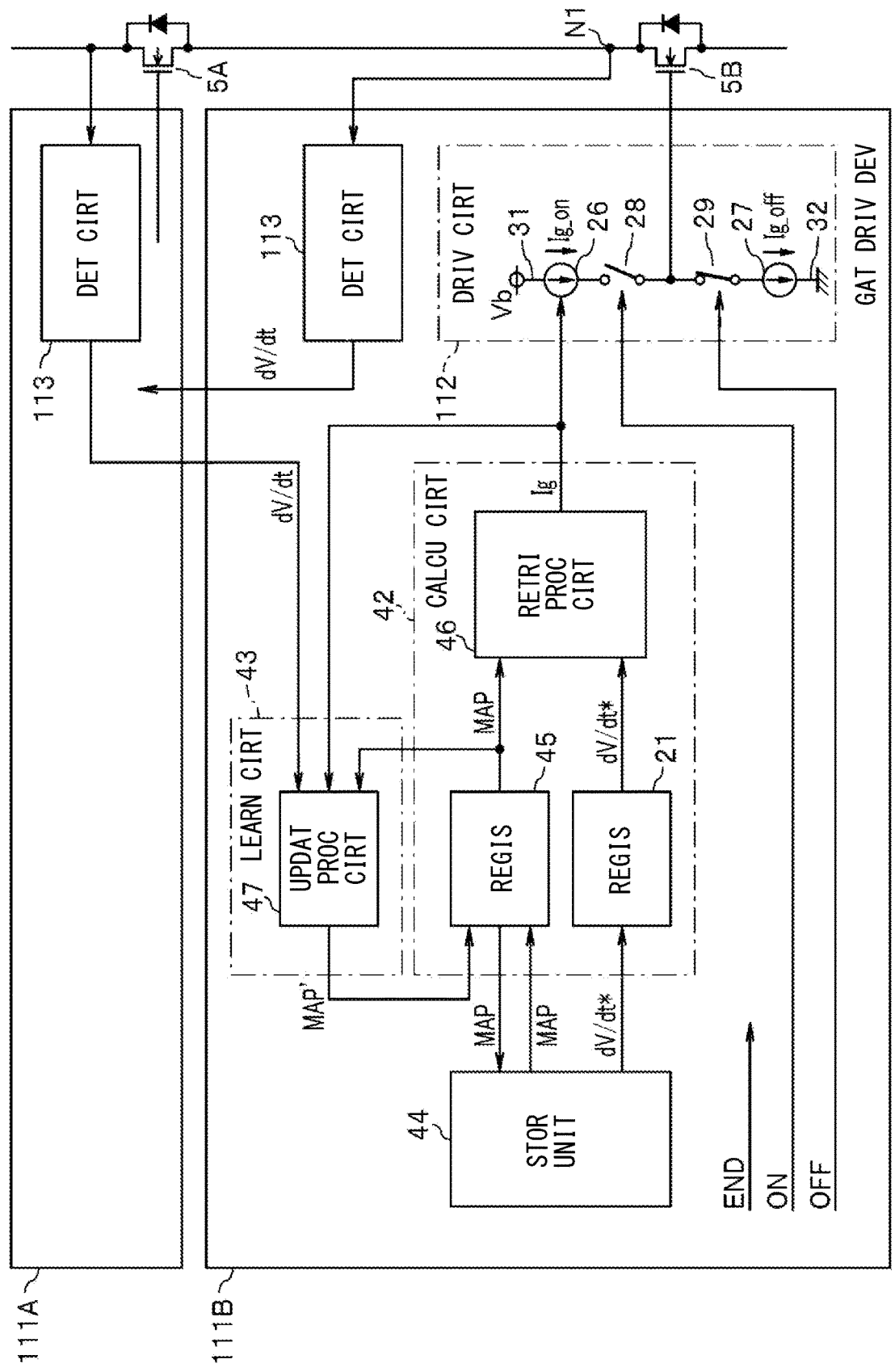
FIG. 30 is a diagram illustrating an example of a concrete configuration of the gate drive device according to the seventh embodiment.
Figure 31:
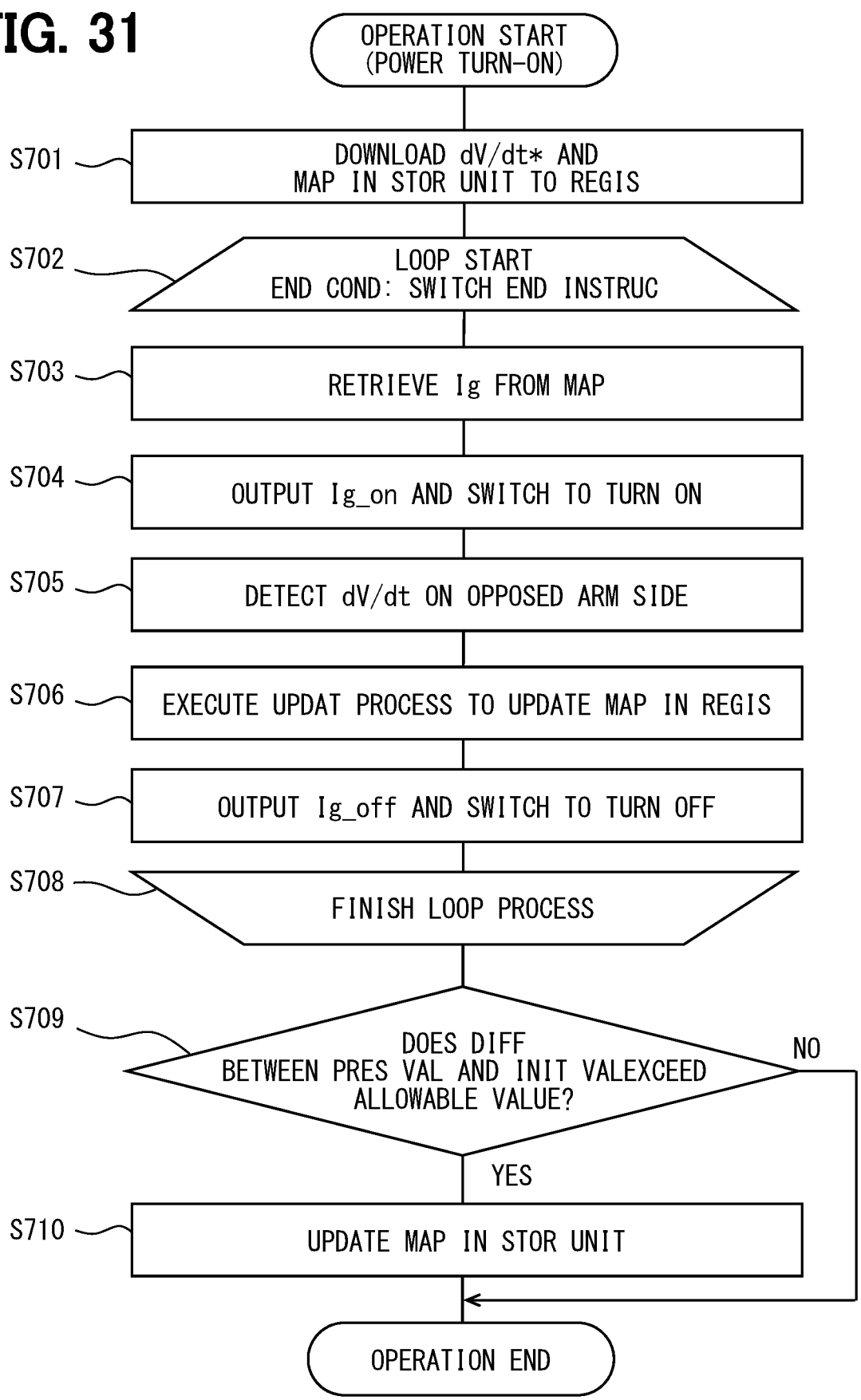
FIG. 31 is a diagram schematically illustrating the flow of operations by the gate drive device according to the seventh embodiment.

As a concrete configuration of the gate drive device 111 having the functions as described above, for example, a configuration example as illustrated in FIG. 30 can be employed. The gate drive device 111 illustrated in FIG. 30 is different from the gate drive device 41 illustrated in FIG. 7 with respect to the point that the drive circuit 112 is provided in place of the drive circuit 12, the point that the detection circuit 113 is provided in place of the detection circuit 53, and the like.

The detection circuit 113 detects the change rate dV/dt of the voltage Vds of the semiconductor switching element 5 on the opposed arm side, and outputs a signal expressing the detection value. The drive circuit 112 is different from the drive circuit 12 with respect to the following point. In this case, the current source 26 has a configuration capable of changing its current value on the basis of the signal Ig output from the calculation circuit 42. In this case, as the configuration on the turn-off side in the drive circuit 112, a resistor having a certain resistance value may be provided in place of the current source 27. That is, the drive circuit 112 does not have to have the configuration of constant current drive with respect to the turn-off side.

(Flow of Operations by Gate Drive Device)

Subsequently, the flow of operations by the gate drive device 111 with the above-described configuration will be described with reference to FIG. 31. In the gate drive device 111, during a period since the power is turned on until the power is shutdown, processes as illustrated in FIG. 31 are executed. In S701 executed first after the operation start, the target change rate dV/dt* and the map data MAP are read from the storing unit 44 and stored in the registers 21 and 45 in the calculation circuit 42. That is, in S701, the target change rate dV/dt* and the map data MAP stored in the storing unit 44 are downloaded in the registers 21 and 45 in the calculation circuit 42.

After execution of S701, a loop start process in S702 is executed. The loop start process in S702 is a process of repeatedly executing the processes from S703 to S707 until the switching end instruction END is given, that is, on ending condition that the switching end instruction END is given as a loop ending process in S708.

In S703, the retrieving process circuit 46 in the calculation circuit 42 executes the above-described retrieving process. Specifically, in S703, the calculation circuit 42 retrieves the gate current Ig from the map data MAP stored in the register 45 by using the target change rate dV/dt* stored in the register 21. In S704, when the turn-on instruction ON is given, the drive circuit 112 outputs the gate current Ig_on by which the semiconductor switching element 5 is switched to turn on. The current value of the gate current Ig_off at this time is a value corresponding to the value of the gate current Ig retrieved in S703.

In S705, the detection circuit 113 detects the change rate dV/dt of the semiconductor switching element 5 on the opposed arm side at the time of turn-on. In S706, the updating process circuit 47 of the learning circuit 43 executes the above-described updating process, by which the map data MAP stored in the register 45 in the calculation circuit 42 is updated by being overwritten by the updated map data MAP'. S706 corresponds to the learning process executed by the learning circuit 43.

In S707, when the turn-off instruction OFF is given, the drive circuit 112 outputs the gate current Ig_off, thereby switching the semiconductor switching element 5 to turn on. The current value of the gate current Ig_on at this time is a preliminarily determined current value. In the gate drive device 111, until the switching end instruction END is given, the processes in S702 to S708 as described above are repeatedly executed.

The loop process of S702 to S708 is repeatedly executed each time the semiconductor switching element 5 is switched. When the switching end instruction END is given, the loop process of S702 to S708 is finished, and the program advances to S709. In S709, whether or not the difference between the present value as the value of the map data MAP stored in the register 45 and the value of the map data MAP stored in the storing unit 44, that is, the initial value as the value of the map data MAP at the time of start of operation exceeds a preset allowable value is determined. In this case, the value of the map data MAP is the value of the gate current Ig as an operation amount, and such determination is performed for each of the values of all of the gate currents Ig in the map data MAP.

In the case where the difference between the present value and the initial value is equal to or less than the allowable value, "NO" is determined in S709, and the operation is finished without executing S710. On the other hand, in the case where the difference between the present value and the initial value exceeds the allowable value, "YES" is determined in S709, and the program advances to S710. In S710, the map data MAP stored in the storing unit 44 is updated by being overwritten with the map data MAP stored in the register 45 of the calculation circuit 42. After execution of S710, the operation is finished.

By the gate drive device 111 of the embodiment described above, by execution of the learning process by the learning circuit 43, the calculation method used for calculating the gate current Ig as an operation amount for operating the gate drive speed at the time of turn-on of the semiconductor switching element 5 by the calculation circuit 42 is optimized so as to be according to the change rate dV/dt which actually occurs in the semiconductor switching element 5 on the opposed arm side at the time of turn-on of the semiconductor switching element 5 on the own arm side.

As described above, according to the embodiment, the calculation method is optimized according to variation among products. Consequently, even there is individual variation in the gate drive device 111 and the semiconductor switching element 5, the gate drive speed of the semiconductor switching element 5 can be controlled to desired speed and, moreover, the change rate dV/dt of the semiconductor switching element 5 on the opposed arm side at the time of turn-on can be controlled to a desired target value. As described above, according to the embodiment, an effect similar to that of the second embodiment can be obtained except for the point that the transient voltage as the control target is the change rate dV/dt of the semiconductor switching element 5 of the opposed arm.

Other Embodiments

The present disclosure is not limited to each of the embodiments which are described above and illustrated in the drawings and can be arbitrarily modified, combined, or expanded without departing from the gist. The numerical values and the like indicated in the foregoing embodiments are examples, and the present invention is not limited to them.

The drive target of the gate drive device in each of the foregoing embodiments is not limited to an N-channel-type MOSFET but may be various semiconductor switching elements such as a P-channel-type MOSFET and IGBT.

Figure 32:
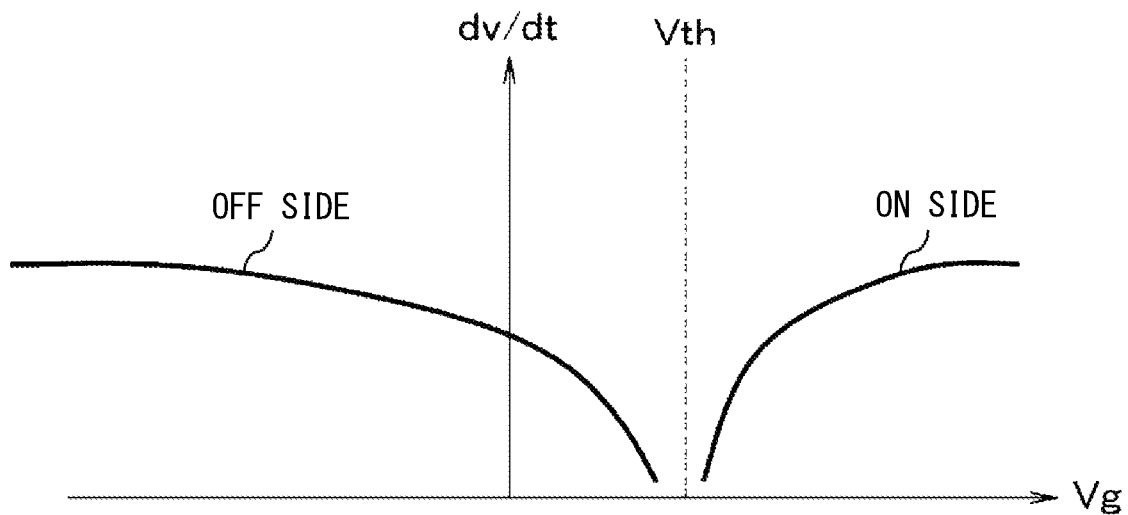
FIG. 32 is a diagram schematically illustrating the relation of a change rate of drain-source voltage and gate voltage.
Figure 33:
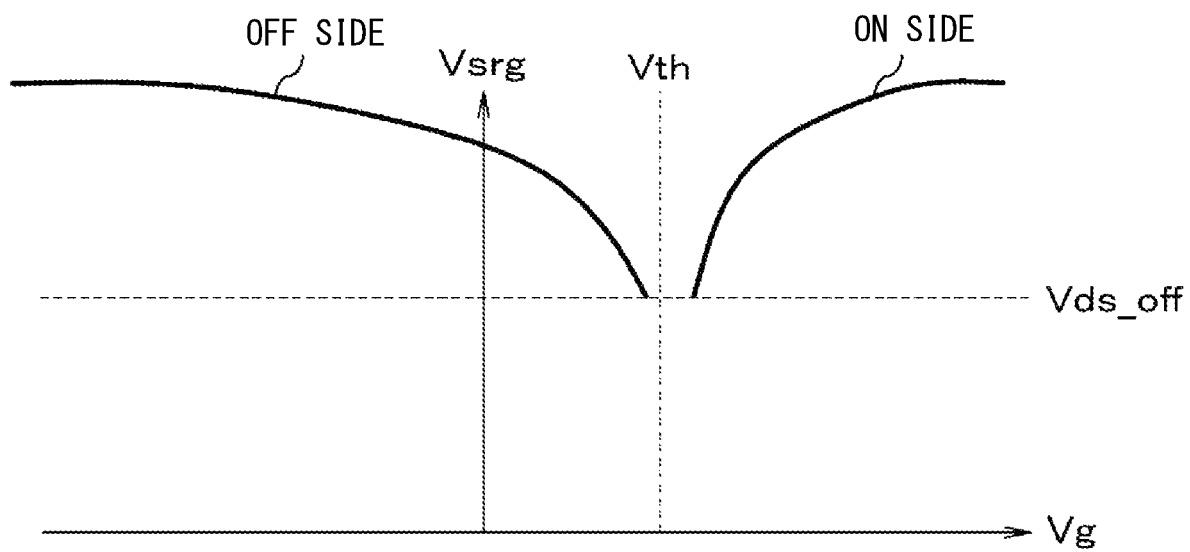
FIG. 33 is a diagram schematically illustrating the relation between surge voltage and gate voltage.

The operation amount for operating the gate drive speed of the semiconductor switching element 5 is not limited to the gate current Ig but may be any of the gate voltage Vg and gate resistance Rg of the semiconductor switching element 5. The change rate dV/dt and the gate voltage Vg have, for example, the relation as illustrated in FIG. 32, and the surge voltage Vsrg and the gate voltage Vg have, for example, the relation as illustrated in FIG. 33. Therefore, in the case of using the gate voltage Vg as the operation amount, it is sufficient to set a model formula and an inverse model formula which become optimum in consideration of the relations as illustrated in FIGS. 32 and 33.

In FIGS. 32 and 33, the gate threshold value voltage of the semiconductor switching element 5 is expressed as Vth. In FIGS. 32 and 33, the ON side indicates the characteristic corresponding to the positive gate voltage Vg to turn on the gate of the semiconductor switching element 5, and the OFF side indicates the characteristic corresponding to the negative gate voltage Vg to turn off the gate of the semiconductor switching element 5.

Figure 34:
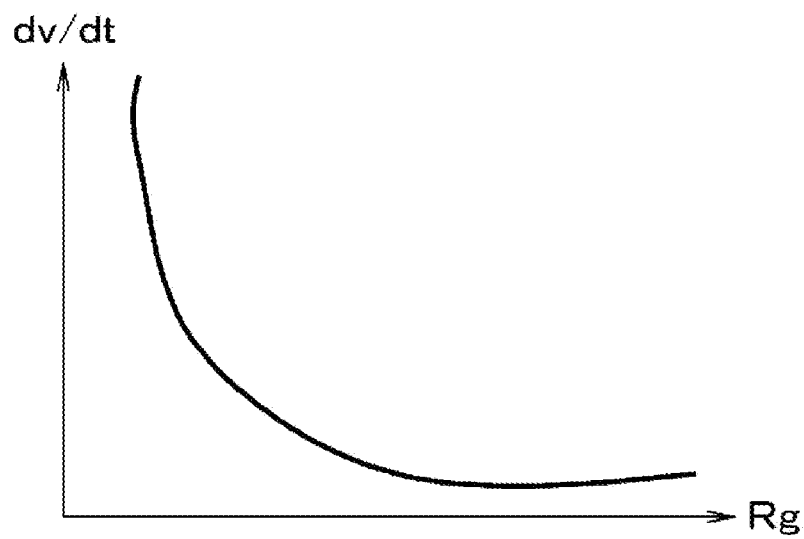
FIG. 34 is a diagram schematically illustrating the relation between a change rate of drain-source voltage and gate resistance.
Figure 35:
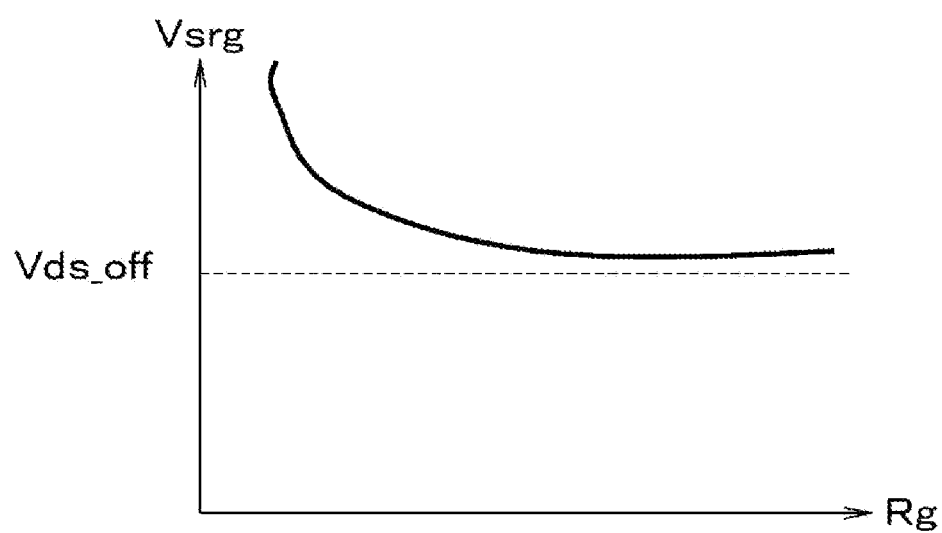
FIG. 35 is a diagram schematically illustrating the relation between surge voltage and gate resistance.

The change rate dV/dt and the gate resistance Rg have, for example, the relation as illustrated in FIG. 34, and the surge voltage Vsrg and the gate resistance Rg have, for example, the relation as illustrated in FIG. 35. In the case of using the gate resistance Rg as the operation amount, it is sufficient to set a model formula and an inverse model formula which become optimum in consideration of the relations as illustrated in FIGS. 34 and 35.

Here, the flowchart described in this application or the process of the flowchart is composed of a plurality of sections (or referred to as steps), and each section is expressed as, for example, S101. Each section may be divided into several subsections, while several sections may be combined into one section. Furthermore, each section thus configured may be referred to as a device, module, or means.

The calculation circuit, the learning circuit, and the storing unit included in the gate drive device described in each of the above embodiments may be composed of a general-purpose CPU (Central Processing Unit), a volatile memory such as RAM, a non-volatile memory such as ROM, flash memory, or hard disk, various interfaces, and an internal bus connecting them. Then, by executing software on these hardware, the gate drive device can be configured to execute the functions of one or more specific functional blocks illustrated in, for example, FIG. 3. In addition, each of the detection circuit and the drive circuit included in the gate drive device described in each of the above embodiments may be composed of one or more analog circuits in an integrated circuit to execute the functions.

Although the embodiments have been described in detail above, these are merely examples and do not limit the scope of present disclosure. The techniques described in the present disclosure include various modifications and modifications of the specific examples illustrated above. The technical elements described in the present disclosure or the drawings exhibit technical usefulness alone or in various combinations, and are not limited to the combinations described in the present disclosure at the time of filing. In addition, the techniques illustrated in the present specification or drawings achieve multiple objectives at the same time, and achieving one of the objectives itself has technical usefulness.

What is claimed is:

1. A gate drive device configured to drive a gate of a semiconductor switching element and control a transient voltage corresponding to a voltage of a main terminal of the semiconductor switching element to a target value of the transient voltage at a time of switching the semiconductor switching element, the gate drive device comprising:
    a calculation circuit configured to execute a predetermined calculation mode adopting the target value of the transient voltage to calculate an operation amount for operating a gate drive speed of the semiconductor switching element;
    a drive circuit configured to drive the gate of the semiconductor switching element according to the operation amount calculated by the calculation circuit;
    a detection circuit configured to detect the transient voltage; and
    a learning circuit configured to execute learning processing to change the predetermined calculation mode based on
        the operation amount calculated by the calculation circuit, and
        a detection value of the transient voltage detected by the detection circuit.

2. The gate drive device according to claim 1,
wherein the calculation circuit is further configured to:
    preliminarily acquire
        the target value of the transient voltage, and
        relational information representing relation between the operation amount and the transient voltage; and
    calculate the operation amount based on the target value of the transient voltage and the relational information preliminarily acquired by the calculation circuit.

3. The gate drive device according to claim 2,
wherein the calculation circuit is further configured to:
    preliminarily acquire a model parameter as the relational information; and
    calculate the operation amount based on a model formula adopting the target value of the transient voltage and the model parameter, and
wherein the learning circuit is further configured to:
    calculate a learning value as a value corresponding to the model parameter based on
        the operation amount calculated by the calculation circuit, and
        the detection value of the transient voltage detected by the detection circuit; and
    update the model parameter based on the learning value calculated by the learning circuit.

4. The gate drive device according to claim 2,
wherein the calculation circuit is further configured to:
    preliminarily acquire map data that is a map representing the relation between the operation amount and the transient voltage as the relational information, and
    calculate the operation amount based on the target value of the transient voltage and the map data, and
wherein the learning circuit is further configured to update the map data based on
    the operation amount calculated by the calculation circuit, and
    the detection value of the transient voltage detected by the detection circuit.

5. The gate drive device according to claim 4,
wherein the learning circuit is further configured to:
    retrieve the operation amount from the map data as retrieved operation amount corresponding to the detection value of the transient voltage detected by the detection circuit;

change the retrieved operation amount only by a value of a difference between the retrieved operation amount and the operation amount calculated by the calculation circuit; and update the map data to change the operation amount within a predetermined range of the map data adopting the retrieved operation amount as a center of the predetermined range, only by the value of the difference.

6. The gate drive device according to claim 4,
wherein the learning circuit is further configured to:
retrieve the operation amount from the map data as a retrieved operation amount corresponding to the detection value of the transient voltage detected by the detection circuit;
change the retrieved operation amount only by a value of a difference between the retrieved operation amount and the operation amount calculated by the calculation circuit; and
update the map data to change the operation amount within a predetermined range of the map data adopting the retrieved operation amount as a center of the predetermined range, only by a value acquired by multiplying the value of the difference by a weight coefficient which attenuates with a distance from the center.

7. The gate drive device according to claim 4,
wherein the map data is a multidimensional map holding the operation amount based on combination of the transient voltage and at least one physical quantity selected from a group consisting of:
a temperature of the semiconductor switching element;
a temperature of the gate drive device;
a source voltage as a voltage applied across main terminals of the semiconductor switching element; and
an element current as a current flowing between the main terminals of the semiconductor switching element,
wherein the detection circuit is further configured to detect at least one physical quantity selected from the group consisting of the temperature of the semiconductor switching element, the temperature of the gate drive device, the source voltage, and the element current, and
wherein the calculation circuit is further configured to calculate the operation amount based on
the target value of the transient voltage,
a detection value corresponding to the at least one physical quantity detected by the detection circuit, and
the map data.

8. The gate drive device according to claim 1,
wherein the transient voltage is a change rate of the voltage of the main terminal at the time of switching of the semiconductor switching element.

9. The gate drive device according to claim 1,
wherein the transient voltage is a peak value of the voltage of the main terminal at the time of switching of the semiconductor switching element.

10. The gate drive device according to claim 1,
wherein the drive circuit has a structure configured to drive the gate of the semiconductor switching element with a constant current, and
wherein the calculation circuit is further configured to calculate a gate current of the semiconductor switching element as the operation amount.

11. The gate drive device according to claim 3,
wherein the transient voltage is a change rate of voltage of the main terminal at the time of switching of the semiconductor switching element,
wherein the drive circuit has a structure configured to drive the gate of the semiconductor switching element with a constant current,
wherein the calculation circuit is further configured to calculate a gate current of the semiconductor switching element as the operation amount based on the following formula (1) as the model formula:

$$Ig = K \times dV/dt^* \qquad (1),$$

where K is denoted as the model parameter, $dV/dt^*$ is denoted as the target value of the change rate being the transient voltage, and Ig is denoted as the gate current being the operation amount, and wherein the learning circuit is further configured to calculate the learning value based on the following formula (2):

$$Ka = Iga \div dV/dt \qquad (2),$$

where Ka is denoted as the learning value, Iga is denoted as the gate current being the operation amount calculated by the calculation circuit, and dV/dt is denoted as the detection value of the change rate being the transient voltage detected by the detection circuit.

12. The gate drive device according to claim 3,
wherein the transient voltage is a peak value of a voltage of the main terminal at the time of switching of the semiconductor switching element,
wherein the drive circuit has a structure configured to drive the gate of the semiconductor switching element with a constant current,
wherein the calculation circuit is further configured to calculate a gate current of the semiconductor switching element as the operation amount based on the following formula (3) as the model formula:

$$Ig = (Vsrg^* - Va) \div K \qquad (3),$$

where K is denoted as the model parameter, $Vsrg^*$ is denoted as a target value of the peak value being the transient voltage, Va is denoted as a voltage applied across main terminals of the semiconductor switching element, and Ig is denoted as the gate current being the operation amount, and wherein the learning circuit is configured to calculate the learning value based on the following formula (4):

$$Ka = (Vsrg - Va) \div Iga \qquad (4),$$

where Ka is denoted as the learning value, Iga is denoted as the gate current being the operation amount calculated by the calculation circuit, and Vsrg is denoted as the detection value of the peak value being the transient voltage detected by the detection circuit.

13. The gate drive device according to claim 3, further comprising:
a storing unit configured to store the model parameter updated by the learning circuit,
wherein the learning circuit is further configured to store the model parameter updated by the learning circuit into the storing unit
before power shutdown of the gate drive device is executed, or
after the learning process is executed a predetermined number of times larger than or equal to one, and wherein the calculation circuit is further configured to calculate the operation amount based on the model parameter stored in the storing unit at a start of a subsequent operation of the gate drive device, after the power shutdown of the gate drive device is executed.

14. The gate drive device according to claim 4,
a storing unit configured to store the map data updated by the learning circuit,
wherein the learning circuit is further configured to store the map data updated by the learning circuit into the storing unit
before power shutdown of the gate drive device is executed, or
after the learning processing is executed a predetermined number of times larger than or equal to one, and
wherein the calculation circuit is further configured to calculate the operation amount based on the map data stored in the storing unit at a start of a subsequent operation of the gate drive device, after the power shutdown of the gate drive device is executed.

15. The gate drive device according to claim 3, further comprising:
a storing unit configured to store the model parameter updated by the learning circuit,
wherein, based on a condition that a difference between a value of the model parameter updated by the learning circuit and a value of the model parameter at a start of a present operation of the gate drive device exceeds a preset allowable value, the learning circuit is further configured to store the model parameter updated by the learning circuit into the storing unit
before power shutdown of the gate drive device is executed, or
after the learning processing is executed a predetermined number of times larger than or equal to one, and
wherein the calculation circuit is further configured to calculate the operation amount based on the model parameter stored in the storing unit at a start of a subsequent operation of the gate drive device after the power shutdown of the gate drive device.

16. The gate drive device according to claim 4, further comprising:
a storing unit configured to store the map data updated by the learning circuit,
wherein, based on a condition that a difference between a value of the map data updated by the learning circuit and a value of the map data at a start of a present operation of the gate drive device exceeds a preset allowable value, the learning circuit is further configured to store the map data updated by the learning circuit into the storing unit
before power shutdown of the gate drive device is executed, or
after the learning processing is executed a predetermined number of times larger than or equal to one, and
wherein the calculation circuit is further configured to calculate the operation amount based on the map data stored in the storing unit at a start of a subsequent operation of the gate drive device executed after the power shutdown of the gate drive device.

17. The gate drive device according to claim 1,
wherein the operation amount calculated by the calculation circuit includes:
a present operation amount that is calculated presently by the calculation circuit; and
a past operation amount that is calculated previously by the calculation circuit with respect to the present operation amount,
wherein the detection value of the transient voltage detected by the detection circuit includes:
a present detection value that is detected presently by the detection circuit; and
a past detection value that is detected previously by the detection circuit with respect to the present detection value, and
wherein the learning circuit is further configured to change the predetermined calculation mode based on the present operation amount, the present detection value, the past operation amount, and the past detection value.

18. A gate drive device configured to drive a gate of a semiconductor switching element and control a transient voltage corresponding to a voltage of a main terminal of the semiconductor switching element to a target value of the transient voltage at a time of switching the semiconductor switching element, the gate drive device comprising:
a drive circuit;
a detection circuit configured to detect the transient voltage; and
a processor and a memory that stores instructions configured to, when executed by the processor, cause the processor to
execute a predetermined calculation mode adopting the target value of the transient voltage to calculate an operation amount for operating gate drive speed of the semiconductor switching element, and
execute learning processing to change the predetermined calculation mode based on
the operation amount calculated by the processor, and
a detection value of the transient voltage detected by the detection circuit,
wherein the drive circuit is configured to drive the gate of the semiconductor switching element according to the operation amount calculated by the processor.

* * * * *